(12) United States Patent
Yamazaki

(10) Patent No.: US 8,268,701 B2
(45) Date of Patent: Sep. 18, 2012

(54) MANUFACTURING OF SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 12/939,500

(22) Filed: Nov. 4, 2010

(65) Prior Publication Data

US 2011/0045655 A1 Feb. 24, 2011

Related U.S. Application Data

(62) Division of application No. 12/222,891, filed on Aug. 19, 2008, now Pat. No. 7,829,396.

(30) Foreign Application Priority Data

Aug. 24, 2007 (JP) .................................. 2007-217762

(51) Int. Cl.
*H01L 21/30* (2006.01)
*H01L 21/46* (2006.01)
(52) U.S. Cl. ................. 438/458; 438/113; 257/E21.008
(58) Field of Classification Search .................... 438/33, 438/113, 149, 458; 257/E21.008
See application file for complete search history.

(56) References Cited

U.S. PATENT DOCUMENTS

| | | | |
|---|---|---|---|
| 6,380,046 B1 | 4/2002 | Yamazaki | |
| 6,770,515 B1 | 8/2004 | Makita et al. | |
| 6,821,826 B1 | 11/2004 | Chan et al. | |
| 7,052,974 B2 | 5/2006 | Mitani et al. | |
| 7,118,990 B1* | 10/2006 | Xu et al. | 438/455 |
| 7,199,024 B2 | 4/2007 | Yamazaki | |
| 7,298,009 B2 | 11/2007 | Yan et al. | |
| 7,312,487 B2 | 12/2007 | Alam et al. | |
| 7,332,384 B2 | 2/2008 | Buchholtz et al. | |
| 7,596,840 B2* | 10/2009 | Iwashita et al. | 29/25.35 |
| 7,981,766 B2 | 7/2011 | Yamazaki et al. | |
| 2002/0146893 A1 | 10/2002 | Shimoda et al. | |
| 2003/0049915 A1 | 3/2003 | Abe et al. | |
| 2004/0082149 A1 | 4/2004 | Sakaguchi et al. | |
| 2005/0280041 A1 | 12/2005 | Hashimoto et al. | |
| 2006/0019463 A1 | 1/2006 | Jeong et al. | |
| 2006/0043484 A1 | 3/2006 | Cabral et al. | |
| 2007/0134891 A1* | 6/2007 | Adetutu et al. | 438/464 |

(Continued)

FOREIGN PATENT DOCUMENTS

JP 05-090117 4/1993

(Continued)

*Primary Examiner* — Phuc Dang
(74) *Attorney, Agent, or Firm* — Eric J. Robinson; Robinson Intellectual Property Law Office, P.C.

(57) ABSTRACT

Instead of forming a semiconductor film by bonding a bond substrate (semiconductor substrate) to a base substrate (supporting substrate) and then separating or cleaving the bond substrate, a bond substrate is separated or cleaved at a plurality of positions to form a plurality of first semiconductor films (mother islands), and then the plurality of first semiconductor films are bonded to a base substrate. Subsequently, the plurality of first semiconductor films each are partially etched, whereby one or more second semiconductor films (islands) are formed using one of the first semiconductor films and a semiconductor element is manufactured using the second semiconductor films. The plurality of first semiconductor films are bonded to the base substrate based on a layout of the second semiconductor films so as to cover at least a region in which the second semiconductor films of the semiconductor element are to be formed.

12 Claims, 23 Drawing Sheets

U.S. PATENT DOCUMENTS

| | | |
|---|---|---|
| 2008/0182385 A1 | 7/2008 | Kamine |
| 2008/0283958 A1 | 11/2008 | Ohnuma |
| 2008/0311725 A1 | 12/2008 | Di Cioccio et al. |
| 2009/0047771 A1 | 2/2009 | Yamazaki et al. |
| 2009/0053876 A1 | 2/2009 | Yamazaki |
| 2011/0245958 A1 | 10/2011 | Yamazaki et al. |

FOREIGN PATENT DOCUMENTS

| | | |
|---|---|---|
| JP | 07-297377 | 11/1995 |
| JP | 2000-012864 | 1/2000 |
| JP | 2005-039171 | 2/2005 |
| WO | WO-2007/006914 | 1/2007 |

* cited by examiner

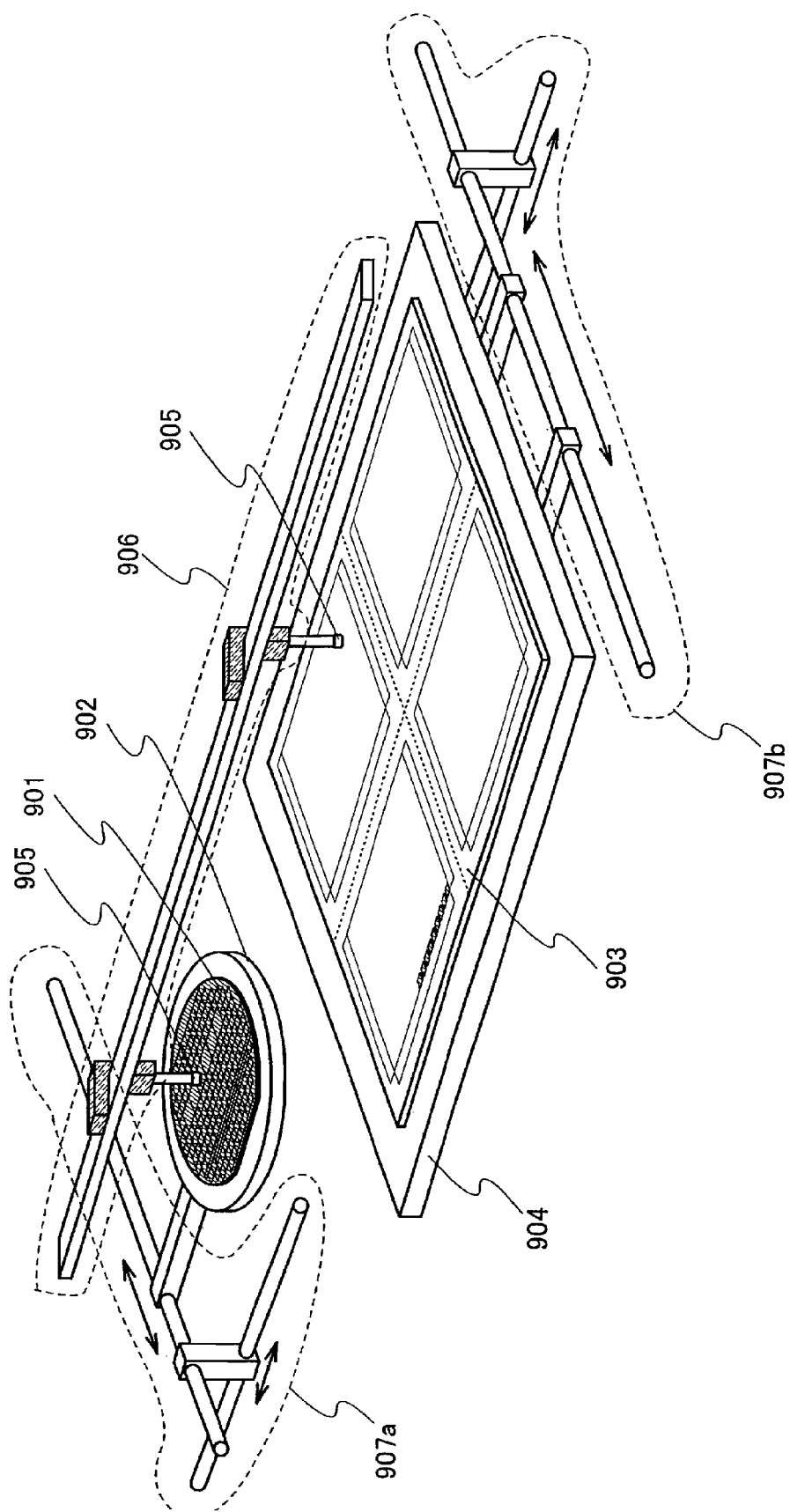

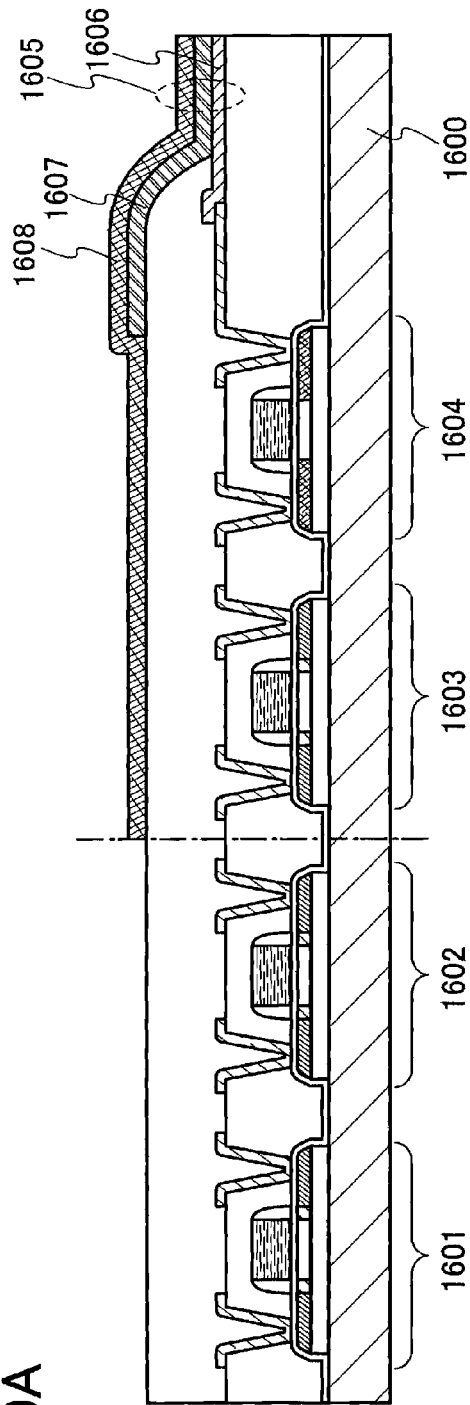
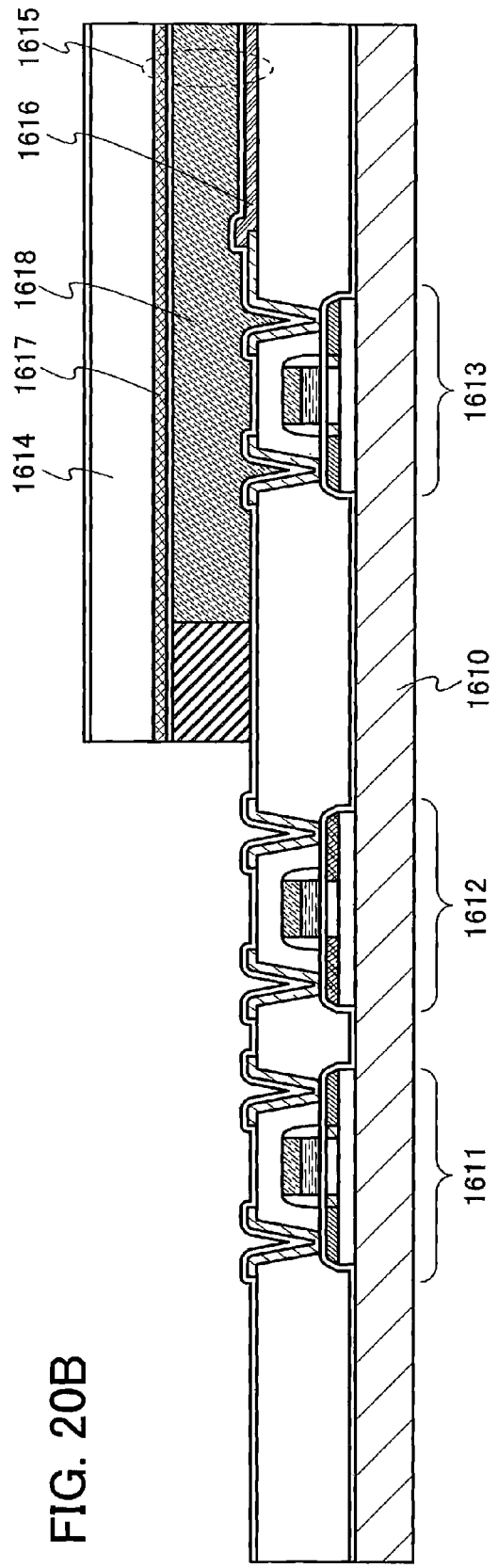
FIG. 20A
FIG. 20B

MANUFACTURING OF SEMICONDUCTOR DEVICE

This application is a Divisional of application Ser. No. 12/222,891 filed Aug. 19, 2008, now U.S. Pat. No. 7,829,396.

BACKGROUND OF THE INVENTION

1. Field of the Invention

The present invention relates to a manufacturing method of a semiconductor device using an SOI (silicon on insulator) substrate, and a manufacturing apparatus using the manufacturing method. In particular, the invention relates to a bonding SOI technique, and a manufacturing method of a semiconductor device and a manufacturing apparatus thereof, which use an SOI substrate obtained by bonding single crystal or polycrystalline semiconductor films to a substrate having an insulating surface.

2. Description of the Related Art

Demands for higher integration, higher speed operation, higher performance, and lower power consumption of a semiconductor integrated circuit have been significantly increasing. In order to satisfy these demands, a transistor using an SOI substrate has attracted attention as an effective alternative to a bulk transistor. In a transistor using an SOI substrate, a semiconductor film is formed over an insulating film; therefore, parasitic capacitance is reduced and leakage current can be prevented from flowing through a substrate. Accordingly, the transistor using an SOI substrate can be expected to achieve higher speed operation and lower power consumption as compared to a bulk transistor. The transistor using an SOI substrate has another advantage in that a semiconductor film used as an active layer can be reduced in thickness; thus, a short-channel effect can be suppressed, resulting in miniaturization of elements and therefore higher integration of a semiconductor integrated circuit.

One of the manufacturing methods of an SOI substrate is a method of bonding a semiconductor film to a substrate with an insulating film interposed therebetween, such as UNI-BOND typified by Smart Cut, ELTRAN (epitaxial layer transfer), a dielectric separation method, and PACE (plasma assisted chemical etching). These bonding methods make it possible to form a high-performance integrated circuit using a single crystal semiconductor film over an inexpensive glass substrate.

One of the semiconductor devices using an SOI substrate is disclosed by Reference 1 (Reference 1: Japanese Published Patent Application No. 2000-012864).

SUMMARY OF THE INVENTION

The crystal orientation of a semiconductor film plays an important role in further increasing the mobility of a semiconductor element using an SOI substrate. However, in a p-type semiconductor, holes that are majority carriers have the highest mobility on the {110} crystal orientation, whereas in an n-type semiconductor, electrons that are majority carriers have the highest mobility on the {100} crystal orientation; that is, the mobility is improved on different crystal orientations. Accordingly, in the case of manufacturing an integrated circuit using a CMOS, it is difficult to further increase the mobility of a semiconductor element formed using an SOI substrate if a semiconductor film having a single crystal orientation is used.

Glass substrates used for manufacturing semiconductor devices such as flat panel displays have been increasing in size every year as in the seventh generation (1900 mm×2200 mm) and the eighth generation (2160 mm×2460 mm). From now on, it is predicted that glass substrates will further increase in size for the ninth generation (2400 mm×2800 mm, 2450 mm×3050 mm) and the tenth generation (2950 mm×3400 mm). Meanwhile, typical silicon substrates as one kind of semiconductor substrates have a diameter of 5 inches (125 mm), 6 inches (150 mm), 8 inches (200 mm), and 12 inches (300 mm), which are much smaller in size than glass substrates. Accordingly, if an SOI substrate is manufactured by bonding a semiconductor substrate to a glass substrate, more semiconductor substrates are required as the glass substrate increases in size, which makes it difficult to reduce production cost.

In view of the aforementioned problems, it is an object of the invention to provide a manufacturing method of a semiconductor device using an SOI substrate, by which mobility can be improved, and a manufacturing apparatus using the manufacturing method.

In view of the aforementioned problems, it is another object of the invention to provide a manufacturing method of a semiconductor device, by which production cost can be reduced, and a manufacturing apparatus using the manufacturing method.

In order to solve the aforementioned problems, according to a manufacturing method of a semiconductor device of the invention, instead of forming a semiconductor film by bonding a bond substrate (semiconductor substrate) to a base substrate (supporting substrate) and then separating or cleaving the bond substrate, a bond substrate is separated or cleaved at a plurality of positions to form a plurality of first semiconductor films (mother islands), and then the plurality of first semiconductor films are bonded to a base substrate. Subsequently, the plurality of first semiconductor films each are partially etched, whereby one or more second semiconductor films (islands) are formed using one of the first semiconductor films and a semiconductor element is manufactured using the second semiconductor films. The plurality of first semiconductor films are bonded to the base substrate based on a layout of the second semiconductor films so as to cover at least a region in which the second semiconductor films of the semiconductor element are to be formed.

According to another manufacturing method of a semiconductor device of the invention, a plurality of semiconductor films formed using a plurality of bond substrates are bonded to one base substrate. Furthermore, at least one of the plurality of bond substrates has a crystal orientation different from that of the other bond substrates; thus, at least one of the plurality of semiconductor films formed over the base substrate has a crystal orientation different from that of the other semiconductor films. The polarity of a semiconductor element formed using the semiconductor films is determined depending on the crystal orientation of the semiconductor films. For example, an n-channel element having electrons as its major carriers is formed using a semiconductor film having a {100} face, while a p-channel element having holes as its major carriers is formed using a semiconductor film having a {110} face.

Not all a plurality of semiconductor elements that are formed using a semiconductor film having a {100} face are required to be of the n-channel type. At least one n-channel element is included in the plurality of semiconductor elements that are formed using a semiconductor film having a {100} face, and more desirably, the number of n-channel elements is larger than that of p-channel elements. Furthermore, not all a plurality of semiconductor elements that are formed using a semiconductor film having a {110} face are required to be of the p-channel type. At least one p-channel element is included in the plurality of semiconductor elements that are formed using a semiconductor film having a {110} face, and more desirably, the number of p-channel elements is larger than that of n-channel elements.

A manufacturing apparatus of a semiconductor device of the invention includes a collet (holding device) for picking up one of a plurality of semiconductor films that are formed by separation or cleavage of a bond substrate, a collet driving portion for controlling the position of the collet, a stage for supporting the bond substrate, a stage for supporting a base substrate, a stage driving portion for controlling the positions of the stages, and a CPU for controlling the operation of the collet driving portion and the stage driving portion based on the position data of the collet and the stages.

According to a manufacturing method of a semiconductor device of the invention, a plurality of first semiconductor films may be bonded to a base substrate so as to cover at least a region in which second semiconductor films are to be formed. Therefore, the plurality of first semiconductor films can be formed to be spaced apart from each other based on a layout of the second semiconductor films. The area in which the second semiconductor films are eventually formed is much smaller than that of the entire surface of the base substrate. Accordingly, when the plurality of first semiconductor films are bonded to the base substrate so as to be spaced apart from each other based on the layout of the second semiconductor films, the number of needed bond substrates can be minimized as compared to the case of bonding semiconductor films to the entire surface of the base substrate.

Furthermore, the crystal orientation of each semiconductor film can be appropriately selected in accordance with the polarity of semiconductor elements, leading to higher mobility of the semiconductor elements, whereby a semiconductor device capable of operating at a higher speed can be provided.

According to a manufacturing apparatus of a semiconductor device of the invention, a plurality of semiconductor films that are formed using a bond substrate can be appropriately bonded to a base substrate based on the mask data of the semiconductor films.

BRIEF DESCRIPTION OF THE DRAWINGS

In the accompanying drawings:

FIG. 8 illustrates a structure of a manufacturing apparatus of the invention;

FIGS. 20A and 20B each illustrate a structure of a semiconductor device that is formed by the manufacturing method of the invention;

DETAILED DESCRIPTION OF THE INVENTION

Although the invention will be described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein.

Embodiment Mode 1

In this embodiment mode, an example of a manufacturing method of a semiconductor device of the invention is described.

Figure 1A:
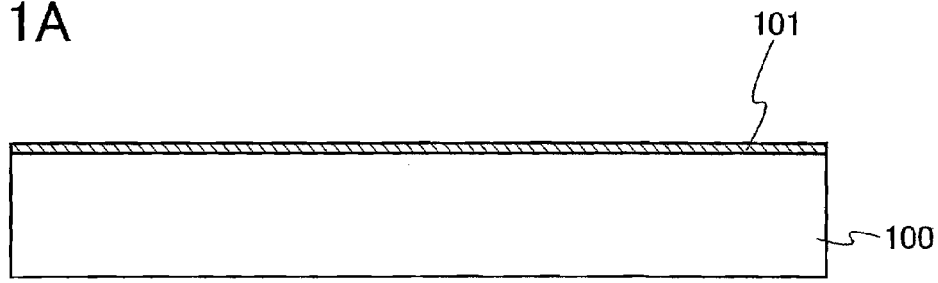
FIGS. 1A to 1D illustrate a manufacturing method of a semiconductor device of the invention.

First, as illustrated in FIG. 1A, an insulating film 101 is formed over a bond substrate 100. As the bond substrate 100, a single crystal or polycrystalline semiconductor substrate of silicon, germanium, or the like can be used. A single crystal or polycrystalline semiconductor substrate formed of a compound semiconductor such as gallium arsenide or indium phosphide can also be used as the bond substrate 100. It is also possible to use as the bond substrate 100 a semiconductor substrate formed of silicon having lattice distortion, silicon germanium in which germanium is added to silicon, or the like. Silicon having lattice distortion can be formed by deposition of silicon on silicon germanium or silicon nitride that has a larger lattice constant than silicon.

The insulating film 101 is made of an insulating material such as silicon oxide, silicon nitride oxide, silicon oxynitride, or silicon nitride. The insulating film 101 may be either a single insulating film or a plurality of stacked insulating films. For example, in this embodiment mode, silicon oxide is used as the insulating film 101.

Note that silicon oxynitride means a substance that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Furthermore, silicon nitride oxide means a substance that contains more nitrogen than oxygen and, in the case where measurements are performed using RBS and HFS, includes oxygen, nitrogen, silicon, and hydrogen at concentrations ranging from 5 to 30 at. %, 20 to 55 at. %, 25 to 35 at. %, and 10 to 30 at. %, respectively. Note that the percentages of nitrogen, oxygen, silicon, and hydrogen fall within the ranges given above, where the total number of atoms contained in silicon oxynitride or silicon nitride oxide is defined as 100 at. %.

In the case of using silicon oxide as the insulating film 101, the insulating film 101 can be formed by a vapor deposition method such as a thermal CVD method, a plasma CVD method, an atmospheric pressure CVD method, or a bias ECRCVD method using a mixed gas of silane and oxygen, a mixed gas of TEOS (tetraethoxysilane) and oxygen, or the like. In this case, a surface of the insulating film 101 may be densified by oxygen plasma treatment. In the case of using silicon nitride as the insulating film 101, the insulating film 101 can be formed by a vapor deposition method such as a plasma CVD method using a mixed gas of silane and ammonia. In the case of using silicon nitride oxide as the insulating film 101, the insulating film 101 can be formed by a vapor deposition method such as a plasma CVD method using a mixed gas of silane and ammonia or a mixed gas of silane and nitrogen oxide.

Furthermore, the insulating film 101 may be made of silicon oxide that is formed by a chemical vapor deposition method using an organosilane gas. As the organosilane gas, any of the following silicon-containing compounds may be used: tetraethoxysilane (TEOS: chemical formula: $Si(OC_2H_5)_4$), tetramethylsilane (TMS: chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

Figure 1B:
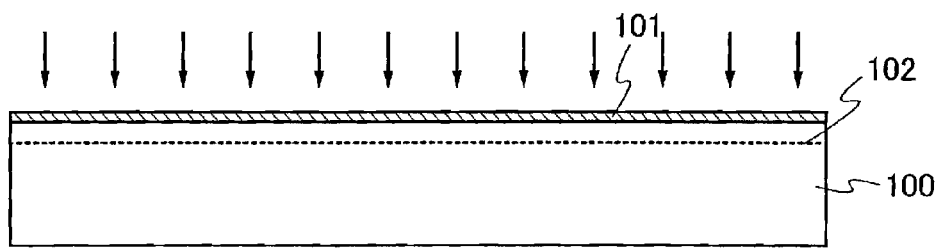

Next, as illustrated in FIG. 1B, the bond substrate 100 is irradiated with hydrogen or a rare gas, or hydrogen ions or rare gas ions as indicated by arrows, whereby a defect layer 102 having microvoids is formed in a region at a predetermined depth from the surface of the bond substrate 100. The position where the defect layer 102 is formed is determined depending on the accelerating voltage at the time of the aforementioned irradiation. The thicknesses of semiconductor films 106 and a semiconductor film 108 that are formed using the bond substrate 100 are determined depending on the position where the defect layer 102 is formed; therefore, the accelerating voltage at the time of the irradiation is determined in consideration of the thicknesses of the semiconductor films 106 and the semiconductor film 108. The position where the defect layer 102 is formed can be changed not only by the accelerating voltage at the time of the irradiation but also by the thickness of the insulating film 101. For example, when the thickness of the insulating film 101 is made larger, the thicknesses of the semiconductor films 106 and the semiconductor film 108 can be made smaller. The thicknesses of the semiconductor films 106 and the semiconductor film 108 each are, for example, 10 nm to 200 nm, and preferably 10 nm to 50 nm. For example, when the bond substrate 100 is irradiated with hydrogen, the dose is desirably set to $1\times10^{16}/cm^2$ to $1\times10^{17}/cm^2$. In this embodiment mode, the bond substrate 100 is irradiated with hydrogen or hydrogen ions with an accelerating voltage of 40 kV and a dose of $1.75\times10^{16}/cm^2$.

In the aforementioned step of forming the defect layer 102, the bond substrate 100 is irradiated with hydrogen or a rare gas, or hydrogen ions or rare gas ions at high concentration, which may cause roughness of the surface of the bond substrate 100 and variation in interface state density between the semiconductor films that are formed using the bond substrate 100 and a gate insulating film that is in contact with the semiconductor films. By providing the insulating film 101, the surface of the bond substrate 100 is protected at the time of the irradiation with hydrogen or a rare gas, or hydrogen ions or rare gas ions, and it is possible to prevent the surface of the bond substrate 100 from being roughened and the aforementioned interface state density from varying.

Figure 1C:
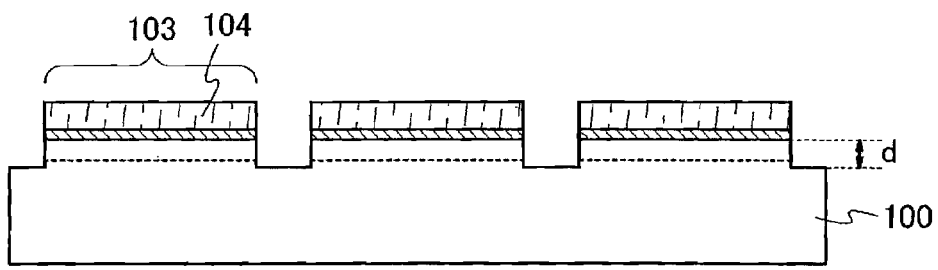

Next, the bond substrate 100 is partially removed. In this embodiment mode, as illustrated in FIG. 1C, the insulating film 101 as well as the bond substrate 100 is partially etched away using masks 104, thereby forming the bond substrate 100 having a plurality of projections 103.

In the bond substrate 100, each of the plurality of projections 103 has a width d in a direction (a depth direction) perpendicular to the bond substrate 100. The width d is greater than or equal to the depth of the defect layer 102. The width d of each of the projections 103 in the direction (the depth direction) perpendicular to the bond substrate 100 is not necessarily constant and may have different values depending on the location. Specifically, the width d is set to, for example, greater than or equal to 10 nm, and preferably greater than or equal to 200 nm in consideration of the thickness of the semiconductor films 106.

The bond substrate 100 sometimes warps, bends, or has a little round edge. Moreover, in some cases, at the time of irradiating with hydrogen or a rare gas, or hydrogen ions or rare gas ions for separating semiconductor films from the bond substrate 100, the gas or the ions cannot be added sufficiently at an edge of the bond substrate 100. Therefore, it is difficult to separate the semiconductor films at the edge of the bond substrate 100. Accordingly, the plurality of projections 103 of the bond substrate 100 are desirably formed at a predetermined distance from the rim of the bond substrate 100. The semiconductor films can be formed by separation or cleavage with excellent reproducibility by forming the projections 103 at a predetermined distance from the rim of the bond substrate 100. For example, it is preferable that the projection 103 that is positioned closest to the edge of the substrate have a distance of several tens of micrometers to several tens of millimeters from the rim of the bond substrate 100.

Next, heat treatment is performed after the masks 104 are removed, whereby microvoids adjacent to each other in the defect layer 102 are combined and the microvoids increase in volume. As a result, the bond substrate 100 is separated or cleaved at the defect layer 102, so that the insulating film 101 as well as the semiconductor films 106 that are part of the projections 103 is separated from the bond substrate 100. The heat treatment may be performed, for example, at a temperature ranging from 400° C. to 600° C.

The heat treatment may be performed by dielectric heating with high-frequency waves such as microwaves. The heat treatment by the dielectric heating can be performed by irradiating the bond substrate 100 with high-frequency waves generated at a high-frequency generator, which range from 300 MHz to 3 THz. Specifically, for example, the bond substrate 100 is irradiated with a microwave with a frequency of 2.45 GHz at 900 W for 14 minutes so that the microvoids adjacent to each other in the defect layer are combined, whereby the bond substrate 100 can be eventually separated or cleaved.

Figure 1D:
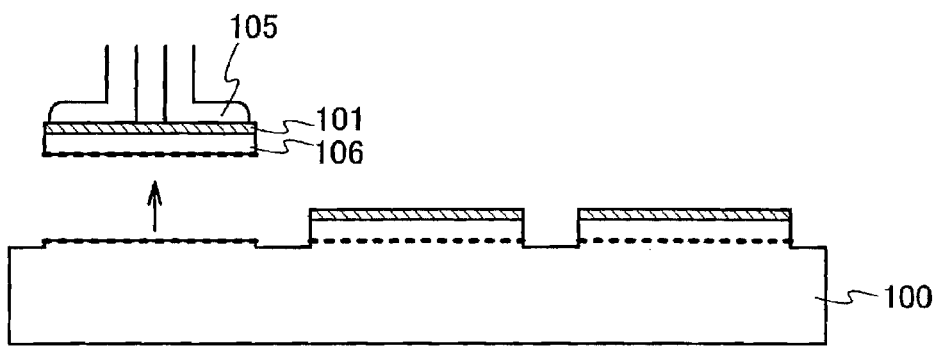

Then, as illustrated in FIG. 1D, a collet 105 is firmly attached to the insulating film 101 that is formed over one of the semiconductor films 106, whereby the semiconductor film 106 is separated from the bond substrate 100. Even when separation or cleavage of the bond substrate 100 by the heat treatment is incomplete, the semiconductor film 106 can be completely separated from the bond substrate 100 by application of force using the collet 105. The collet 105 may be a means that can be firmly attached to a selected one of the projections 103, for example, a chuck such as a vacuum chuck or a mechanical chuck, a microneedle to the tip of which an adhesive is attached, or the like is used. FIG. 1D illustrates a case in which a vacuum chuck is used as the collet 105.

As an adhesive to be attached to a microneedle, an epoxy-based adhesive, a ceramic-based adhesive, a silicone-based adhesive, a low-temperature coagulant, or the like can be used. For example, MW-1 (manufactured by Eminent Supply Corporation) can be used as the low-temperature coagulant. The coagulation point of MW-1 is approximately 17° C., and MW-1 has a bonding effect at a temperature less than or equal to the coagulation point (preferably at less than or equal to 10° C.) and does not have a bonding effect at a temperature greater than or equal to the coagulation point (preferably approximately 25° C.).

Before separating or cleaving the bond substrate 100, hydrogenation may be performed on the bond substrate 100. The hydrogenation is performed, for example, at 350° C. in a hydrogen atmosphere for approximately two hours.

Figure 2A:
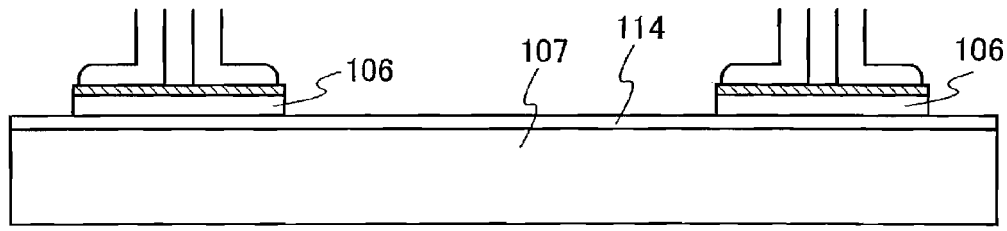
FIGS. 2A to 2C illustrate the manufacturing method of the semiconductor device of the invention.

Next, as illustrated in FIG. 2A, the semiconductor films 106 are bonded to a base substrate 107 so that surfaces of the semiconductor films 106, which are exposed by separation, face the base substrate 107. In this embodiment mode, an insulating film 114 is formed over the base substrate 107, and the semiconductor films 106 are bonded to the insulating film 114, whereby the semiconductor films 106 can be bonded to the base substrate 107. After bonding the semiconductor films 106 to the insulating film 114, heat treatment is preferably performed at 400° C. to 600° C. in order to further strengthen the bonding.

The bonding is performed by van der Waals forces; therefore, strong bonding can be obtained even at room temperature. Since the aforementioned bonding can be performed at a low temperature, various substrates can be used as the base substrate 107. As the base substrate 107, for example, a substrate such as a quartz substrate or a sapphire substrate can be used as well as a glass substrate made of aluminosilicate glass, barium borosilicate glass, aluminoborosilicate glass, or the like. Furthermore, as the base substrate 107, a semiconductor substrate made of silicon, gallium arsenide, indium phosphide, or the like can be used. Alternatively, a metal substrate including a stainless steel substrate may be used as the base substrate 107.

Note that the insulating film 114 is not necessarily formed over the surface of the base substrate 107. Even when the insulating film 114 is not formed, the base substrate 107 and the semiconductor films 106 can be bonded to each other. Note that when the insulating film 114 is formed over the surface of the base substrate 107, it is possible to prevent impurities such as an alkali metal or an alkaline earth metal in the base substrate 107 from entering the semiconductor films 106.

When the insulating film 114 is formed, not the base substrate 107 but the insulating film 114 is bonded to the semiconductor films 106; therefore, more kinds of substrates can be used as the base substrate 107. A substrate made of a flexible synthetic resin such as plastic generally tends to have a lower allowable temperature limit; however, when the insulating film 114 is formed, the substrate can be used as the base substrate 107 as long as it can withstand a processing temperature in a manufacturing process. As a plastic substrate, the following can be used: polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

Before or after bonding the semiconductor films 106 to the base substrate 107, the surfaces of the semiconductor films 106, which are exposed by separation, may be subjected to thermal annealing by laser light irradiation. When thermal annealing is performed before bonding the semiconductor films 106 to the base substrate 107, the surfaces of the semiconductor films 106, which are exposed by separation, are planarized to further increase the bonding strength. When thermal annealing is performed after bonding the semiconductor films 106 to the base substrate 107, the semiconductor films 106 are partially melted to further increase the bonding strength.

When thermal annealing by laser light irradiation is performed, it is desirable to irradiate with a fundamental wave or a second harmonic of a solid-state laser that is selectively absorbed by the semiconductor. For example, laser light that is emitted from a continuous wave YAG laser having an output of 100 W is used. Then, the laser light is preferably shaped into a rectangular or elliptical shape on an irradiation surface by an optical system so that the surfaces of the semiconductor films 106, which are exposed by separation, are irradiated with the laser light. The laser is required to have a power density of approximately 1 kW/cm$^2$ to 100 MW/cm$^2$ (preferably, 0.1 MW/cm$^2$ to 10 MW/cm$^2$). The irradiation is then performed at a scan speed ranging from approximately 10 cm/sec to 2000 cm/sec.

As a continuous-wave gas laser, an Ar laser, a Kr laser, or the like can be used. As a continuous-wave solid-state laser, the following can be used: a YAG laser, a YVO$_4$ laser, a YLF laser, a YAlO$_3$ laser, a forsterite (Mg$_2$SiO$_4$) laser, a GdVO$_4$ laser, a Y$_2$O$_3$ laser, a glass laser, a ruby laser, an alexandrite laser, a Ti:sapphire laser, and the like. As a pulsed oscillation laser, the following can be used: an Ar laser, a Kr laser, an excimer laser, a CO$_2$ laser, a YAG laser, a Y$_2$O$_3$ laser, a YVO$_4$ laser, a YLF laser, a YAlO$_3$ laser, a glass laser, a ruby laser, an alexandrite laser, a Ti:sapphire laser, a copper vapor laser, a gold vapor laser, and the like.

Instead of attaching the semiconductor films 106 to the base substrate 107 only by bonding them to each other, the semiconductor films 106 may be attached to the base substrate 107 by the following method: a high-frequency vibration of approximately 10 MHz to 1 THz is applied to the semiconductor films 106 to generate frictional heat between the semiconductor films 106 and the base substrate 107, so that the semiconductor films 106 are partially melted by the frictional heat.

Note that when MW-1 is used as a low-temperature coagulant, at a temperature at which a low-temperature coagulant does not have a bonding effect (for example, approximately at 25° C.), the low-temperature coagulant that is attached to the tip of the microneedle is brought into contact with the insulating film 101 on one of the projections 103. Next, the temperature is lowered to a temperature at which the low-temperature coagulant has a bonding effect (for example, approximately at 5° C.) to coagulate the low-temperature coagulant, whereby the insulating film 101 on the projection 103 and the microneedle are firmly attached to each other. Then, after bonding the semiconductor film 106 that is separated from the bond substrate 100 to the base substrate 107, the temperature is raised up again to a temperature at which the low-temperature coagulant does not have a bonding effect (for example, approximately at 25° C.), whereby the microneedle can be separated from the semiconductor film 106.

Figure 2B:
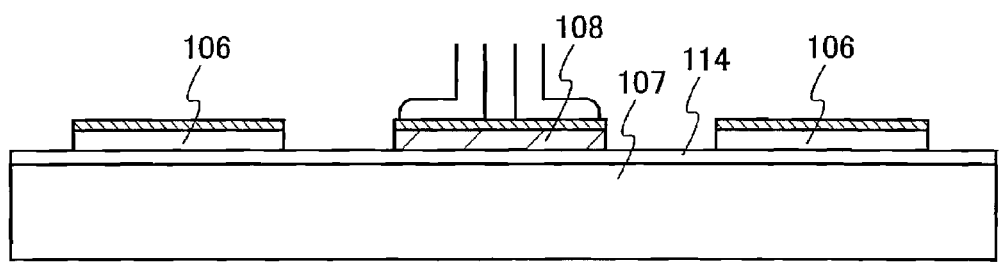

Next, as illustrated in FIG. 2B, in a similar manner to the semiconductor films 106, a semiconductor film 108 is separated from a bond substrate having a crystal orientation different from that of the bond substrate 100 used for forming the semiconductor films 106, and then the semiconductor film 108 is bonded to the base substrate 107.

The mobility of majority carriers in a semiconductor depends on crystal orientation. Accordingly, a bond substrate having a crystal orientation that is suitable for a semiconductor element to be formed may be appropriately selected to form the semiconductor films 106 or the semiconductor film 108. For example, when an n-type semiconductor element is formed using one of the semiconductor films 106, the mobility of majority carriers in the semiconductor element can be increased by forming the semiconductor film 106 having a {100} face. Meanwhile, when a p-type semiconductor element is formed using the semiconductor film 108, the mobility of majority carriers in the semiconductor element can be increased by forming the semiconductor film 108 having a {110} face. When a transistor is formed as a semiconductor element, the bonding direction of the semiconductor films 106 or the semiconductor film 108 is set in consideration of the channel direction and the crystal orientation.

Note that as described above, the bond substrate 100 sometimes warps, bends, or has a little round edge. Moreover, in some cases, at the time of irradiating with hydrogen or a rare gas, or hydrogen ions or rare gas ions for separating semiconductor films from the bond substrate 100, the gas or the ions cannot be added sufficiently at an edge of the bond substrate 100. Therefore, it is difficult to separate the semiconductor films at the edge of the bond substrate 100. When semiconductor films are formed by separating or cleaving the bond substrate after bonding the bond substrate to the base substrate, the distance between the semiconductor films is several millimeters to several centimeters. However, in the invention, before bonding the bond substrate to the base substrate 107, the bond substrate is separated or cleaved to form the semiconductor films 106 and the semiconductor film 108. Accordingly, when the semiconductor films 106 and the semiconductor film 108 are bonded to the base substrate 107, the distance between each of the semiconductor films 106 and the semiconductor film 108 can be reduced to approximately several tens of micrometers. A semiconductor device including the adjacent semiconductor films 106 and semiconductor film 108 can thus be manufactured easily.

Figure 2C:
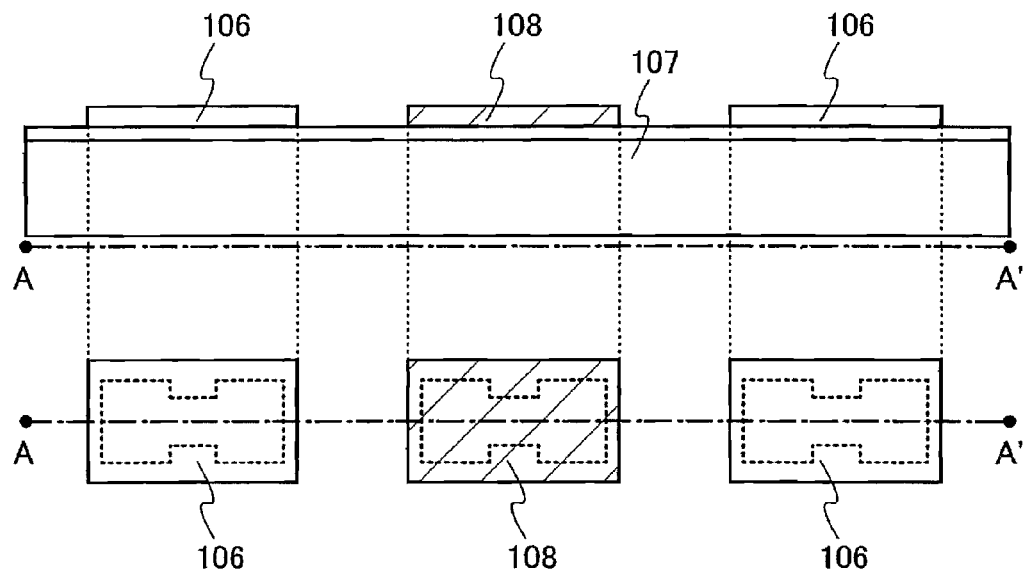

Next, as illustrated in FIG. 2C, the insulating film 101 that is formed over the semiconductor films 106 and the semiconductor film 108 is removed. FIG. 2C illustrates a top view as well as a cross-sectional view of the semiconductor films 106 and the semiconductor film 108. The cross-sectional view illustrated in FIG. 2C corresponds to a cross section taken along a dashed line A-A' of the top view.

Figure 3A:
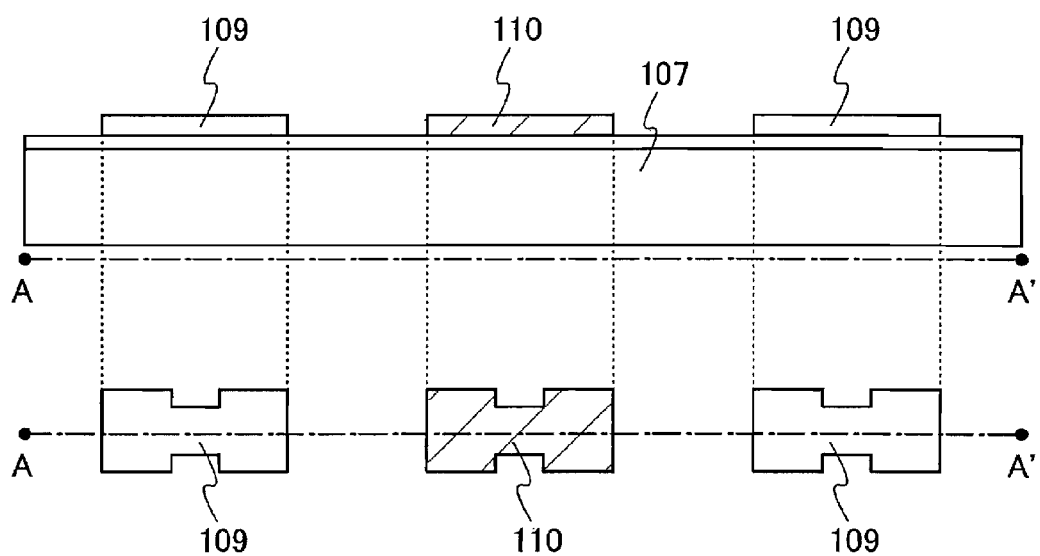
FIGS. 3A and 3B illustrate the manufacturing method of the semiconductor device of the invention.

Next, as illustrated in FIG. 3A, the semiconductor films 106 and the semiconductor film 108 are partially etched, whereby semiconductor films 109 are formed using the semiconductor films 106 and a semiconductor film 110 is formed using the semiconductor film 108. FIG. 3A illustrates a top view as well as a cross-sectional view of the semiconductor films 109 and the semiconductor film 110. The cross-sectional view illustrated in FIG. 3A corresponds to a cross section taken along a dashed line A-A' of the top view. When the semiconductor films 106 and the semiconductor film 108 are further etched, the edges of the semiconductor films 106 and the semiconductor film 108 that do not have enough bonding strength can be removed.

Note that in this embodiment mode, one semiconductor film 106 is etched to form one semiconductor film 109, and one semiconductor film 108 is etched to form one semiconductor film 110; however, the invention is not limited to this structure. For example, one semiconductor film 106 may be etched to form a plurality of semiconductor films 109, and one semiconductor film 108 may be etched to form a plurality of semiconductor films 110.

After forming the semiconductor films 109 and the semiconductor film 110 as illustrated in FIG. 3A, surfaces of the semiconductor films 109 and the semiconductor film 110 may be planarized. Although not necessarily essential, the planarization makes it possible to improve characteristics of the interface between a gate insulating film, and the semiconductor films 109 and the semiconductor film 110 in transistors to be formed later. Specifically, the planarization can be performed by chemical mechanical polishing (CMP), liquid jet polishing, or the like. The thicknesses of the semiconductor films 109 and the semiconductor film 110 are reduced by the planarization. The planarization may be performed on the semiconductor films 109 and the semiconductor film 110 that are formed by etching, or the semiconductor films 106 and the semiconductor film 108 before etching.

The semiconductor film may be bonded to the base substrate so that the surface of the semiconductor film, which is exposed by separation or cleavage, and the gate insulating film are in contact with each other. Note that as described in this embodiment mode, when the surface of the semiconductor film, which is exposed by separation or cleavage, faces the base substrate, the other surface of the semiconductor film having higher planarity is in contact with the gate insulating film; therefore, the interface state density between the semiconductor film and the gate insulating film can be decreased and can be made uniform. Accordingly, polishing for planarization of the surface of the semiconductor film that is in contact with the gate insulating film can be omitted or performed in less time, leading to reduction in cost and improvement in throughput.

The semiconductor films 109 and the semiconductor film 110, or the semiconductor films 106 and the semiconductor film 108 before etching may be irradiated with an energy beam to recover crystal defects. As the energy beam, a beam that is selectively absorbed in a semiconductor is used; for example, laser light is desirably used. As the laser light, a gas laser such as an excimer laser or a solid-state laser such as a YAG laser can be used as a light source. The laser light preferably has a wavelength in the range of ultraviolet to near-infrared light; specifically, laser light with a wavelength of 190 nm to 2000 nm is desirably used. Alternatively, flash lamp annealing that uses a halogen lamp, a xenon lamp, or the like may be performed to recover crystal defects.

Although this embodiment mode shows the case of using a Smart Cut method in which the semiconductor films 106 and the semiconductor film 108 are separated from the bond substrate 100 by the formation of the defect layer 102, any other bonding method such as ELTRAN (epitaxial layer transfer), a dielectric isolation method, or a PACE (plasma assisted chemical etching) method may be used.

Figure 3B:
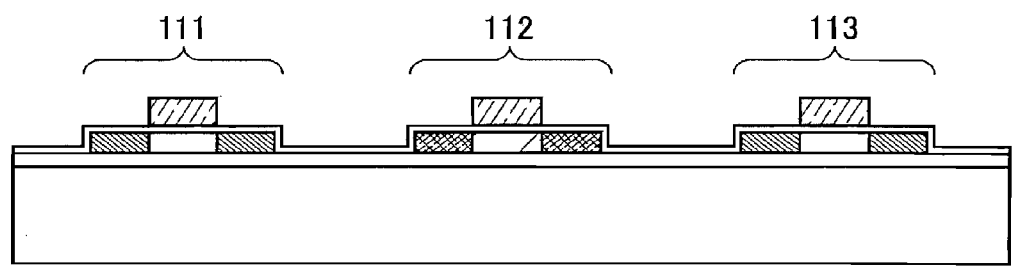

With the use of the semiconductor films 109 and the semiconductor film 110 that are formed through the aforementioned steps, various kinds of semiconductor elements such as transistors 111 to 113 can be formed as illustrated in FIG. 3B.

Figure 4:
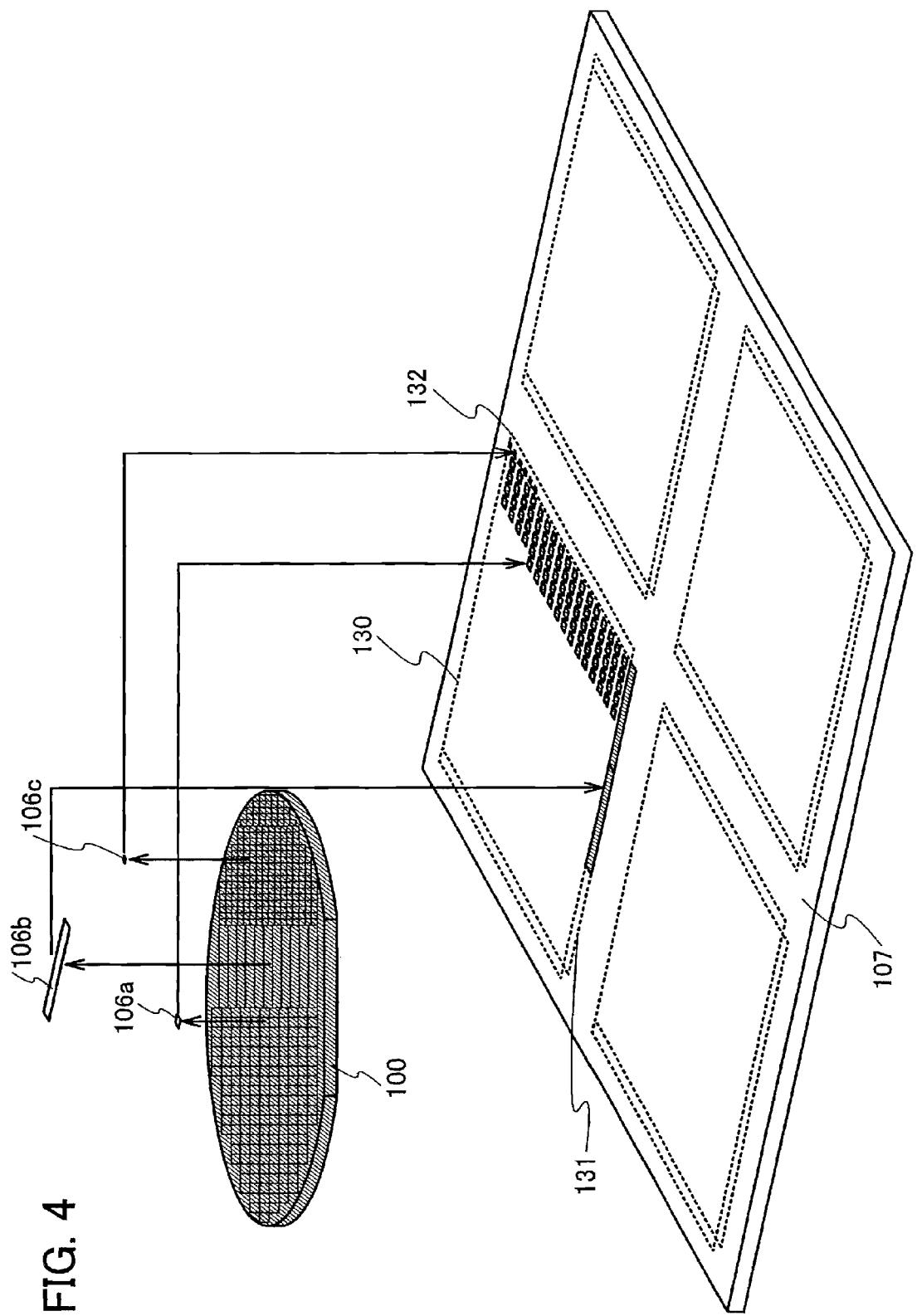
FIG. 4 illustrates an example in which semiconductor films formed using a bond substrate are bonded to a base substrate.

FIGS. 1A to 1D, FIGS. 2A to 2C, and FIGS. 3A and 3B illustrate an example in which all of the semiconductor films 106 and the semiconductor film 108 corresponding to mother islands are substantially the same in size; however, the invention is not limited to this structure. The semiconductor films 106 and the semiconductor film 108 that are different in size or shape may be formed by separation or cleavage to be bonded to the base substrate 107. FIG. 4 illustrates an example in which a semiconductor film 106a, a semiconductor film 106b, and a semiconductor film 106c that are different in shape or size are formed using the bond substrate 100 to be bonded to the base substrate 107.

The semiconductor film 106a has a rectangular shape and is bonded to, for example, a region over the base substrate 107, which is to be a pixel portion 130 of a semiconductor display device. When the semiconductor film 106a is etched, semiconductor films can be formed to be used for semiconductor elements arranged in the pixel portion 130, such as capacitors and transistors for controlling driving of a display element.

The semiconductor film 106b has a rectangular shape with a side that is several times longer than the other side. The semiconductor film 106b is bonded to, for example, a region over the base substrate 107, which is to be a signal line driver circuit 131 of the semiconductor display device. When the semiconductor film 106b is etched, semiconductor films can be formed to be used for semiconductor elements arranged in the signal line driver circuit 131, such as transistors, capacitors, and diodes.

The semiconductor film 106c has a rectangular shape that is smaller in size than the semiconductor film 106a. The semiconductor film 106c is bonded to, for example, a region over the base substrate 107, which is to be a scanning line driver circuit 132 of the semiconductor display device, and particularly a region in which a buffer at the final output stage is formed. When the semiconductor film 106c is etched, semiconductor films can be formed to be used for semiconductor elements arranged in the buffer in the scanning line driver circuit 132, such as transistors.

The position of the base substrate 107 to which the semiconductor film 106a, the semiconductor film 106b, and the semiconductor film 106c are bonded can thus be determined based on the mask data of semiconductor elements.

Although FIG. 4 illustrates an example in which the semiconductor film 106a, the semiconductor film 106b, and the semiconductor film 106c are separated from one bond substrate 100, two or more bond substrates may be used.

Furthermore, FIG. 4 illustrates an example in which a plurality of semiconductor films 106a are arranged in matrix in the pixel portion 130; however, the invention is not limited to this structure.

Figure 5A:
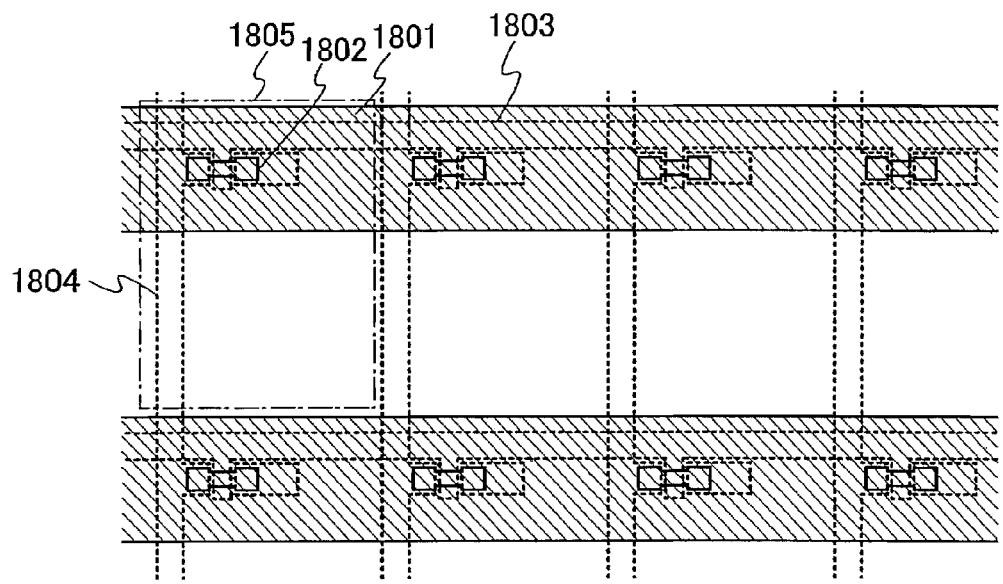
FIGS. 5A and 5B each illustrate a layout of semiconductor films.

FIG. 5A illustrates a layout of semiconductor films 1801 and semiconductor films 1802 in the case where the semiconductor films 1802 used for transistors of pixels arranged in a scanning line direction are formed using one of the semiconductor films 1801. In addition to the layout of the semiconductor films 1801 and the semiconductor films 1802, regions in which scanning lines 1803 and signal lines 1804 are formed are illustrated by dotted lines in FIG. 5A.

Each pixel 1805 includes at least one of the scanning lines 1803, one of the signal lines 1804, and a transistor having one of the semiconductor films 1802. The transistor performs switching based on a signal supplied from a scanning line driver circuit to each of the scanning lines 1803. When the transistor is turned on, a video signal supplied from a signal line driver circuit to each of the signal lines 1804 is input to the pixel 1805.

Each of the semiconductor films 1801 overlaps with regions in which the semiconductor films 1802 are formed in the pixels 1805 arranged in the direction of the scanning lines 1803. Even when each of the semiconductor films 1801 has different characteristics such as crystallinity or internal stress, which may affect operating characteristics of transistors, variations in luminance of a display element for displaying grayscale images based on video signals can be suppressed by the following source line inversion driving: in one frame period, video signals having the same polarity are input to pixels connected to the same signal line while video signals having the opposite polarity are input to pixels connected to the adjacent signal lines.

FIG. 5A illustrates an example in which the regions to be the semiconductor films 1802 overlap with one of the semiconductor films 1801 in the pixels 1805 connected to one of the scanning lines 1803; however, the invention is not limited to this structure. The regions to be the semiconductor films 1802 may overlap with one of the semiconductor films 1801 in the pixels 1805 connected to the plurality of scanning lines 1803.

Figure 5B:
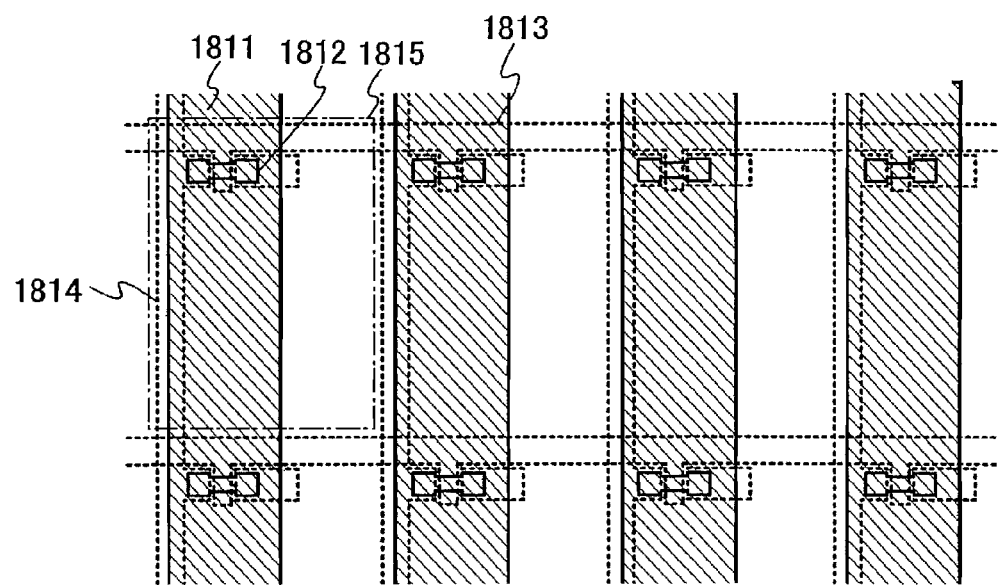

FIG. 5B illustrates a layout of semiconductor films 1811 and semiconductor films 1812 in the case where the semiconductor films 1812 used for transistors of pixels arranged in a signal line direction are formed using one of the semiconductor films 1811. In addition to the layout of the semiconductor films 1811 and the semiconductor films 1812, regions in which scanning lines 1813 and signal lines 1814 are formed are illustrated by dotted lines in FIG. 5B.

Each pixel 1815 includes at least one of the scanning lines 1813, one of the signal lines 1814, and a transistor having one of the semiconductor films 1812. The transistor performs switching based on a signal supplied from a scanning line driver circuit to each of the scanning lines 1813. When the transistor is turned on, a video signal supplied from a signal line driver circuit to each of the signal lines 1814 is input to the pixel 1815.

Each of the semiconductor films 1811 overlaps with regions in which the semiconductor films 1812 are formed in the pixels 1815 arranged in the direction of the signal lines 1814. Even when each of the semiconductor films 1811 has different characteristics such as crystallinity or internal stress, which may affect operating characteristics of transistors, variations in luminance of a display element for displaying grayscale images based on video signals can be suppressed by the following source line inversion driving: in one frame period, video signals having the same polarity are input to pixels connected to the same scanning line while video signals having the opposite polarity are input to pixels connected to the adjacent scanning lines.

FIG. 5B illustrates an example in which the regions to be the semiconductor films 1812 overlap with one of the semiconductor films 1811 in the pixels 1815 connected to one of the signal lines 1814; however, the invention is not limited to this structure. The regions to be the semiconductor films 1812 may overlap with one of the semiconductor films 1811 in the pixels 1815 connected to the plurality of signal lines 1814.

Figure 6A:
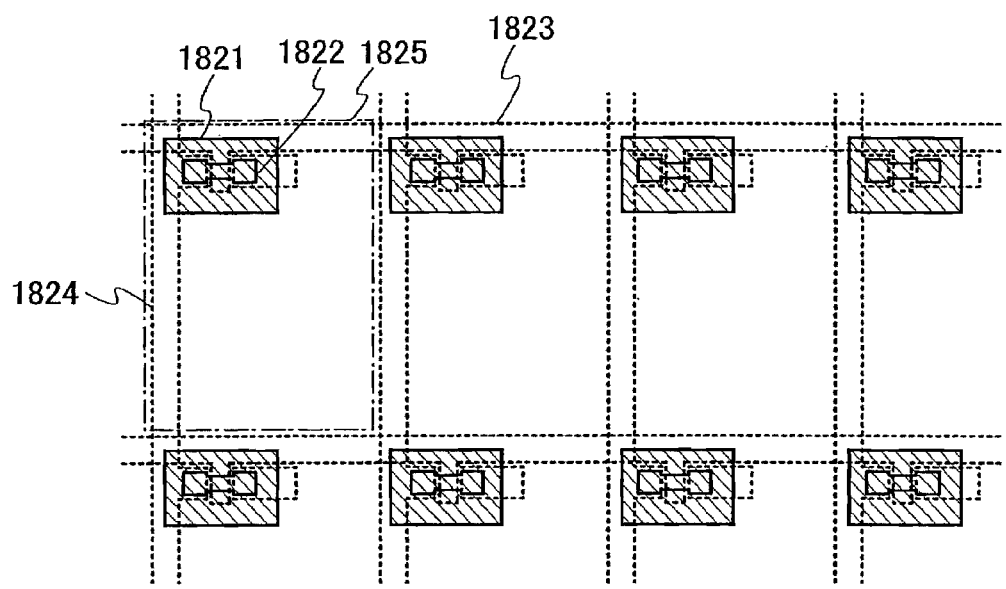
FIGS. 6A and 6B each illustrate a layout of semiconductor films.

FIG. 6A illustrates a layout of semiconductor films 1821 and semiconductor films 1822 in the case where one of the semiconductor films 1822 used for a transistor of a pixel is formed using one of the semiconductor films 1821. In addition to the layout of the semiconductor films 1821 and the semiconductor films 1822, regions in which scanning lines 1823 and signal lines 1824 are formed are illustrated by dotted lines in FIG. 6A.

Each pixel 1825 includes at least one of the scanning lines 1823, one of the signal lines 1824, and a transistor having one of the semiconductor films 1822. The transistor performs switching based on a signal supplied from a scanning line driver circuit to each of the scanning lines 1823. When the transistor is turned on, a video signal supplied from a signal line driver circuit to each of the signal lines 1824 is input to the pixel 1825.

Each of the semiconductor films 1821 overlaps with a region in which one of the semiconductor films 1822 is formed in one of the pixels 1825. According to this structure, even when each of the semiconductor films 1821 has different characteristics such as crystallinity or internal stress, which may affect operating characteristics of transistors, variations in luminance of a display element for displaying grayscale images based on video signals can be suppressed.

Figure 6B:
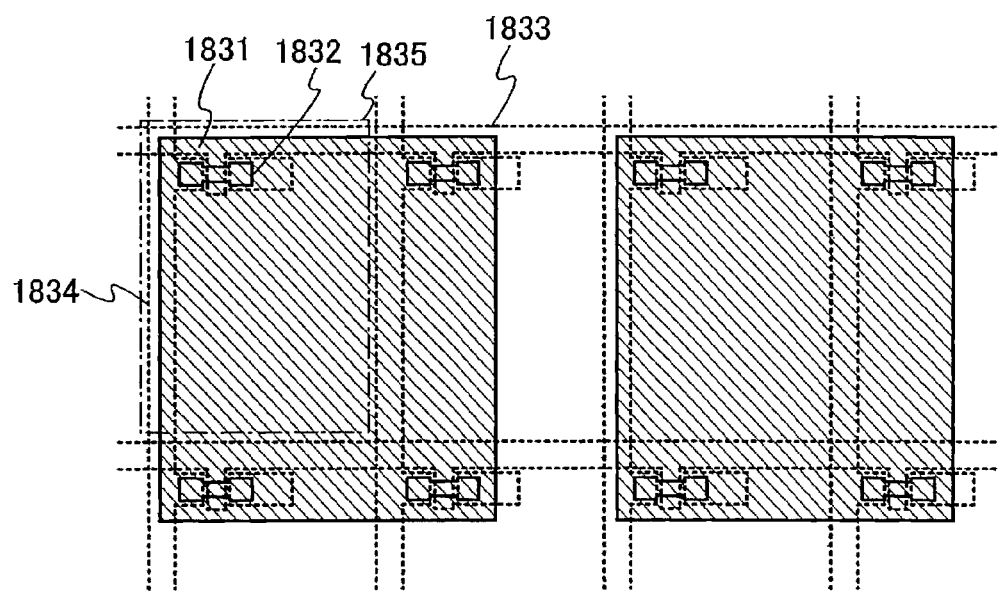

FIG. 6B illustrates a layout of semiconductor films 1831 and semiconductor films 1832 in the case where the semiconductor films 1832 used for transistors of pixels arranged in a signal line direction and a scanning line direction are formed using one of the semiconductor films 1831. In addition to the layout of the semiconductor films 1831 and the semiconductor films 1832, regions in which scanning lines 1833 and signal lines 1834 are formed are illustrated by dotted lines in FIG. 6B.

Each pixel 1835 includes at least one of the scanning lines 1833, one of the signal lines 1834, and a transistor having one of the semiconductor films 1832. The transistor performs switching based on a signal supplied from a scanning line driver circuit to each of the scanning lines 1833. When the transistor is turned on, a video signal supplied from a signal line driver circuit to each of the signal lines 1834 is input to the pixel 1835.

Each of the semiconductor films 1831 overlaps with regions in which the semiconductor films 1832 are formed in the plurality of pixels 1835 connected to the plurality of scanning lines 1833 and the plurality of signal lines 1834.

This embodiment mode can be implemented in combination with any of other embodiment modes as appropriate.

According to the manufacturing method of a semiconductor device of this embodiment mode, a plurality of semiconductor films (mother islands) can be bonded to a base substrate so as to be spaced apart from each other based on a layout of semiconductor films (islands) used for a semiconductor element. Therefore, the number of needed bond substrates can be minimized as compared to the case of bonding semiconductor films to the entire surface of the base substrate. Furthermore, the crystal orientation of semiconductor films can be appropriately selected in accordance with the polarity of semiconductor elements, leading to higher mobility of the semiconductor elements, whereby a semiconductor device capable of operating at a higher speed can be provided.

The invention can be applied to manufacture any kind of semiconductor devices including microprocessors, integrated circuits such as image processing circuits, RF tags for transmitting and receiving data to/from an interrogator without contact, semiconductor display devices, and the like. The semiconductor display device includes in its category, a liquid crystal display device, a light-emitting device having pixels each provided with a light-emitting element typified by an organic light-emitting diode (an OLED), a DMD (digital micromirror device), a PDP (plasma display panel), an FED (field emission display), and the like, as well as another semiconductor display device having a driver circuit provided with a circuit element using a semiconductor film.

Embodiment Mode 2

In this embodiment mode, a structure of a manufacturing apparatus of the invention is described.

Figure 7A:
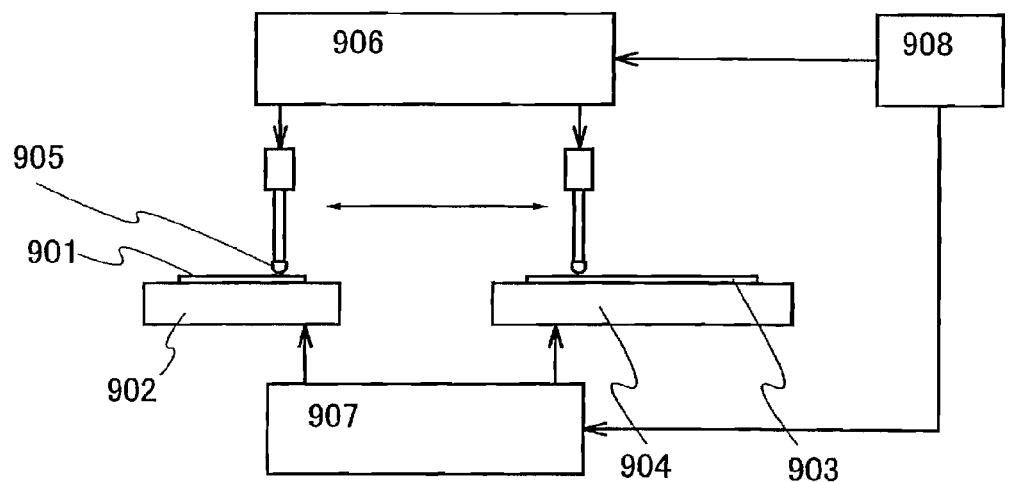
FIGS. 7A and 7B each illustrate a structure of a manufacturing apparatus of the invention.

FIG. 7A illustrates an example of a structure of a manufacturing apparatus according to the invention. The manufacturing apparatus illustrated in FIG. 7A includes a stage 902 on which a bond substrate 901 is mounted and a stage 904 on which a base substrate 903 is mounted. Although FIG. 7A illustrates an example in which the bond substrate 901 and the base substrate 903 are mounted on different stages, the invention is not limited to this structure. The bond substrate 901 and the base substrate 903 may be mounted on the same stage.

Furthermore, FIG. 7A illustrates one stage 902 on which one bond substrate 901 is mounted; however, the invention is not limited to this structure. For example, the manufacturing apparatus of the invention may include a plurality of stages 902 on which one bond substrate 901 is mounted, or a plurality of bond substrates 901 may be mounted on the stage 902.

The manufacturing apparatus illustrated in FIG. 7A further includes a collet 905 that is firmly attached to a semiconductor film formed by separation or cleavage of the bond substrate 901 and is used for bonding the semiconductor film to a predetermined position of the base substrate 903. The collet 905 may be a means that can be firmly attached to a selected one of the semiconductor films, for example, a chuck such as a vacuum chuck or a mechanical chuck, a microneedle to the tip of which an adhesive is attached, or the like is used.

The manufacturing apparatus illustrated in FIG. 7A further includes at least a collet driving portion 906 for controlling the position of the collet 905, a stage driving portion 907 for controlling the positions of the stage 902 and the stage 904, and a CPU 908 for controlling the operation of the collet driving portion 906 and the stage driving portion 907 based on the position data of the collet or the stages.

The position data of the collet or the position data of the stages can be obtained based on the position data where a semiconductor film is formed in the bond substrate 901 and where the semiconductor film is bonded to over the base substrate 903. In order to adjust the position of the bond substrate 901 or the base substrate 903, the manufacturing apparatus illustrated in FIG. 7A may be provided with a camera including an image pickup device such as a CCD (charge-coupled device).

When a heat sink is provided over the stage 902 in order to absorb or release heat of the bond substrate 901, and a microneedle to the tip of which a low-temperature coagulant is attached is used as the collet 905, the temperature of the bond substrate 901 can be efficiently lowered using the heat sink.

Figure 7B:
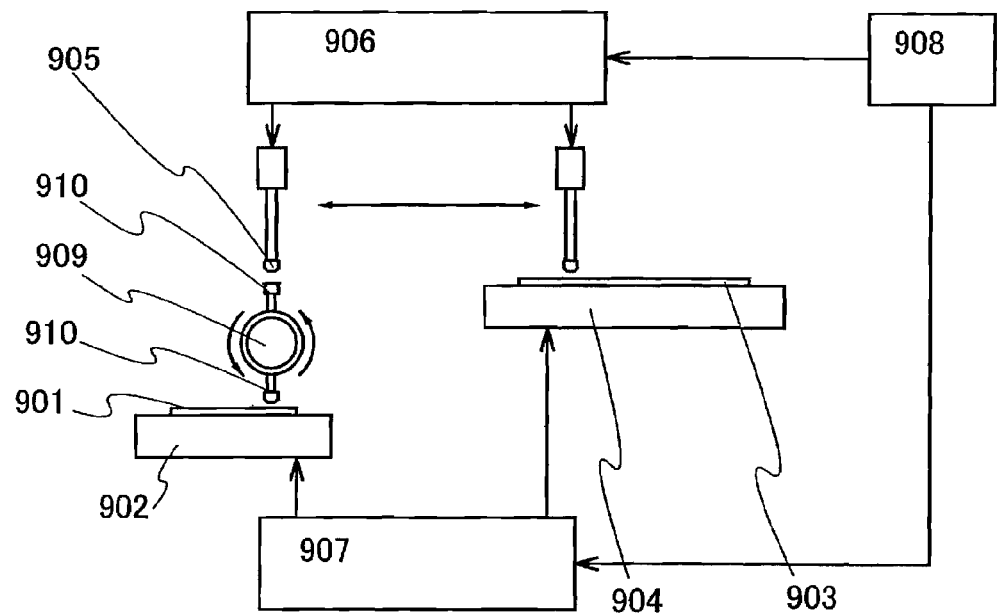

The manufacturing apparatus of the invention may include a reversing apparatus for picking up a semiconductor film from the bond substrate 901 and then turning the semiconductor film over. FIG. 7B illustrates an example in which a reversing apparatus 909 is added to the manufacturing apparatus illustrated in FIG. 7A. The reversing apparatus 909 includes reversing collets 910 each for picking up a semiconductor film and holding it temporarily. The collet 905 is firmly attached to a surface of a semiconductor film held by one of the reversing collets 910, which is opposite to the surface to which the reversing collet 910 is firmly attached, thereby receiving the semiconductor film from the reversing collet 910.

FIG. 8 is a perspective view illustrating the positions and specific structure of the bond substrate 901, the stage 902, the base substrate 903, the stage 904, the collet 905, the collet driving portion 906, and the stage driving portion 907 that are illustrated in FIG. 7A. Note that FIG. 8 illustrates an example using a stage driving portion 907a for controlling the operation of the stage 902 and a stage driving portion 907b for controlling the operation of the stage 904.

According to an instruction from the CPU 908, the stage driving portion 907a moves the stage 902 in an X direction or a Y direction intersecting with the X direction. The stage driving portion 907a may also move the stage 902 in a Z direction that lies on a different plane than that defined by the X direction and the Y direction. Similarly, the stage driving portion 907b moves the stage 904 in the X direction or the Y direction intersecting with the X direction. The stage driving portion 907b may move the stage 904 in the Z direction that lies on a different plane than that defined by the X direction and the Y direction.

The collet 905 picks up one of a plurality of semiconductor films that are formed by separation or cleavage of the bond substrate 901. The collet driving portion 906 transfers the collet 905 that holds the semiconductor film from the bond substrate 901 to the base substrate 903. Although FIG. 8 illustrates an example in which one collet 905 moves back and forth between the bond substrate 901 and the base substrate 903, a plurality of collets 905 may be used. When the plurality of collets 905 are used, each of the collets 905 may be independently controlled by a plurality of collet driving portions 906, or all the collets 905 may be controlled by one collet driving portion 906.

Figure 9:
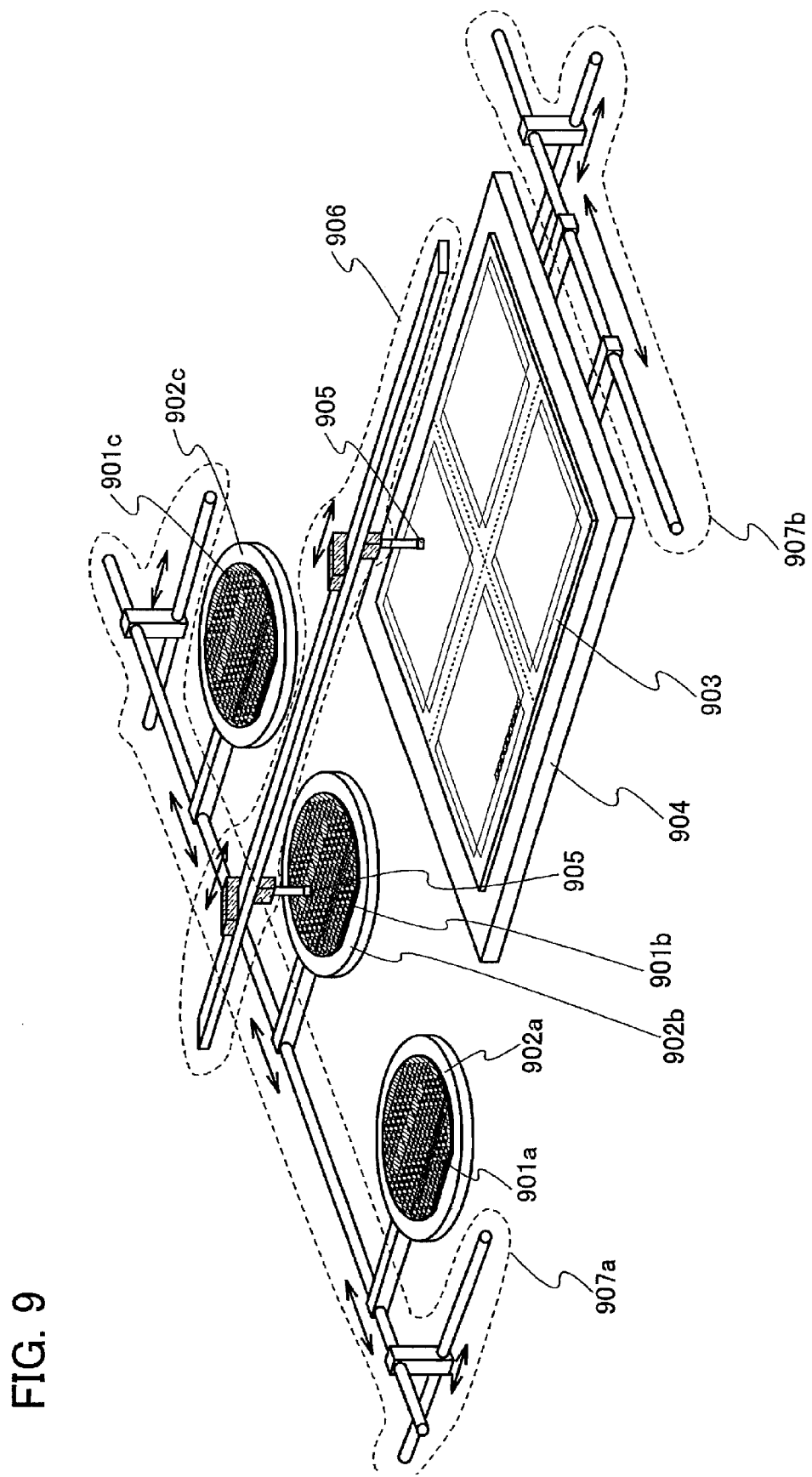
FIG. 9 illustrates a structure of a manufacturing apparatus of the invention.

FIG. 9 illustrates an example of using a plurality of stages 902 illustrated in FIG. 8. In FIG. 9, a stage 902a, a stage 902b, and a stage 902c are used and all of the stages 902a, 902b, and 902c are controlled by the stage driving portion 907a. Note that the stage 902a, the stage 902b, and the stage 902c may be independently controlled by a plurality of stage driving portions 907a.

In FIG. 9, a bond substrate 901a, a bond substrate 901b, and a bond substrate 901c are mounted on the stage 902a, the stage 902b, and the stage 902c, respectively. The bond substrate 901a, the bond substrate 901b, and the bond substrate 901c may have different or the same crystal orientation.

In FIG. 9, the collet 905 picks up one of a plurality of semiconductor films that are formed by separation or cleavage of the bond substrate 901a, the bond substrate 901b, or the bond substrate 901c. The collet driving portion 906 transfers the collet 905 that holds the semiconductor film from the bond substrate 901a, the bond substrate 901b, or the bond substrate 901c to the base substrate 903. Although FIG. 9 illustrates an example in which one collet 905 moves back and forth between the bond substrate 901a, the bond substrate 901b, or the bond substrate 901c and the base substrate 903, a plurality of collets 905 may be used so that at least one collet 905 corresponds to each of the bond substrate 901a, the bond substrate 901b, and the bond substrate 901c.

According to the manufacturing apparatus of the invention, a plurality of semiconductor films that are formed using one bond substrate 901 can be appropriately transferred to desired positions over the base substrate 903 and bonded thereto.

This embodiment mode can be implemented in combination with the aforementioned embodiment mode as appropriate.

Embodiment Mode 3

In this embodiment mode, another manufacturing method of a semiconductor device of the invention is described, in which a defect layer is formed in a bond substrate by doping instead of forming a projection in the bond substrate by etching as in the manufacturing method described in Embodiment Mode 1.

Figure 10A:
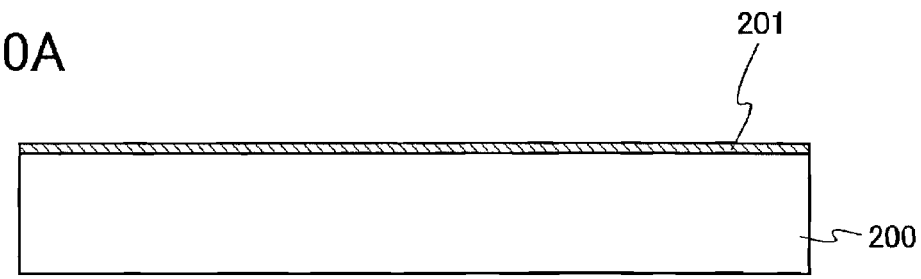
FIGS. 10A to 10D illustrate a manufacturing method of a semiconductor device of the invention.

First, as illustrated in FIG. 10A, an insulating film 201 is formed over a bond substrate 200. As the bond substrate 200, a single crystal semiconductor substrate of silicon, germanium, or the like or a polycrystalline semiconductor substrate of silicon, germanium, or the like can be used. A single crystal or polycrystalline semiconductor substrate formed of a compound semiconductor such as gallium arsenide or indium phosphide can also be used as the bond substrate 200. It is also possible to use as the bond substrate 200 a semiconductor substrate formed of silicon having lattice distortion, silicon germanium in which germanium is added to silicon, or the like. Silicon having lattice distortion can be formed by deposition of silicon on silicon germanium or silicon nitride that has a larger lattice constant than silicon.

The insulating film 201 is made of an insulating material such as silicon oxide, silicon nitride oxide, silicon oxynitride, or silicon nitride. The insulating film 201 may be either a single insulating film or a plurality of stacked insulating films. For example, in this embodiment mode, silicon oxide is used as the insulating film 201.

In the case of using silicon oxide as the insulating film 201, the insulating film 201 can be formed by a vapor deposition method such as a thermal CVD method, a plasma CVD method, an atmospheric pressure CVD method, or a bias ECRCVD method using a mixed gas of silane and oxygen, a mixed gas of TEOS (tetraethoxysilane) and oxygen, or the like. In this case, a surface of the insulating film 201 may be densified by oxygen plasma treatment. In the case of using silicon nitride as the insulating film 201, the insulating film 201 can be formed by a vapor deposition method such as a plasma CVD method using a mixed gas of silane and ammonia. In the case of using silicon nitride oxide as the insulating film 201, the insulating film 201 can be formed by a vapor deposition method such as a plasma CVD method using a mixed gas of silane and ammonia or a mixed gas of silane and nitrogen oxide.

Furthermore, the insulating film 201 may be made of silicon oxide that is formed by a chemical vapor deposition method using an organosilane gas. As the organosilane gas, any of the following silicon-containing compounds may be used: tetraethoxysilane (TEOS: chemical formula: $Si(OC_2H_5)_4$), tetramethylsilane (TMS: chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

Figure 10B:
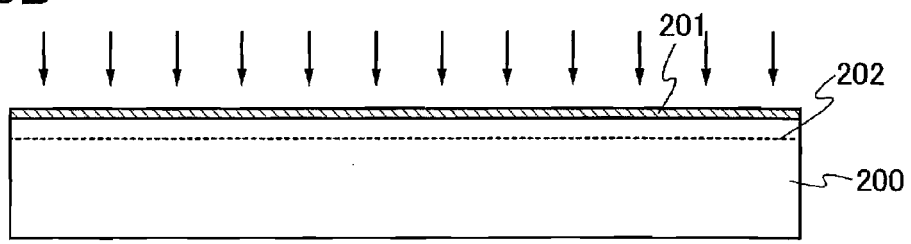
Figure 10C:
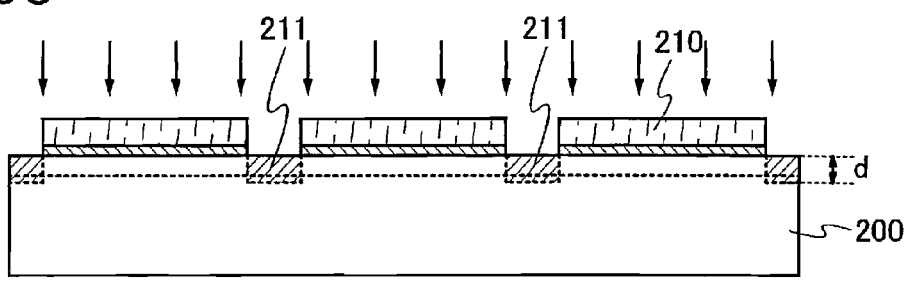

Next, as illustrated in FIG. 10B, the bond substrate 200 is irradiated with hydrogen or a rare gas, or hydrogen ions or rare gas ions as indicated by arrows, whereby a defect layer 202 having microvoids is formed in a region at a predetermined depth from the surface of the bond substrate 200. The position where the defect layer 202 is formed is determined depending on the accelerating voltage at the time of the aforementioned irradiation. The thickness of a semiconductor film 206 that is formed using the bond substrate 200 is determined depending on the position where the defect layer 202 is formed; therefore, the accelerating voltage at the time of the irradiation is determined in consideration of the thickness of the semiconductor film 206. The position where the defect layer 202 is formed can be changed not only by the accelerating voltage at the time of the irradiation but also by the thickness of the insulating film 201. For example, when the thickness of the insulating film 201 is made larger, the thickness of the semiconductor film 206 can be made smaller. The thickness of the semiconductor film 206 is, for example, 10 nm to 200 nm, and preferably 10 nm to 50 nm. For example, when the bond substrate 200 is irradiated with hydrogen, the dose is desirably set to $1 \times 10^{16}/cm^2$ to $1 \times 10^{17}/cm^2$. In this embodiment mode, the bond substrate 200 is irradiated with hydrogen or hydrogen ions with an accelerating voltage of 40 kV and a dose of $1.75 \times 10^{16}/cm^2$.

In the aforementioned step of forming the defect layer 202, the bond substrate 200 is irradiated with hydrogen or a rare gas, or hydrogen ions or rare gas ions at high concentration, which may cause roughness of the surface of the bond substrate 200 and variation in interface state density between the semiconductor film that is formed using the bond substrate 200 and an gate insulating film that is in contact with the semiconductor film. By providing the insulating film 201, the surface of the bond substrate 200 is protected at the time of the irradiation with hydrogen or a rare gas, or hydrogen ions or rare gas ions, and it is possible to prevent the surface of the bond substrate 200 from being roughened and the aforementioned interface state density from varying.

Then, masks 210 are formed over the insulating film 201, and the bond substrate 200 is selectively irradiated with hydrogen or a rare gas, or hydrogen ions or rare gas ions as indicated by arrows, whereby defect layers 211 having microvoids are formed. The defect layers 211 are formed by irradiating with a higher dose of gas or ions or with a larger mass of gas or ions than that used for forming the defect layer 202. According to such a structure, the defect layers 211 can have a larger width in the depth direction of the bond substrate 200. For example, when the bond substrate 200 is irradiated with hydrogen, the dose is desirably set to $5 \times 10^{17}/cm^2$ to $5 \times 10^{18}/cm^2$. In this embodiment mode, the bond substrate 200 is irradiated with hydrogen or hydrogen ions with an accelerating voltage of 40 kV and a dose of $1 \times 10^{18}/cm^2$.

The defect layers 211 each have a width d in a direction (a depth direction) perpendicular to the bond substrate 200. The width d is desirably greater than or equal to the depth of the defect layer 202. Specifically, the width d is set to, for example, greater than or equal to 10 nm, and preferably greater than or equal to 200 nm in consideration of the thickness of the semiconductor film 206.

The bond substrate 200 sometimes warps, bends, or has a little round edge. Moreover, in some cases, at the time of irradiating with gas or ions for separating a semiconductor film from the bond substrate 200, ions or the like cannot be added sufficiently at an edge of the bond substrate 200. Therefore, it is difficult to separate the semiconductor film at the edge of the bond substrate 200. Accordingly, the defect layers 211 are desirably formed at the edges of the bond substrate 200. The semiconductor film can be formed by separation or cleavage with excellent reproducibility by forming the defect layers 211 at the edges of the bond substrate 200. For example, the defect layers 211 at the edges of the bond substrate 200 preferably have a width of several tens of micrometers to several tens of millimeters in a direction perpendicular to the width d.

Next, heat treatment is performed after the masks 210 are removed, whereby microvoids adjacent to each other in the defect layer 202 and the defect layers 211 are combined and the microvoids increase in volume. As a result, the bond substrate 200 is separated or cleaved at the defect layer 202 and the defect layers 211, so that the insulating film 201 as well as the semiconductor film 206 is separated from the bond substrate 200. The heat treatment may be performed, for example, at a temperature ranging from 400° C. to 600° C.

The heat treatment may be performed by dielectric heating with high-frequency waves such as microwaves. The heat treatment by the dielectric heating can be performed by irradiating the bond substrate 200 with high-frequency waves generated at a high-frequency generator, which range from 300 MHz to 3 THz. Specifically, for example, the bond substrate 200 is irradiated with a microwave with a frequency of 2.45 GHz at 900 W for 14 minutes so that the microvoids adjacent to each other in the defect layers are combined, whereby the bond substrate 200 can be separated or cleaved.

Figure 10D:
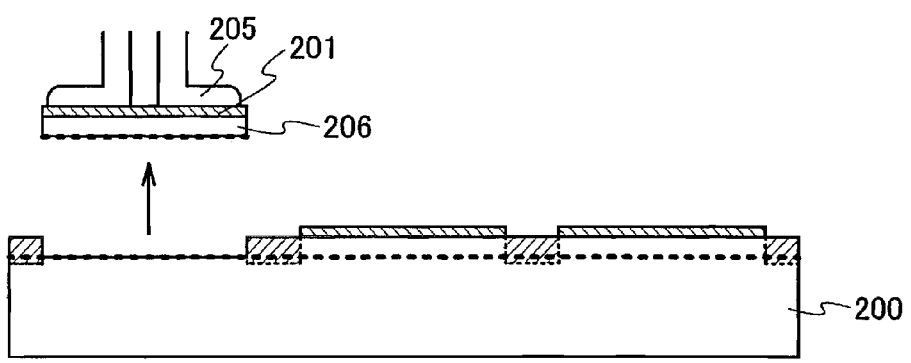

Then, as illustrated in FIG. 10D, a collet 205 is firmly attached to the insulating film 201 that is formed over the semiconductor film 206, and the semiconductor film 206 is separated from the bond substrate 200. Even when separation or cleavage of the bond substrate 200 by the heat treatment is incomplete, the semiconductor film 206 can be completely separated from the bond substrate 200 by application of force using the collet 205. The collet 205 may be a means that can be firmly attached to a selected one of the semiconductor films 206, for example, a chuck such as a vacuum chuck or a mechanical chuck, a microneedle to the tip of which an adhesive is attached, or the like is used. FIG. 10D illustrates a case in which a vacuum chuck is used as the collet 205.

Before separating or cleaving the bond substrate 200, hydrogenation may be performed on the bond substrate 200. The hydrogenation is performed, for example, at 350° C. in a hydrogen atmosphere for approximately two hours.

As an adhesive to be attached to a microneedle, an epoxy-based adhesive, a ceramic-based adhesive, a silicone-based adhesive, a low-temperature coagulant, or the like can be used. For example, MW-1 (manufactured by Eminent Supply Corporation) can be used as the low-temperature coagulant.

Subsequently, through manufacturing steps similar to those described in Embodiment Mode 1, a semiconductor device of the invention can be manufactured.

Embodiment Mode 4

In this embodiment mode, another manufacturing method of a semiconductor device of the invention is described.

Figure 11A:
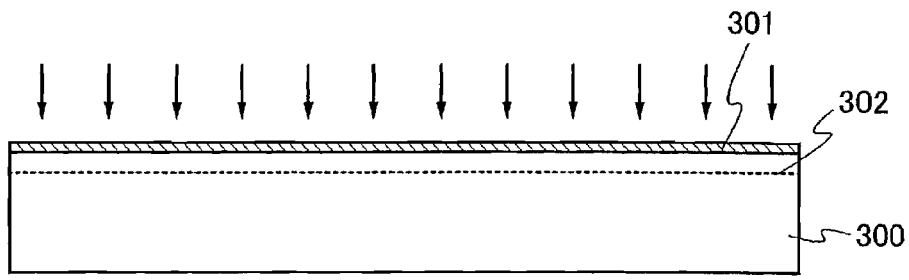
FIGS. 11A to 11D illustrate a manufacturing method of a semiconductor device of the invention.

First, as illustrated in FIG. 11A, an insulating film 301 is formed over a bond substrate 300. As the bond substrate 300, a single crystal semiconductor substrate of silicon, germanium, or the like or a polycrystalline semiconductor substrate of silicon, germanium, or the like can be used. A single crystal or polycrystalline semiconductor substrate formed of a compound semiconductor such as gallium arsenide or indium phosphide can also be used as the bond substrate 300. It is also possible to use as the bond substrate 300 a semiconductor substrate formed of silicon having lattice distortion, silicon germanium in which germanium is added to silicon, or the like. Silicon having lattice distortion can be formed by deposition of silicon on silicon germanium or silicon nitride that has a larger lattice constant than silicon.

The insulating film 301 is made of an insulating material such as silicon oxide, silicon nitride oxide, silicon oxynitride, or silicon nitride. The insulating film 301 may be either a single insulating film or a plurality of stacked insulating films. For example, in this embodiment mode, the insulating film 301 is formed by stacking silicon oxynitride containing a larger amount of oxygen than nitrogen and silicon nitride oxide containing a larger amount of nitrogen than oxygen in this order from the bond substrate 300.

In the case of using silicon oxide as the insulating film 301, the insulating film 301 can be formed by a vapor deposition method such as a thermal CVD method, a plasma CVD method, an atmospheric pressure CVD method, or a bias ECRCVD method using a mixed gas of silane and oxygen, a mixed gas of TEOS (tetraethoxysilane) and oxygen, or the like. In this case, a surface of the insulating film 301 may be densified by oxygen plasma treatment. In the case of using silicon nitride as the insulating film 301, the insulating film 301 can be formed by a vapor deposition method such as a plasma CVD method using a mixed gas of silane and ammonia. In the case of using silicon nitride oxide as the insulating film 301, the insulating film 301 can be formed by a vapor deposition method such as a plasma CVD method using a mixed gas of silane and ammonia or a mixed gas of silane and nitrogen oxide.

Furthermore, the insulating film 301 may be made of silicon oxide that is formed by a chemical vapor deposition method using an organosilane gas. As the organosilane gas, any of the following silicon-containing compounds may be used: tetraethoxysilane (TEOS: chemical formula: $Si(OC_2H_5)_4$), tetramethylsilane (TMS: chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

Next, the bond substrate 300 is irradiated with hydrogen or a rare gas, or hydrogen ions or rare gas ions as indicated by arrows, whereby a defect layer 302 having microvoids is formed in a region at a predetermined depth from the surface of the bond substrate 300. The position where the defect layer 302 is formed is determined depending on the accelerating voltage at the time of the aforementioned irradiation. The thicknesses of semiconductor films 306 and a semiconductor film 308 that are formed using the bond substrate 300 are determined depending on the position where the defect layer 302 is formed; therefore, the accelerating voltage at the time of the irradiation is determined in consideration of the thicknesses of the semiconductor films 306 and the semiconductor film 308. The position where the defect layer 302 is formed can be changed not only by the accelerating voltage at the time of the irradiation but also by the thickness of the insulating film 301. For example, when the thickness of the insulating film 301 is made larger, the thicknesses of the semiconductor films 306 and the semiconductor film 308 can be made smaller. The thicknesses of the semiconductor films 306 and the semiconductor film 308 each are, for example, 10 nm to 200 nm, and preferably 10 nm to 50 nm. For example, when the bond substrate 300 is irradiated with hydrogen, the dose is desirably set to $1\times10^{16}/cm^2$ to $1\times10^{17}/cm^2$. In this embodiment mode, the bond substrate 300 is irradiated with hydrogen or hydrogen ions with an accelerating voltage of 40 kV and a dose of $1.75\times10^{16}/cm^2$.

In the aforementioned step of forming the defect layer 302, the bond substrate 300 is irradiated with hydrogen or a rare gas, or hydrogen ions or rare gas ions at high concentration, which may cause roughness of the surface of the bond substrate 300 and insufficient bonding strength between the bond substrate 300 and a base substrate 307. By providing the insulating film 301, the surface of the bond substrate 300 is protected at the time of the irradiation with hydrogen or a rare gas, or hydrogen ions or rare gas ions, and excellent bonding between the semiconductor films 306 and the semiconductor film 308 and the base substrate 307 can be achieved.

Figure 11B:
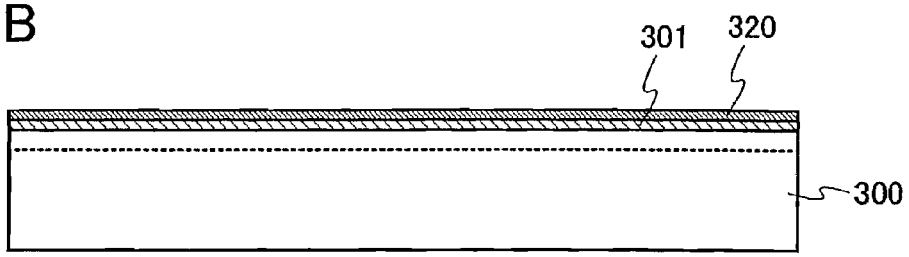

Next, an insulating film 320 is formed over the insulating film 301 as illustrated in FIG. 11B. The insulating film 320 is made of an insulating material such as silicon oxide, silicon nitride oxide, silicon oxynitride, or silicon nitride similarly to the insulating film 301. The insulating film 320 may be either a single insulating film or a plurality of stacked insulating films. Furthermore, the insulating film 320 may be made of silicon oxide that is formed by a chemical vapor deposition method using an organosilane gas. In this embodiment mode, the insulating film 320 is made of silicon oxide that is formed by a chemical vapor deposition method using an organosilane gas.

When the insulating film 301 or the insulating film 320 is made of silicon nitride, silicon nitride oxide, or the like that has a high barrier property, it is possible to prevent impurities such as an alkali metal or an alkaline earth metal in the base substrate 307 from entering the semiconductor films 306 and the semiconductor film 308 that are formed over the base substrate 307.

Although the insulating film 320 is formed after the defect layer 302 is formed in this embodiment mode, the insulating film 320 is not necessarily provided. However, since the insulating film 320 is formed after the defect layer 302 is formed, a surface of the insulating film 320 has higher planarity than that of the insulating film 301 that is formed before the defect layer 302 is formed. Accordingly, the formation of the insulating film 320 can increase the strength of the bonding that is later performed.

Figure 11C:
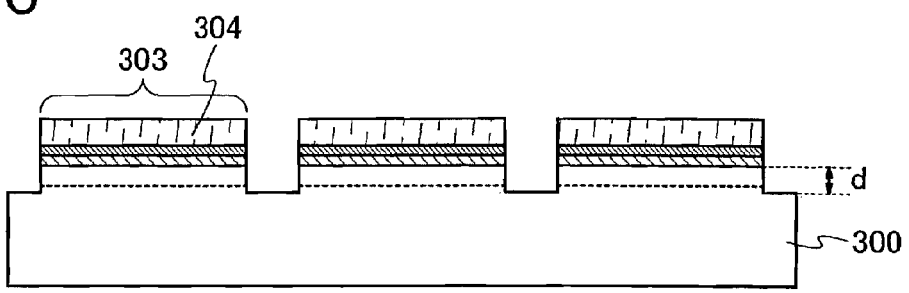
Figure 11D:
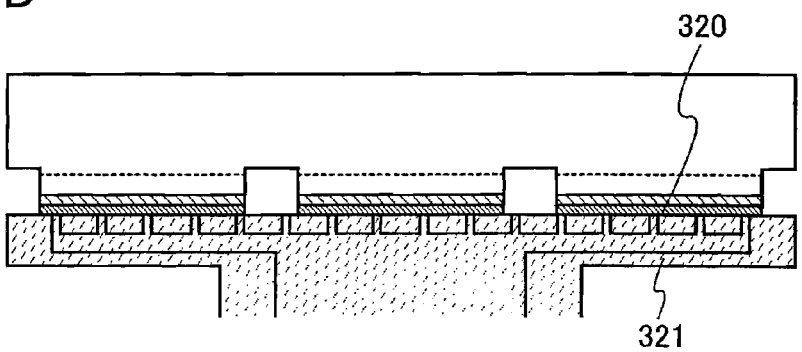

Then, the bond substrate 300 is partially removed. In this embodiment mode, as illustrated in FIG. 11C, the bond substrate 300 as well as the insulating film 301 is partially etched away using masks 304, thereby forming the bond substrate 300 having a plurality of projections 303.

In the bond substrate 300, each of the plurality of projections 303 has a width d in a direction (a depth direction) perpendicular to the bond substrate 300. The width d is greater than or equal to the depth of the defect layer 302. The width d of each of the projections 303 in the direction (the depth direction) perpendicular to the bond substrate 300 is not necessarily constant and may have different values depending on the location. Specifically, the width d is set to, for example, greater than or equal to 10 nm, and preferably greater than or equal to 200 nm in consideration of the thickness of the semiconductor films 306.

The bond substrate 300 sometimes warps, bends, or has a little round edge. Moreover, in some cases, at the time of irradiating with hydrogen or a rare gas, or hydrogen ions or rare gas ions for separating semiconductor films from the bond substrate 300, the gas or the ions cannot be added sufficiently at an edge of the bond substrate 300. Therefore, it is difficult to separate the semiconductor films at the edge of the bond substrate 300. Accordingly, the plurality of projections 303 of the bond substrate 300 are desirably formed at a predetermined distance from the rim of the bond substrate 300. The semiconductor films can be formed by separation or cleavage with excellent reproducibility by forming the projections 303 at a predetermined distance from the rim of the bond substrate 300. For example, it is preferable that the projection 303 that is positioned closest to the edge of the substrate have a distance of several tens of micrometers to several tens of millimeters from the rim of the bond substrate 300.

After the masks 304 are removed, the bond substrate 300 is firmly attached to a holding means 321 so that the projections 303 face the holding means 321. The holding means 321 may be a large vacuum chuck or mechanical chuck that can withstand the subsequent heat treatment and can overlap with the plurality of projections 303 to be firmly attached thereto. Specifically, a porous vacuum chuck, a contactless vacuum chuck, or the like may be used. In this embodiment mode, a vacuum chuck is used as the holding means 321.

Figure 12A:
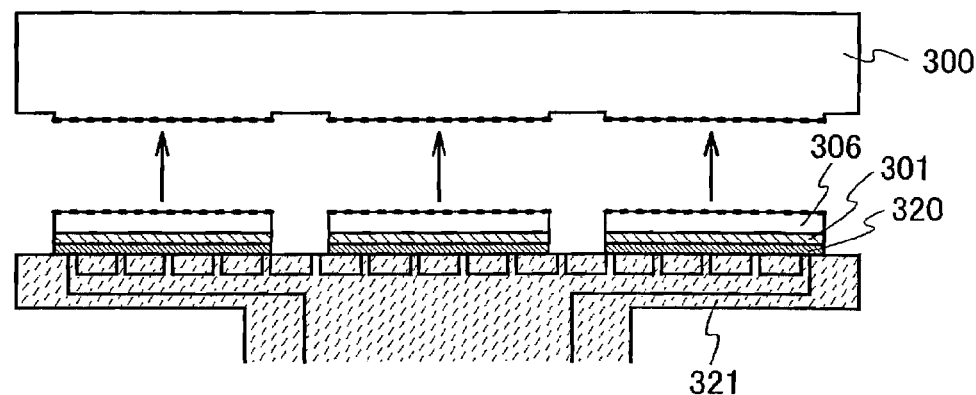
FIGS. 12A to 12C illustrate a manufacturing method of a semiconductor device of the invention.

Next, heat treatment is performed, whereby microvoids adjacent to each other in the defect layer 302 are combined and the microvoids increase in volume. Accordingly, as illustrated in FIG. 12A, the bond substrate 300 is separated or cleaved at the defect layer 302, so that the insulating film 301 and the insulating film 320 as well as the semiconductor films 306 that are part of the projections 303 are separated from the bond substrate 300. The heat treatment may be performed, for example, at a temperature ranging from 400° C. to 600° C.

The heat treatment may be performed by dielectric heating with high-frequency waves such as microwaves. The heat treatment by the dielectric heating can be performed by irradiating the bond substrate 300 with high-frequency waves generated at a high-frequency generator, which range from 300 MHz to 3 THz. Specifically, for example, the bond substrate 300 is irradiated with a microwave with a frequency of 2.45 GHz at 900 W for 14 minutes so that the microvoids adjacent to each other in the defect layer are combined, whereby the bond substrate 300 can be separated or cleaved.

Before separating or cleaving the bond substrate 300, hydrogenation may be performed on the bond substrate 300. The hydrogenation is performed, for example, at 350° C. in a hydrogen atmosphere for approximately two hours.

Figure 12B:
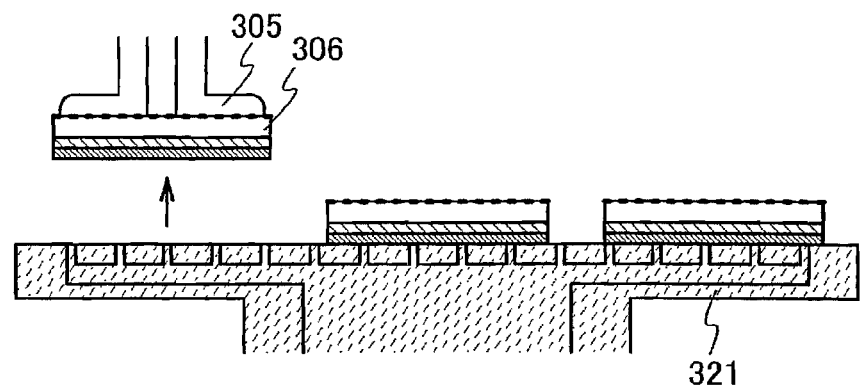

Then, as illustrated in FIG. 12B, a collet 305 is firmly attached to a surface of one of the semiconductor films 306, which is exposed by separation or cleavage, whereby the semiconductor film 306 is separated from the holding means 321. The collet 305 may be a means that can be firmly attached to a selected one of the projections 303, for example, a chuck such as a vacuum chuck or a mechanical chuck, a microneedle to the tip of which an adhesive is attached, or the like is used. FIG. 12B illustrates a case in which a vacuum chuck is used as the collet 305.

In this embodiment mode, the collet 305 is firmly attached to the surface of the semiconductor film 306, which is exposed by separation or cleavage. In order to prevent the surface of the semiconductor film 306 from being damaged by the collet 305, a protective film such as an insulating film may be formed thereover. However, the protective film is removed after the semiconductor film 306 is bonded to the base substrate 307.

As an adhesive to be attached to a microneedle, an epoxy-based adhesive, a ceramic-based adhesive, a silicone-based adhesive, a low-temperature coagulant, or the like can be used. For example, MW-1 (manufactured by Eminent Supply Corporation) can be used as the low-temperature coagulant. The coagulation point of MW-1 is approximately 17° C., and MW-1 has a bonding effect at a temperature less than or equal to the coagulation point (preferably at less than or equal to 10° C.) and does not have a bonding effect at a temperature greater than or equal to the coagulation point (preferably approximately 25° C.).

Figure 12C:
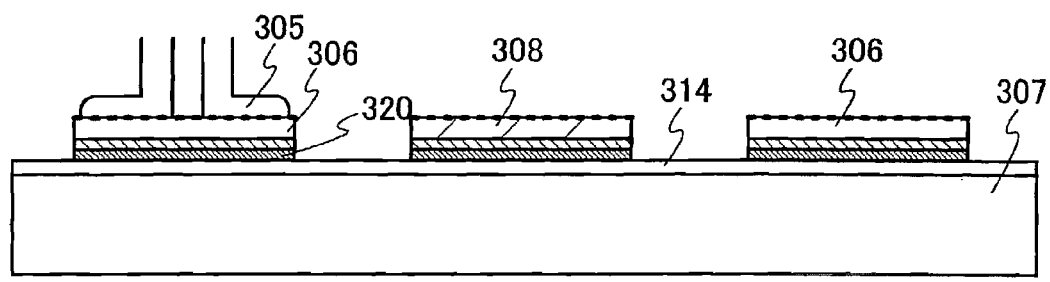

Then, as illustrated in FIG. 12C, the semiconductor films 306 are bonded to the base substrate 307 so that the insulating film 320 faces the base substrate 307, in other words, the surfaces of the semiconductor films 306, which are opposite to the surfaces exposed by separation or cleavage, face the base substrate 307. In this embodiment mode, an insulating film 314 is formed over the base substrate 307, and the insulating film 320 is bonded to the insulating film 314, whereby the semiconductor films 306 can be bonded to the base substrate 307. After bonding the insulating film 320 to the insulating film 314, heat treatment is preferably performed at 400° C. to 600° C. in order to further strengthen the bonding.

The bonding is performed by van der Waals forces; therefore, strong bonding can be obtained even at room temperature. Note that since the aforementioned bonding can be performed at a low temperature, various substrates can be used as the base substrate 307. As the base substrate 307, for example, a substrate such as a quartz substrate or a sapphire substrate can be used as well as a glass substrate made of aluminosilicate glass, barium borosilicate glass, aluminoborosilicate glass, or the like. Furthermore, as the base substrate 307, a semiconductor substrate made of silicon, gallium arsenide, indium phosphide, or the like can be used. Alternatively, a metal substrate including a stainless steel substrate may be used as the base substrate 307.

Note that the insulating film 314 is not necessarily formed over the surface of the base substrate 307. Even when the insulating film 314 is not formed, the base substrate 307 and the insulating film 320 can be bonded to each other. Note that when the insulating film 314 is formed over the surface of the base substrate 307, it is possible to prevent impurities such as an alkali metal or an alkaline earth metal in the base substrate 307 from entering the semiconductor films 306.

When the insulating film 314 is formed, not the base substrate 307 but the insulating film 314 is bonded to the insulating film 320; therefore, more kinds of substrates can be used as the base substrate 307. A substrate made of a flexible synthetic resin such as plastic generally tends to have a lower allowable temperature limit; however, when the insulating film 314 is formed, the substrate can be used as the base substrate 307 as long as it can withstand a processing temperature in a manufacturing process. As a plastic substrate, polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, or the like can be used.

Before bonding the semiconductor films 306 to the base substrate 307, the surface of the insulating film 320 may be polished. Even when the surface of the insulating film 320 is damaged by being brought into contact with the holding means 321, the planarity of the surface can be increased by polishing, which can secure the bonding strength.

Note that when MW-1 is used as a low-temperature coagulant, at a temperature at which a low-temperature coagulant does not have a bonding effect (for example, approximately at 25° C.), the low-temperature coagulant that is attached to the tip of the microneedle is brought into contact with the insulating film 320 on one of the projections 303. Next, the temperature is lowered to a temperature at which the low-temperature coagulant has a bonding effect (for example, approximately at 5° C.) to coagulate the low-temperature coagulant, whereby the insulating film 320 on the projection 303 and the microneedle are firmly attached to each other. Then, after bonding the semiconductor film 306 that is separated from the holding means 321 to the base substrate 307, the temperature is raised up again to a temperature at which the low-temperature coagulant does not have a bonding effect (for example, approximately at 25° C.), whereby the microneedle can be separated from the semiconductor film 306.

Furthermore, in FIG. 12C, a semiconductor film 308 is separated from a bond substrate having a crystal orientation different from that of the bond substrate 300 used for forming the semiconductor films 306, and then the semiconductor film 308 is bonded to the base substrate 307 in a similar manner to the semiconductor films 306.

The mobility of majority carriers in a semiconductor depends on crystal orientation. Accordingly, a bond substrate having a crystal orientation that is suitable for a semiconductor element to be formed may be appropriately selected to form the semiconductor films 306 or the semiconductor film 308. For example, when an n-type semiconductor element is formed using one of the semiconductor films 306, the mobility of majority carriers in the semiconductor element can be increased by forming the semiconductor film 306 having a {100} face. Meanwhile, when a p-type semiconductor element is formed using the semiconductor film 308, the mobility of majority carriers in the semiconductor element can be increased by forming the semiconductor film 308 having a {110} face. When a transistor is formed as a semiconductor element, the bonding direction of the semiconductor films 306 or the semiconductor film 308 is set in consideration of the channel direction and the crystal orientation.

Note that as described above, the bond substrate 300 sometimes warps, bends, or has a little round edge. Moreover, in some cases, at the time of irradiating with hydrogen or a rare gas, or hydrogen ions or rare gas ions for separating semiconductor films from the bond substrate 300, the gas or the ions cannot be added sufficiently at an edge of the bond substrate 300. Therefore, it is difficult to separate the semiconductor films at the edge of the bond substrate 300. When semiconductor films are formed by separating or cleaving the bond substrate after bonding the bond substrate to the base substrate, the distance between the semiconductor films is several millimeters to several centimeters. However, in the invention, before bonding the bond substrate 300 to the base substrate 307, the bond substrate 300 is separated or cleaved to form the semiconductor films 306 and the semiconductor film 308. Accordingly, when the semiconductor films 306 and the semiconductor film 308 are bonded to the base substrate 307, the distance between each of the semiconductor films 306 and the semiconductor film 308 can be reduced to approximately several tens of micrometers. A semiconductor device including the adjacent semiconductor films 306 and semiconductor film 308 can thus be manufactured easily.

Then, surfaces of the semiconductor films 306 and the semiconductor film 308 may be planarized. Although not necessarily essential, the planarization makes it possible to improve characteristics of the interface between a gate insulating film, and semiconductor films 309 and a semiconductor film 310 that are formed later. Specifically, the planarization can be performed by chemical mechanical polishing (CMP), liquid jet polishing, or the like. The thicknesses of the semiconductor films 306 and the semiconductor film 308 are reduced by the planarization. The planarization may be performed on the semiconductor films 309 and the semiconductor film 310 that are formed by etching.

Figure 13A:
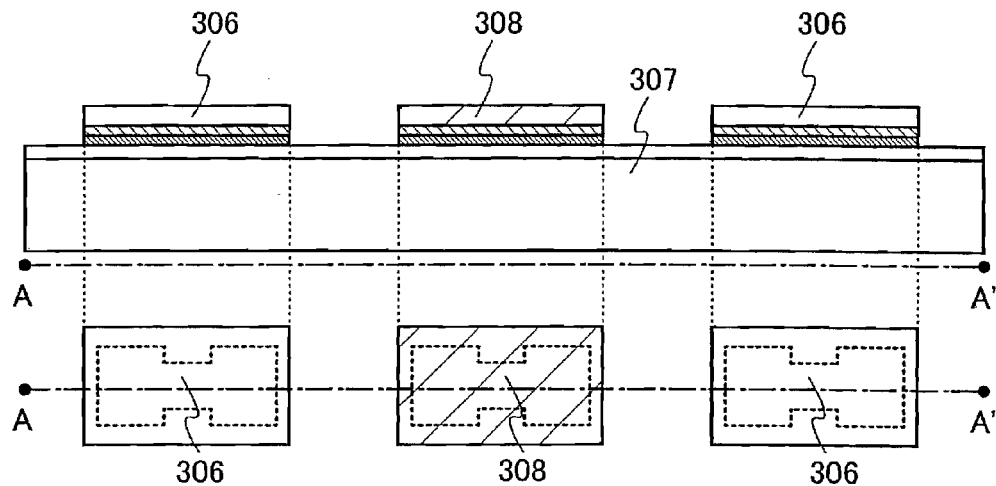
FIGS. 13A to 13C illustrate a manufacturing method of a semiconductor device of the invention.

Through the aforementioned manufacturing process, the semiconductor films 306 and the semiconductor film 308 can be formed over the base substrate 307 as illustrated in FIG. 13A. FIG. 13A illustrates a top view as well as a cross-sectional view of the semiconductor films 306 and the semiconductor film 308. The cross-sectional view illustrated in FIG. 13A corresponds to a cross section taken along a dashed line A-A' of the top view.

Figure 13B:
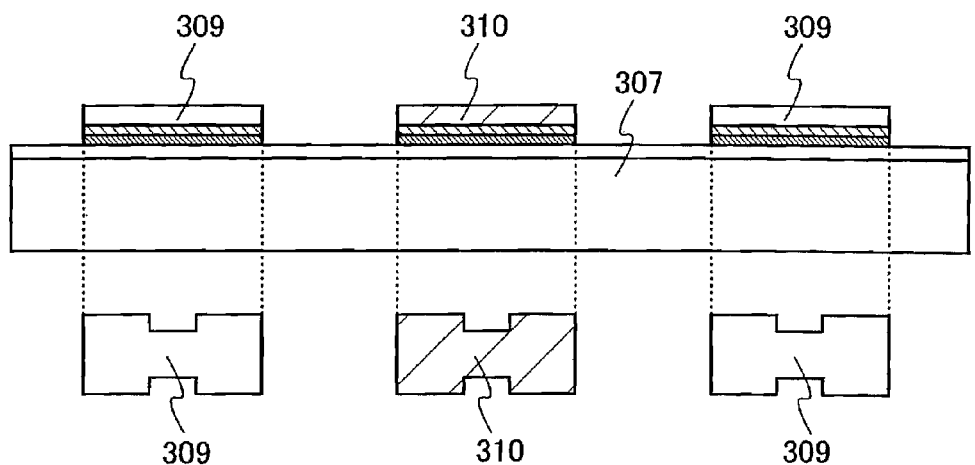

Next, as illustrated in FIG. 13B, the semiconductor films 306 and the semiconductor film 308 are partially etched, whereby the semiconductor films 309 are formed using the semiconductor films 306 and the semiconductor film 310 is formed using the semiconductor film 308. FIG. 13B illustrates a top view as well as a cross-sectional view of the semiconductor films 309 and the semiconductor film 310. The cross-sectional view illustrated in FIG. 13B corresponds to a cross section taken along a dashed line A-A' of the top view. When the semiconductor films 306 and the semiconductor film 308 are further etched, the edges of the semiconductor films 306 and the semiconductor film 308 that do not have enough bonding strength can be removed.

Note that in this embodiment mode, one semiconductor film 306 is etched to form one semiconductor film 309, and one semiconductor film 308 is etched to form one semiconductor film 310; however, the invention is not limited to this structure. For example, one semiconductor film 306 may be etched to form a plurality of semiconductor films 309, and one semiconductor film 308 may be etched to form a plurality of semiconductor films 310.

The semiconductor films 309 and the semiconductor film 310, or the semiconductor films 306 and the semiconductor film 308 before etching may be irradiated with an energy beam to recover crystal defects. As the energy beam, a beam that is selectively absorbed in a semiconductor is used; for example, laser light is desirably used. As the laser light, a gas laser such as an excimer laser or a solid-state laser such as a YAG laser can be used as a light source. The laser light preferably has a wavelength in the range of ultraviolet to near-infrared light; specifically, laser light with a wavelength of 190 nm to 2000 nm is desirably used. Alternatively, flash lamp annealing that uses a halogen lamp, a xenon lamp, or the like may be performed to recover crystal defects.

Although this embodiment mode shows the case of using a Smart Cut method in which the semiconductor films 306 and the semiconductor film 308 are separated from the bond substrate 300 by the formation of the defect layer 302, any other bonding method such as ELTRAN (epitaxial layer transfer), a dielectric isolation method, or a PACE (plasma assisted chemical etching) method may be used.

Figure 13C:
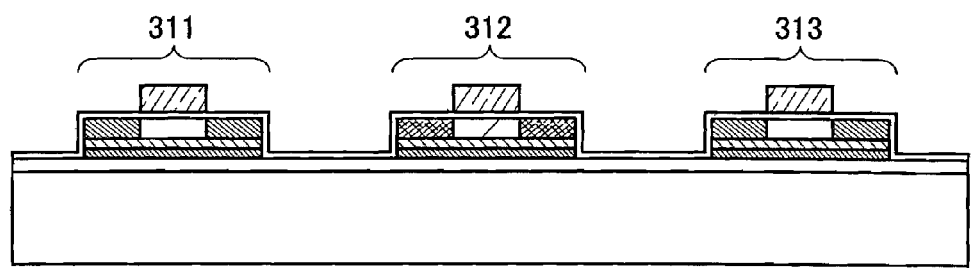

With the use of the semiconductor films 309 and the semiconductor film 310 that are formed through the aforementioned steps, various kinds of semiconductor elements such as transistors 311 to 313 can be formed as illustrated in FIG. 13C.

In this embodiment mode, after the plurality of semiconductor films 306 are separated from the bond substrate 300 by the holding means 321, the plurality of semiconductor films 306 are selected from the holding means 321 by the collet 305; however, the invention is not limited to this structure. The plurality of semiconductor films 306 may be separated from the bond substrate 300 by the holding means 321 or the collet 305 all at once or one by one and mounted on a substrate with high planarity. Then, after the plurality of semiconductor films 306 are reversed, they may be selected by the collet 305 to be bonded to the base substrate.

According to the manufacturing method of a semiconductor device of this embodiment mode, a plurality of semiconductor films (mother islands) can be bonded to a base substrate so as to be spaced apart from each other based on a layout of semiconductor films (islands) used for a semiconductor element. Therefore, the number of needed bond substrates can be minimized as compared to the case of bonding semiconductor films to the entire surface of the base substrate. Furthermore, the crystal orientation of semiconductor films can be appropriately selected in accordance with the polarity of semiconductor elements, leading to higher mobility of the semiconductor elements, whereby a semiconductor device capable of operating at a higher speed can be provided.

This embodiment mode can be implemented in combination with any of the aforementioned embodiment modes.

Embodiment 1

Figure 14A:
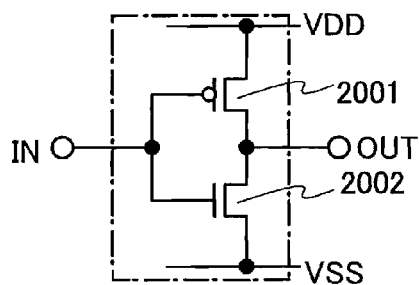
FIGS. 14A to 14D each illustrate a structure of an inverter that is formed by the manufacturing method of a semiconductor device of the invention.

In this embodiment, a specific structure of various circuits included in the semiconductor device of the invention is described using an inverter as an example. FIG. 14A is an example of a circuit diagram of an inverter and FIG. 14B is an example of a top view of the inverter illustrated in FIG. 14A.

The inverter illustrated in FIG. 14A includes a p-channel transistor 2001 and an n-channel transistor 2002. The transistor 2001 and the transistor 2002 are connected in series to each other. Specifically, a drain of the transistor 2001 and a drain of the transistor 2002 are connected to each other. The drain potential of the transistor 2001 and the drain potential of the transistor 2002 are applied to an output terminal OUT.

A gate of the transistor 2001 and a gate of the transistor 2002 are connected to each other. The potential of a signal input to an input terminal IN is applied to the gate of the transistor 2001 and the gate of the transistor 2002. A high-level voltage VDD is applied to a source of the transistor 2001, and a low-level voltage VSS is applied to a source of the transistor 2002.

Figure 14B:
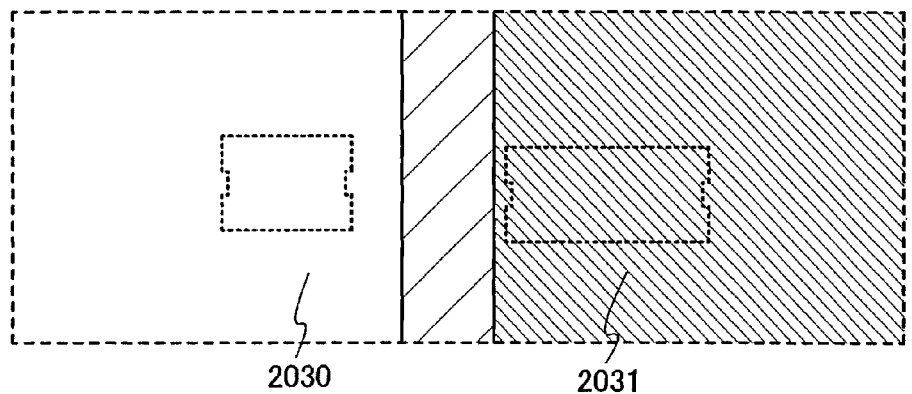
Figure 14C:
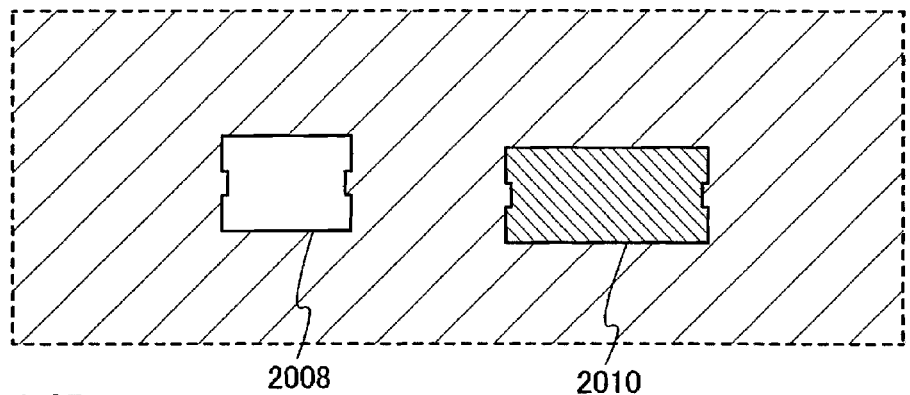

In order to form the inverter illustrated in FIG. 14A, in the manufacturing method of the invention, a semiconductor film 2030 having a crystal orientation {100} and a semiconductor film 2031 having a crystal orientation {110} are bonded to a base substrate as illustrated in FIG. 14B. Next, as illustrated in FIG. 14C, the semiconductor film 2030 is partially etched to form a semiconductor film 2008, and the semiconductor film 2031 is partially etched to form a semiconductor film 2010.

Figure 14D:
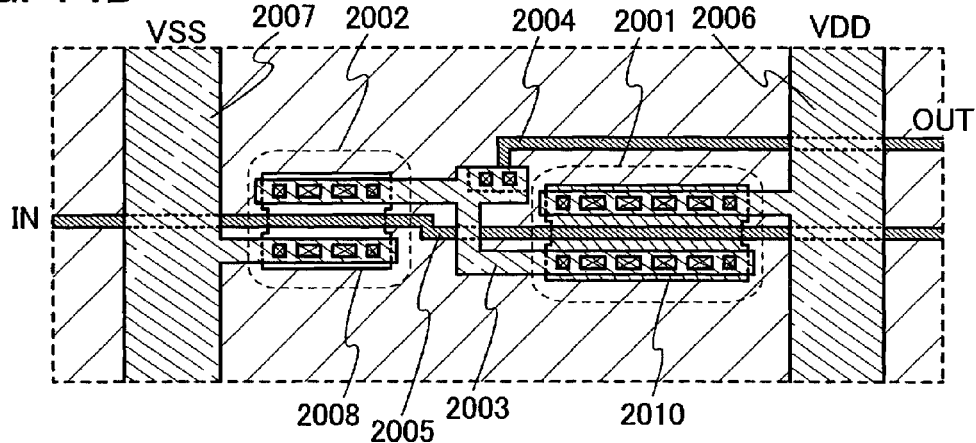

Then, as illustrated in FIG. 14D, the n-channel transistor 2002 is formed using the semiconductor film 2008, and the p-channel transistor 2001 is formed using the semiconductor film 2010. Thus, the inverter can be obtained.

Specifically, in the inverter illustrated in FIG. 14D, the drain of the transistor 2001 and the drain of the transistor 2002 are electrically connected to each other through a wiring 2003. The wiring 2003 is connected to a wiring 2004. Thus, the potentials of the drain of the transistor 2001 and the drain of the transistor 2002 are applied as the potential of the output terminal OUT to a circuit in the next stage through the wirings 2003 and 2004.

Furthermore, in the inverter illustrated in FIG. 14B, part of the wiring 2005 serves as the gate of the transistor 2001 and the gate of the transistor 2002. Thus, the potential applied to the wiring 2005 is applied as the potential of the input terminal IN to the gate of the transistor 2001 and the gate of the transistor 2002. The voltage VDD is applied to the source of the transistor 2001 through a wiring 2006, and the voltage VSS is applied to the source of the transistor 2002 through a wiring 2007.

This embodiment can be implemented in combination with any of the aforementioned embodiment modes as appropriate.

Embodiment 2

Figure 15A:
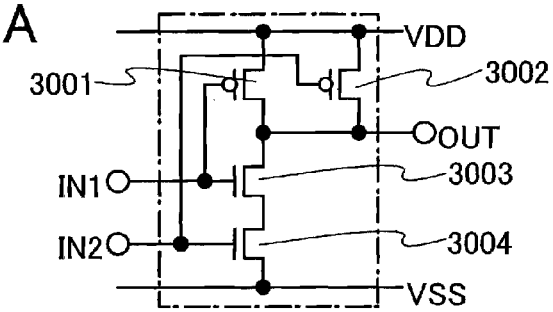
FIGS. 15A to 15D each illustrate a structure of a NAND circuit that is formed by the manufacturing method of a semiconductor device of the invention.

In this embodiment, a specific structure of various circuits included in the semiconductor device of the invention is described using a NAND circuit as an example. FIG. 15A is an example of a circuit diagram of a NAND circuit and FIG. 15D is an example of a top view of the NAND circuit illustrated in FIG. 15A.

The NAND circuit illustrated in FIG. 15A includes a p-channel transistor 3001, a p-channel transistor 3002, an n-channel transistor 3003, and an n-channel transistor 3004. The transistors 3001, 3003, and 3004 are sequentially connected in series. The transistor 3001 and the transistor 3002 are connected in parallel to each other.

Specifically, a high-level voltage VDD is applied to one of a source and a drain of the transistor 3001, and the other of the source and the drain is connected to an output terminal OUT. The high-level voltage VDD is applied to one of a source and a drain of the transistor 3002, and the other of the source and the drain is connected to the output terminal OUT. A low-level voltage VSS is applied to one of a source and a drain of the transistor 3004. One of a source and a drain of the transistor 3003 is connected to the output terminal OUT. The other of the source and the drain of the transistor 3003 is connected to the other of the source and the drain of the transistor 3004. The potential of an input terminal IN1 is applied to a gate of the transistor 3001 and a gate of the transistor 3003. A potential of an input terminal IN2 is applied to a gate of the transistor 3002 and a gate of the transistor 3004.

Figure 15B:
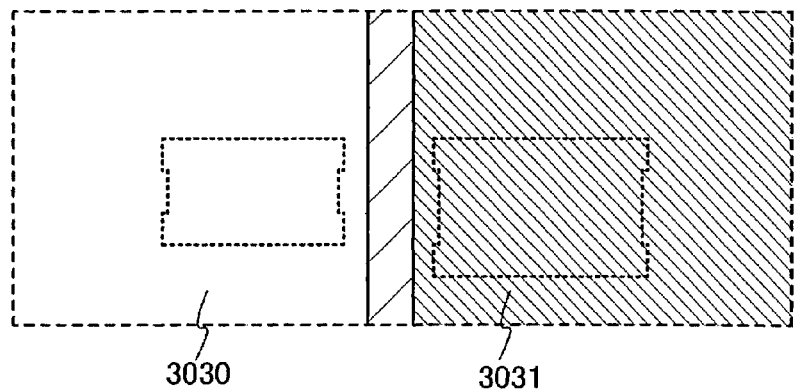
Figure 15C:
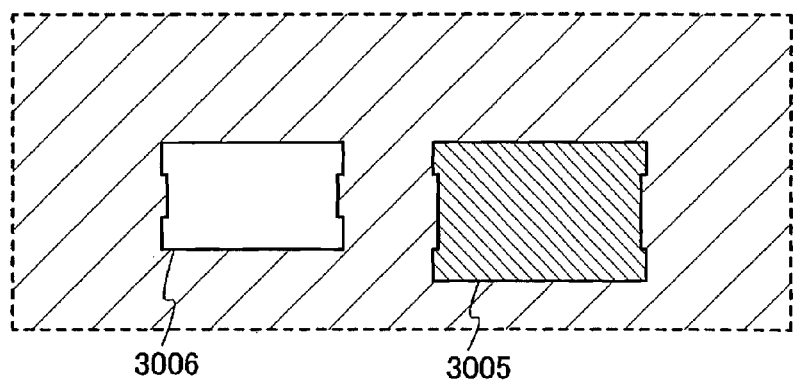
Figure 15D:
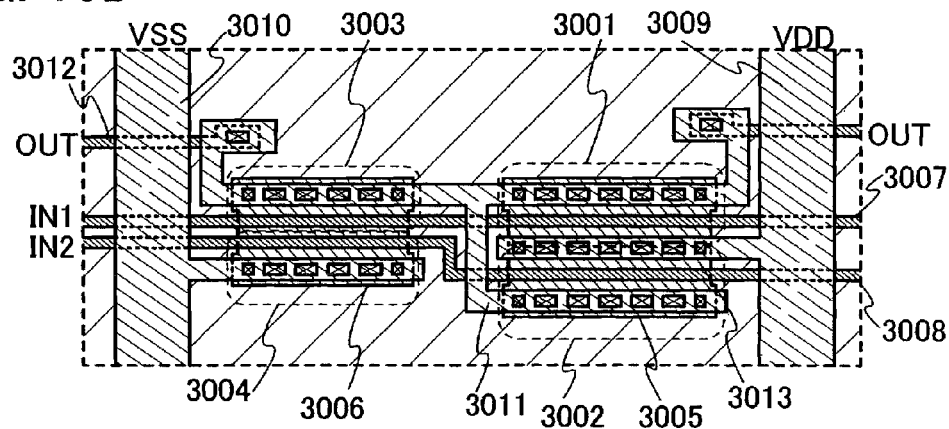

In order to form the NAND circuit illustrated in FIG. 15A, in the manufacturing method of the invention, a semiconductor film 3030 having a crystal orientation {100} and a semiconductor film 3031 having a crystal orientation {110} are bonded to a base substrate as illustrated in FIG. 15B. Next, as illustrated in FIG. 15C, the semiconductor film 3030 is partially etched to form a semiconductor film 3006, and the semiconductor film 3031 is partially etched to form a semiconductor film 3005.

Then, as illustrated in FIG. 15D, the n-channel transistor 3003 and the n-channel transistor 3004 are formed using the semiconductor film 3006, and the p-channel transistor 3001 and the p-channel transistor 3002 are formed using the semiconductor film 3005. Thus, the NAND can be obtained.

In the NAND circuit illustrated in FIG. 15D, the transistors 3001 and 3002 connected in parallel share the semiconductor film 3005, and the transistors 3003 and 3004 connected in series share the semiconductor film 3006. Part of a wiring 3007 serves as the gate of the transistor 3001 and the gate of the transistor 3003. Thus, the potential applied to the wiring 3007 is applied as the potential of the input terminal IN1 to the gate of the transistor 3001 and the gate of the transistor 3003. Part of a wiring 3008 serves as the gate of the transistor 3002 and the gate of the transistor 3004. Thus, the potential applied to the wiring 3008 is applied as the potential of the input terminal IN2 to the gate of the transistor 3002 and the gate of the transistor 3004.

The high-level voltage VDD is applied to one of the source and the drain of the transistor 3001 and one of the source and the drain of the transistor 3002 through a wiring 3009. The low-level voltage VSS is applied to one of the source and the drain of the transistor 3004 through a wiring 3010. The potentials of the other of the source and the drain of the transistor 3001, the other of the source and the drain of the transistor 3002, and one of the source and the drain of the transistor 3003 are applied as the potential of the output terminal OUT to a circuit in the next stage through wirings 3011 and 3012.

This embodiment can be implemented in combination with any of the aforementioned embodiment modes and embodiment as appropriate.

Embodiment 3

In this embodiment, an example of a manufacturing method of a transistor used in the invention is specifically described.

Figure 16A:
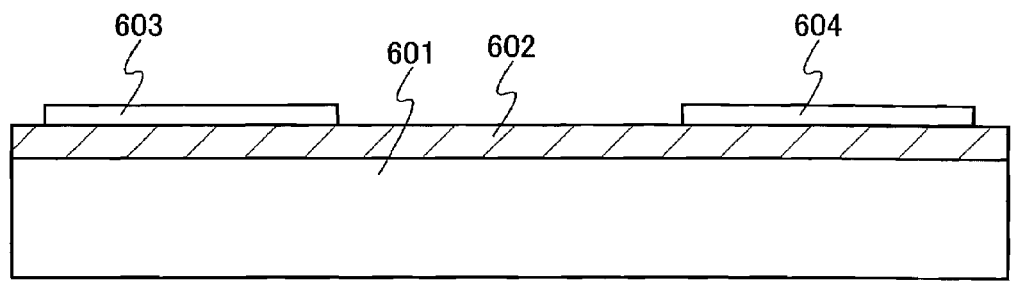
FIGS. 16A to 16D illustrate a manufacturing method of a semiconductor device of the invention.

First, as illustrated in FIG. 16A, a semiconductor film 603 having a face {100} and a semiconductor film 604 having a face {110} are formed over a base substrate 601. This embodiment shows a case where an insulating film 602 is provided between the base substrate 601 and the semiconductor films 603 and 604. The insulating film may be formed as either a single insulating film or a plurality of stacked insulating films.

An impurity may be added to the semiconductor film 603 and the semiconductor film 604 in order to control the threshold voltage. For example, in the case of adding boron as an impurity imparting p-type conductivity, boron may be added at a concentration of greater than or equal to $5\times10^{17}$ cm$^{-3}$ and less than or equal to $1\times10^{18}$ cm$^{-3}$. The impurity addition for controlling the threshold voltage may be performed before or after the semiconductor films are bonded to the base substrate 601.

Hydrogenation may be performed after the semiconductor film 603 and the semiconductor film 604 are formed and before gate insulating films 606 are formed. The hydrogenation is performed, for example, at 350° C. in a hydrogen atmosphere for approximately two hours.

Figure 16B:
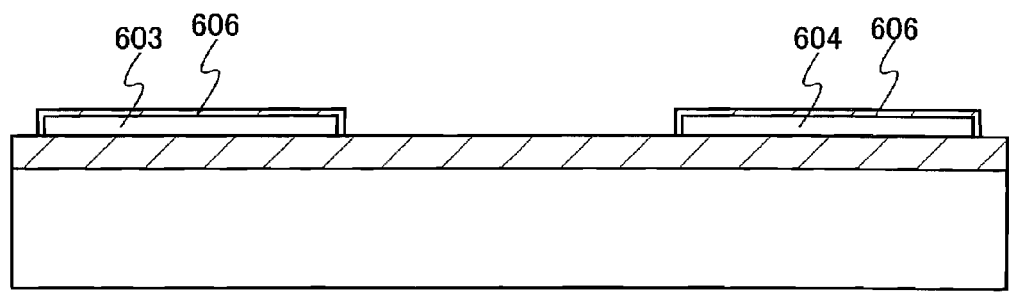

Next, as illustrated in FIG. 16B, the gate insulating films 606 are formed to cover the semiconductor film 603 and the semiconductor film 604. The gate insulating films 606 can be formed by oxidation or nitridation of surfaces of the semiconductor film 603 and the semiconductor film 604 by high-density plasma treatment. The high-density plasma treatment is performed using, for example, a mixed gas of a rare gas such as He, Ar, Kr, or Xe and oxygen, nitrogen oxide, ammonia, nitrogen, hydrogen, or the like. In that case, when plasma is excited by introduction of microwaves, plasma with a low-electron temperature and high density can be generated. The surfaces of the semiconductor films are oxidized or nitrided by oxygen radicals (OH radicals may be included) or nitrogen radicals (NH radicals may be included) that are generated by such high-density plasma, whereby insulating films each having a thickness of 1 nm to 20 nm, desirably 5 nm to 10 nm are formed so as to be in contact with the semiconductor films. The insulating films with a thickness of 5 nm to 10 nm are used as the gate insulating films 606.

Since the oxidation or nitridation of the semiconductor films by the aforementioned high-density plasma treatment is a solid-state reaction, the interface state density between the gate insulating films 606 and each of the semiconductor film 603 and the semiconductor film 604 can be significantly decreased. In addition, the semiconductor films are directly oxidized or nitrided by the high-density plasma treatment, whereby variation in the thickness of the insulating films to be formed can be suppressed. Moreover, when the semiconductor films have crystallinity, the surfaces of the semiconductor films are oxidized by a solid-state reaction using the high-density plasma treatment, whereby rapid oxidation only in crystal grain boundaries can be prevented and the gate insulating film with good uniformity and low-interface state density can be formed. When the insulating film formed by the high-density plasma treatment is used as part or the whole of a gate insulating film of a transistor, variation in the characteristics of the transistor can be suppressed.

Alternatively, the gate insulating films 606 may be formed by thermally oxidizing the semiconductor film 603 and the semiconductor film 604. The gate insulating films 606 may also be formed by a plasma CVD method, a sputtering method, or the like as a single layer or stacked layers of a film containing silicon oxide, silicon nitride oxide, silicon oxynitride, silicon nitride, hafnium oxide, aluminum oxide, or tantalum oxide.

Figure 16C:
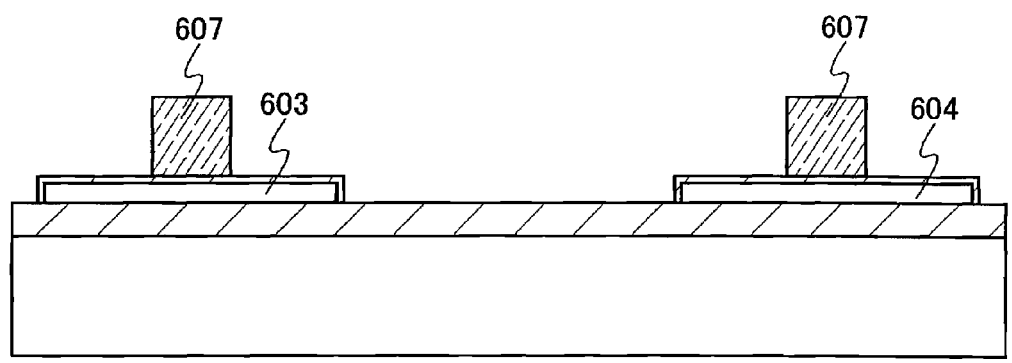

Next, as illustrated in FIG. 16C, a conductive film is formed over the gate insulating films 606, and then processed (patterned) into a predetermined shape, whereby electrodes 607 are formed over the semiconductor film 603 and the semiconductor film 604. The conductive film can be formed by a CVD method, a sputtering method, or the like. The conductive film can be made of tantalum (Ta), tungsten (W), titanium (Ti), molybdenum (Mo), aluminum (Al), copper (Cu), chromium (Cr), niobium (Nb), or the like. Alternatively, an alloy containing any of the aforementioned metals as its main component or a compound containing any of the aforementioned metals may be used. Further alternatively, the conductive film may be formed using a semiconductor such as polycrystalline silicon that is formed by doping a semiconductor film with an impurity element imparting a conductivity type, such as phosphorus.

As a combination of two conductive films, tantalum nitride or tantalum (Ta) can be used for a first layer, and tungsten (W) can be used for a second layer. Besides such an example, tungsten nitride and tungsten; molybdenum nitride and molybdenum; aluminum and tantalum; aluminum and titanium; and the like can be given. Since tungsten and tantalum nitride have high heat resistance, heat treatment for thermal activation can be performed after the first conductive film and the second conductive film are formed. As a combination of the two conductive films, for example, silicon doped with an impurity imparting n-type conductivity and nickel silicide; silicon doped with an impurity imparting n-type conductivity and $WSi_x$; or the like can be used.

Although each of the electrodes 607 is formed as a single-layer conductive film in this embodiment, this embodiment is not limited to this structure. Each of the electrodes 607 may be formed as a plurality of stacked-conductive films. In the case of a multi-layer structure in which three or more conductive films are stacked, a stacked-structure including a molybdenum film, an aluminum film, and a molybdenum film may be used.

As masks used for forming the electrodes 607, silicon oxide, silicon nitride oxide, silicon oxynitride, or the like may be used instead of a resist. In that case, the step of forming the masks using silicon oxide, silicon nitride oxide, silicon oxynitride, or the like by patterning is added. However, since film reduction of the masks at the time of etching is less than that in the case of using a resist, the electrodes 607 with desired widths can be formed. Alternatively, the electrodes 607 may be selectively formed by a droplet discharging method without using the masks.

Note that the droplet discharging method refers to a method in which droplets containing a predetermined composition are discharged or ejected from pores to form a predetermined pattern, and an ink-jet method or the like is included in the category.

The electrodes 607 with desired tapered shapes can be obtained by etching the conductive films by ICP (inductively coupled plasma) etching while appropriately controlling the etching conditions (e.g., the amount of electric power applied to a coiled-electrode layer, the amount of electric power applied to an electrode layer on the substrate side, and the electrode temperature on the substrate side). The angles and the like of the tapered shapes can also be controlled by the shape of the mask. Note that as an etching gas, a chlorine-based gas such as chlorine, boron chloride, silicon chloride, or carbon tetrachloride; a fluorine-based gas such as carbon tetrafluoride, sulfur tetrafluoride, or nitrogen fluoride; or oxygen can be used as appropriate.

Figure 16D:
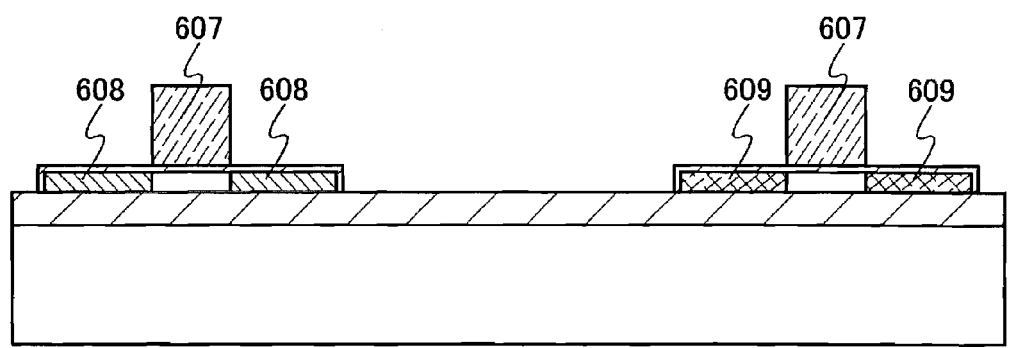

Next, as illustrated in FIG. 16D, an impurity element imparting one conductivity type is added to the semiconductor film 603 and the semiconductor film 604 with the use of the electrodes 607 as masks. In this embodiment, an impurity element imparting p-type conductivity (e.g., boron) is added to the semiconductor film 604, and an impurity element imparting n-type conductivity (e.g., phosphorus or arsenic) is added to the semiconductor film 603. Note that when the impurity element imparting p-type conductivity is added to the semiconductor film 604, the semiconductor film 603 to which the n-type impurity is added is covered with a mask or the like so that the impurity element imparting p-type conductivity is selectively added. On the other hand, when the impurity element imparting n-type conductivity is added to the semiconductor film 603, the semiconductor film 604 to which the p-type impurity is added is covered with a mask or the like so that the impurity element imparting n-type conductivity is selectively added. Alternatively, after an impurity element imparting one of the p-type conductivity and the n-type conductivity is added to the semiconductor films 603 and 604, an impurity element imparting the other conductivity may be selectively added to one of the semiconductor films 603 and 604 at a higher concentration than that in the previous step. By adding the impurity element, impurity regions 608 and impurity regions 609 are formed in the semiconductor film 603 and the semiconductor film 604, respectively.

Figure 17A:
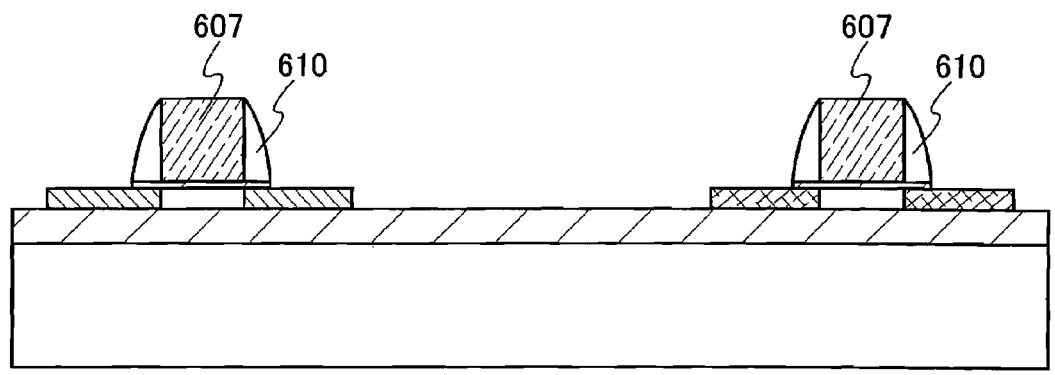
FIGS. 17A to 17C illustrate the manufacturing method of the semiconductor device of the invention.

Next, as illustrated in FIG. 17A, sidewalls 610 are formed on side surfaces of each of the electrodes 607. For example, the sidewalls 610 can be formed in such a manner that another insulating film is formed to cover the gate insulating films 606 and the electrodes 607, and the newly-formed insulating film is partially etched by anisotropic etching performed mainly in a perpendicular direction. The newly-formed insulating film is partially etched by the anisotropic etching, whereby the sidewalls 610 are formed on the side surfaces of each of the electrodes 607. Note that the gate insulating films 606 may also be partially etched by the aforementioned anisotropic etching. The insulating film for forming the sidewalls 610 may be formed by a plasma CVD method, a sputtering method, or the like as a single layer or stacked layers of a silicon film, a silicon oxide film, a silicon nitride oxide film, or a silicon oxynitride film, or a film containing an organic material such as an organic resin. In this embodiment, a silicon oxide film is formed by a plasma CVD method to have a thickness of 100 nm. As an etching gas, a mixed gas of $CHF_3$ and helium can be used. Note that the steps of forming the sidewalls 610 are not limited to these steps.

Figure 17B:
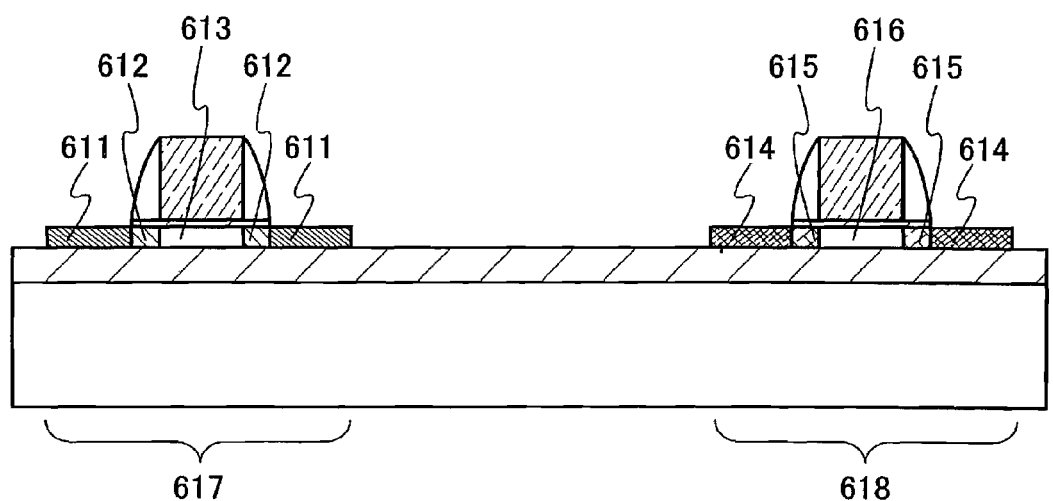

Next, as illustrated in FIG. 17B, an impurity element imparting one conductivity type is added to the semiconductor film 603 and the semiconductor film 604 with the use of the electrodes 607 and the sidewalls 610 as masks. Note that the impurity elements imparting the same conductivity type as those that have been added to the semiconductor film 603 and the semiconductor film 604 in the previous step are added to the semiconductor film 603 and the semiconductor film 604 at a higher concentration than those in the previous step. Note that when the impurity element imparting p-type conductivity is added to the semiconductor film 604, the semiconductor film 603 to which the n-type impurity is added is covered with a mask or the like so that the impurity element imparting p-type conductivity is added selectively. On the other hand, when the impurity element imparting n-type conductivity is added to the semiconductor film 603, the semiconductor film 604 to which the p-type impurity element is added is covered with a mask or the like so that the impurity element imparting n-type conductivity is added selectively.

By adding the impurity element, a pair of high-concentration impurity regions 611, a pair of low-concentration impurity regions 612, and a channel-formation region 613 are formed in the semiconductor film 603. In addition, by adding the impurity element, a pair of high-concentration impurity regions 614, a pair of low-concentration impurity regions 615, and a channel-formation region 616 are formed in the semiconductor film 604. Each of the high-concentration impurity regions 611 and 614 functions as a source or a drain, and the low-concentration impurity regions 612 and 615 function as LDD (lightly doped drain) regions.

Note that the sidewalls 610 formed over the semiconductor film 604 and the sidewalls 610 formed over the semiconductor film 603 may be formed to have the same width or different widths in the carrier flow direction. It is preferable that the width of each of the sidewalls 610 over the semiconductor film 604 that constitutes a p-type transistor be larger than that of each of the sidewalls 610 over the semiconductor film 603 that constitutes an n-type transistor. This is because boron that is added for forming a source and a drain of the p-type transistor is easily diffused and a short-channel effect is easily induced. When the width of each of the sidewalls 610 in the p-type transistor is made larger than that of each of the sidewalls 610 in the n-channel transistor, boron can be added to the source and the drain at high concentration, which results in reduction in the resistance of the source and the drain.

Next, a silicide layer may be formed by siliciding the semiconductor film 603 and the semiconductor film 604 in order to further reduce the resistance of the source and the drain. The siliciding is performed by placing a metal in contact with the semiconductor films and causing reaction between the metal and silicon in the semiconductor films by heat treatment, a GRTA method, an LRTA method, or the like. Cobalt silicide or nickel silicide may be used for the silicide layer. When the thicknesses of the semiconductor film 603 and the semiconductor film 604 are small, the silicide reaction may proceed to the bottom of the semiconductor film 603 and the semiconductor film 604 in this region. As a metal material used for the siliciding, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), and the like. Alternatively, silicide may be formed by laser irradiation or light irradiation using a lamp or the like.

Through the aforementioned series of steps, an n-channel transistor 617 and a p-channel transistor 618 are manufactured. Note that in a p-type semiconductor, holes that are majority carriers have the highest mobility on the {110} crystal orientation, whereas in an n-type semiconductor, electrons that are majority carriers have the highest mobility on the {100} crystal orientation. In the invention, the crystal orientation of a semiconductor film can be appropriately selected in accordance with the polarity of a semiconductor element; leading to higher mobility of the semiconductor element, whereby a semiconductor device capable of operating at a higher speed can be provided.

Figure 17C:
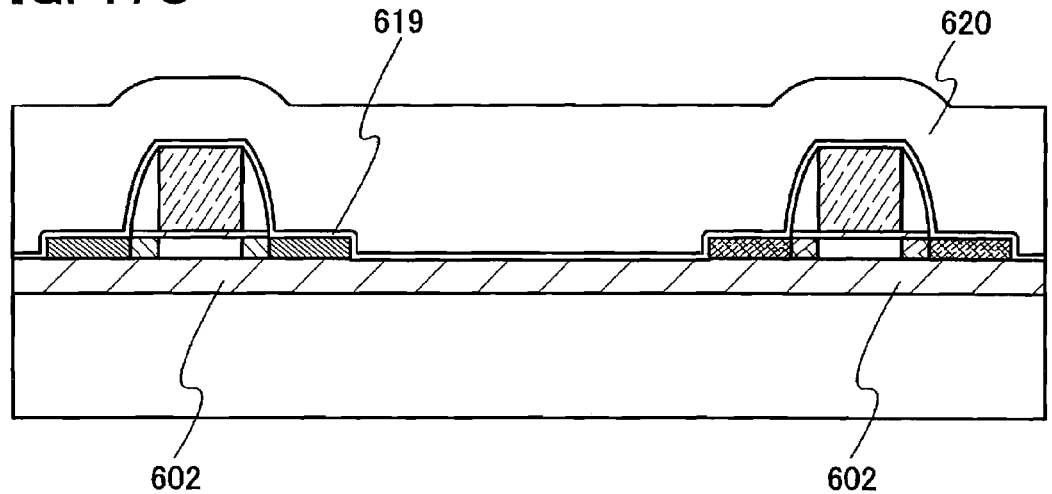

Next, as illustrated in FIG. 17C, an insulating film 619 is formed to cover the transistors 617 and 618. Although the insulating film 619 is not necessarily provided, the insulating film 619 prevents impurities such as an alkali metal or an alkaline earth metal from entering the transistors 617 and 618. Specifically, it is desirable to use silicon nitride, silicon nitride oxide, aluminum nitride, aluminum oxide, silicon oxynitride, silicon oxide, or the like for the insulating film 619. In this embodiment, a silicon nitride oxide film with a thickness of approximately 600 nm is used as the insulating film 619. In that case, the aforementioned hydrogenation step may be performed after forming the silicon nitride oxide film.

Subsequently, an insulating film 620 is formed over the insulating film 619 to cover the transistors 617 and 618. The insulating film 620 can be formed using a heat-resistant organic material such as polyimide, acrylic, benzocyclobutene, polyamide, or epoxy. As an alternative to these organic materials, a material with a low-dielectric constant (a low-k material), a siloxane-based resin, silicon oxide, silicon nitride, silicon nitride oxide, silicon oxynitride, PSG (phosphosilicate glass), BPSG (borophosphosilicate glass), alumina, or the like can be used. A siloxane-based resin may have, as its substituent, at least one of fluorine, an alkyl group, and an aromatic hydrocarbon in addition to hydrogen. Alternatively, the insulating film 620 may be formed by stacking plural insulating films made of these materials. The insulating film 620 may have its surface planarized by a CMP method, or the like.

In a case where the semiconductor film 603 and the semiconductor film 604 are bonded to the base substrate 601 by the method described in Embodiment Mode 3, the insulating films that are separated from each other exist between the base substrate 601 and each of the semiconductor film 603 and the semiconductor film 604. However, when the insulating film 620 is formed by a coating method with the use of, for example, the aforementioned polyimide, siloxane-based resin, or the like, it is possible to prevent the surface of the insulating film 620 from becoming uneven even if there is a difference in level between the insulating films that are separated from each other. Therefore, part of conductive films 621 and conductive films 622 that are later formed over the insulating film 620 can be prevented from being drastically thinned or, in the worst case, being disconnected due to the uneven surface of the insulating film 620. Accordingly, the formation of the insulating film 620 by a coating method can eventually increase the yield and reliability of the semiconductor device formed by applying the invention.

The siloxane-based resin corresponds to a resin including a Si—O—Si bond formed using a siloxane-based material as a starting material. The siloxane-based resin may have, as its substituent, at least one of fluorine, an alkyl group, and an aromatic hydrocarbon in addition to hydrogen.

The insulating film 620 can be formed by a CVD method, a sputtering method, an SOG method, spin coating, dipping, spray coating, a droplet discharging method (an inkjet method, screen printing, offset printing, or the like), a doctor knife, a roll coater, a curtain coater, a knife coater, or the like depending on the material.

Figure 18:
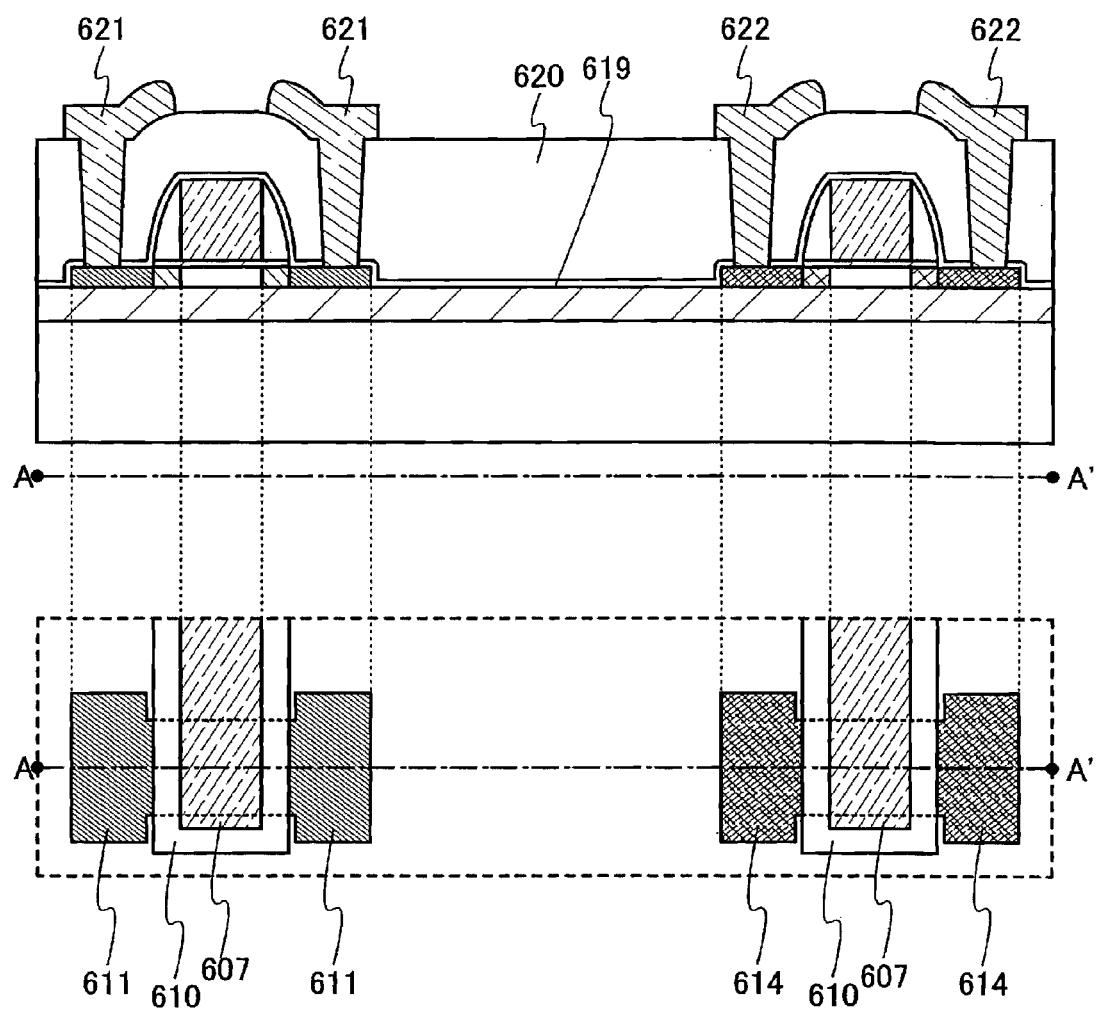
FIG. 18 illustrates the manufacturing method of the semiconductor device of the invention.

Subsequently, as illustrated in FIG. 18, contact holes are formed in the insulating film 619 and the insulating film 620 so as to partially expose the semiconductor film 603 and the semiconductor film 604. Then, the conductive films 621 and the conductive films 622 are formed to be in contact with the semiconductor film 603 and the semiconductor film 604, respectively through the contact holes. The contact holes are formed by etching with the use of a mixed gas of $CHF_3$ and He; however, the invention is not limited to this etching gas.

The conductive films 621 and the conductive films 622 can be formed by a CVD method, a sputtering method, or the like. Specifically, the conductive films 621 and the conductive films 622 can be made of aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing any of the aforementioned metals as its main component or a compound containing any of the aforementioned metals may be used. The conductive films 621 and the conductive films 622 can be formed as a single layer or a plurality of stacked layers of a film containing any of the aforementioned metals.

As an example of an alloy containing aluminum as its main component, an alloy containing aluminum as its main component and also containing nickel is given. Moreover, an alloy containing aluminum as its main component and also containing nickel and one or both of carbon and silicon can be given as another example. Since aluminum and aluminum silicon have low resistance and are inexpensive, they are suitable for forming the conductive films 621 and the conductive films 622. In particular, when the conductive films 621 and the conductive films 622 are formed by patterning, generation of hillocks in resist baking can be prevented more effectively by using an aluminum silicon (Al—Si) film than by using an aluminum film. The aluminum film may contain about 0.5 wt. % of copper instead of silicon.

Each of the conductive films 621 and the conductive films 622 preferably employs a stacked-layer structure of a barrier film, an aluminum silicon (Al—Si) film, and a barrier film, or a stacked-layer structure of a barrier film, an aluminum silicon (Al—Si) film, a titanium nitride film, and a barrier film. The barrier film refers to a film formed using titanium, a nitride of titanium, molybdenum, or a nitride of molybdenum. When the barrier films are formed so that the aluminum silicon (Al—Si) film is interposed therebetween, the generation of hillocks of aluminum or aluminum silicon can be prevented much more effectively. Even if a thin oxide film is formed over the semiconductor film 603 and the semiconductor film 604, when the barrier film is formed using titanium that is a highly-reducible element, the oxide film is reduced by titanium contained in the barrier films. As a result, the conductive films 621 and the conductive films 622 can have favorable contact with the semiconductor film 603 and the semiconductor film 604, respectively. Furthermore, it is also possible to stack a plurality of barrier films. In that case, for example, each of the conductive films 621 and the conductive films 622 can be formed to have a five-layer structure of titanium, titanium nitride, aluminum silicon, titanium, and titanium nitride in order from the bottom.

Note that the conductive films 621 are connected to the high-concentration impurity regions 611 of the n-channel transistor 617. The conductive films 622 are connected to the high-concentration impurity regions 614 of the p-channel transistor 618.

Lower part of FIG. 18 illustrates a top view of the n-channel transistor 617 and the p-channel transistor 618; however, the conductive films 621, the conductive films 622, the insulating film 619, and the insulating film 620 are omitted in the top view of FIG. 18.

Although this embodiment shows the case where each of the n-channel transistor 617 and the p-channel transistor 618 has one electrode 607 serving as a gate, the invention is not limited to this structure. The transistors manufactured by the invention may each have a multi-gate structure including a plurality of electrodes that function as gates and that are electrically connected to each other.

The transistors in the semiconductor device manufactured by the invention may each have a gate-planar structure.

A semiconductor film included in an SOI substrate has a substantially single-crystal structure and thus has less variation in orientation as compared to a polycrystalline semiconductor film; therefore, variation in the threshold voltage of a transistor can be reduced. In addition, the semiconductor film has few crystal grain boundaries unlike the polycrystalline semiconductor film, which results in suppression of leakage current due to crystal grain boundaries and power saving of a semiconductor device. Furthermore, when a plurality of bond substrates are used, for example, a semiconductor film having a crystal orientation {100} and a semiconductor film having a crystal orientation {110} can be formed over the same base substrate. When a polycrystalline semiconductor film is obtained by laser crystallization, a ridge is easily formed on a surface of the polycrystalline semiconductor film due to distribution of energy density in a beam spot. However, the semiconductor film included in an SOI substrate is not required to be irradiated with laser light, or is required to be irradiated at a low-energy density so as to recover defects in the semiconductor film caused by bonding. Accordingly, the surface of the semiconductor film included in an SOI substrate has much higher planarity than that of the polycrystalline semiconductor film obtained by laser crystallization, whereby the thickness of a gate insulating film formed over the semiconductor film included in an SOI substrate can be reduced to about 5 nm to 50 nm. As a result, a high on-current can be obtained while suppressing a gate voltage. Furthermore, when a polycrystalline semiconductor film obtained by laser crystallization is used for a transistor, it is necessary to determine the layout of the semiconductor film along the scanning direction of the laser light in order to achieve high mobility. However, there is not such a need for a semiconductor film included in an SOI substrate and thus there are few restrictions in the design of a semiconductor device.

This embodiment can be implemented in combination with any of the aforementioned embodiment modes as appropriate.

Embodiment 4

Figure 19A:
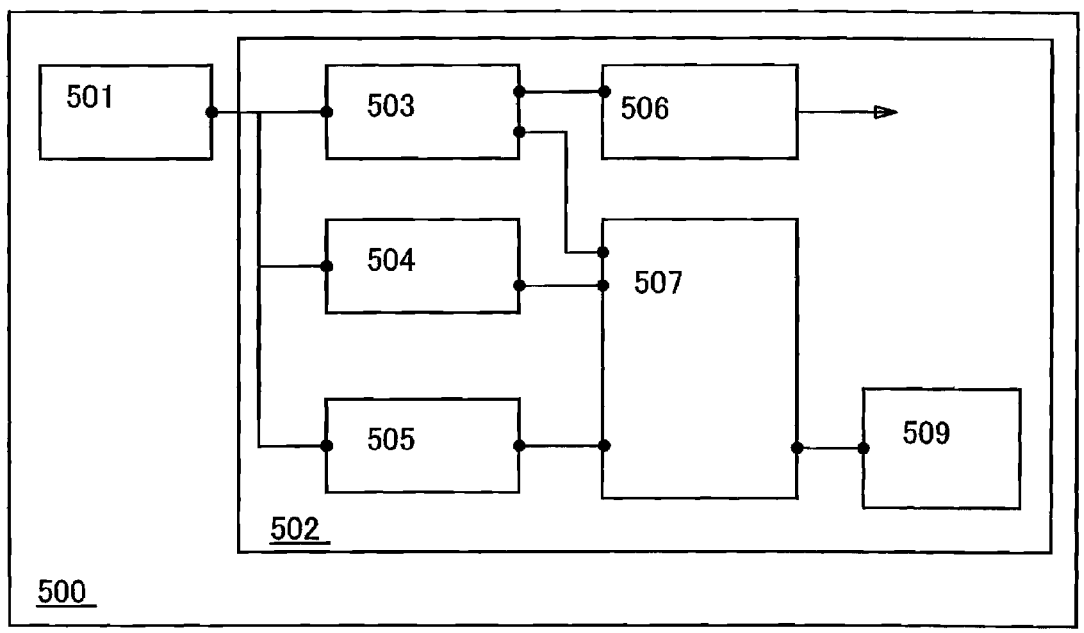
FIGS. 19A and 19B each illustrate a structure of a semiconductor device that is formed by the manufacturing method of the invention.

In this embodiment, a structure of an RF tag that is one of the semiconductor devices of the invention is described. FIG. 19A is a block diagram illustrating one mode of the RF tag of the invention. In FIG. 19A, an RF tag 500 has an antenna 501 and an integrated circuit 502. The integrated circuit 502 has a power supply circuit 503, a demodulation circuit 504, a modulation circuit 505, a regulator 506, a control circuit 507, and a memory 509.

When radio waves are transmitted from an interrogator, the radio waves are converted into an AC voltage in the antenna 501. In the power supply circuit 503, the AC voltage from the antenna 501 is rectified to generate a voltage for a power supply. The voltage for a power supply, which is generated in the power supply circuit 503, is supplied to the control circuit 507 and the regulator 506. After stabilizing the voltage for a power supply from the power supply circuit 503 or after adjusting the level thereof, the regulator 506 supplies the voltage to various circuits in the integrated circuit 502, such as the demodulation circuit 504, the modulation circuit 505, the control circuit 507, and the memory 509.

The demodulation circuit 504 demodulates the AC signal received by the antenna 501 and outputs the signal to the control circuit 507 of the next stage. The control circuit 507 performs arithmetic processing in accordance with the signal input from the demodulation circuit 504 and generates another signal. When the arithmetic processing is performed, the memory 509 can be used as a primary cache memory or a secondary cache memory. Furthermore, the control circuit 507 analyses the signal input from the demodulation circuit 504, and outputs data in the memory 509 or stores the content of an instruction in the memory 509 in accordance with the content of an instruction transmitted from the interrogator. The signal output from the control circuit 507 is encoded and transmitted to the modulation circuit 505. The modulation circuit 505 modulates the radio waves received by the antenna 501 in accordance with the signal. The radio waves modulated in the antenna 501 are received by the interrogator. Then, data output from the RF tag 500 can be obtained.

Thus, communication between the RF tag 500 and the interrogator can be performed by modulating radio waves used as a carrier (carrier wave). The frequency of the carrier wave is 125 kHz, 13.56 MHz, 950 MHz, or the like, which varies depending on the standard. A modulation method includes various methods such as amplitude modulation, frequency modulation, and phase modulation, depending on the standard and any modulation method may be employed as long as it is based on the standard.

A signal transmission method can be categorized into various methods such as an electromagnetic coupling method, an electromagnetic induction method, and a microwave method, depending on the wavelength of a carrier.

The memory 509 may be either a nonvolatile memory or a volatile memory. As the memory 509, an SRAM, a DRAM, a flash memory, an EEPROM, an FeRAM or the like can be used, for example.

In this embodiment, a structure of the RF tag 500 including the antenna 501 is described; however, the RF tag of the invention does not necessarily include an antenna. In addition, the RF tag illustrated in FIG. 19A may be provided with an oscillation circuit or a secondary battery.

FIG. 19A illustrates a structure of the RF tag including only one antenna; however, the invention is not limited to this structure. The RF tag may have two antennas, that is, an antenna for receiving power and an antenna for receiving a signal. If the RF tag includes one antenna, in the case where both supply of power and transmission of a signal are performed with radio waves of 950 MHz for example, a large amount of power might be transmitted to a distance to impede the reception of other wireless devices. Therefore, it is desirable that power be supplied over a short distance using radio waves with reduced frequency; however, a communication distance is inevitably shortened in this case. On the other hand, if the RF tag includes two antennas, the frequency of radio waves for supplying power and the frequency of radio waves for transmitting a signal can be separately used. For example, in the case of transmitting power, an electromagnetic induction method using radio waves with a frequency of 13.56 MHz can be used, and in the case of transmitting a signal, a radio frequency method using radio waves with a frequency of 950 MHz can be used. By thus separately using antennas depending on functions, power can be supplied for communication only over a short distance and a signal can be transmitted even over a long distance.

In the RF tag that is one of the semiconductor devices of the invention, the integrated circuit 502 is formed using a single-crystal semiconductor film that is bonded to a substrate having an insulating surface or an insulating substrate, whereby not only an increase in processing speed but also reduction in power consumption can be achieved. Furthermore, the number of bond substrates to be used can be minimized, leading to cost reduction and reduction in price per RF tag.

This embodiment can be implemented in combination with any of the aforementioned embodiment modes or embodiments as appropriate.

Next, a structure of a CPU (Central Processing Unit) that is one of the semiconductor devices of the invention is described.

Figure 19B:
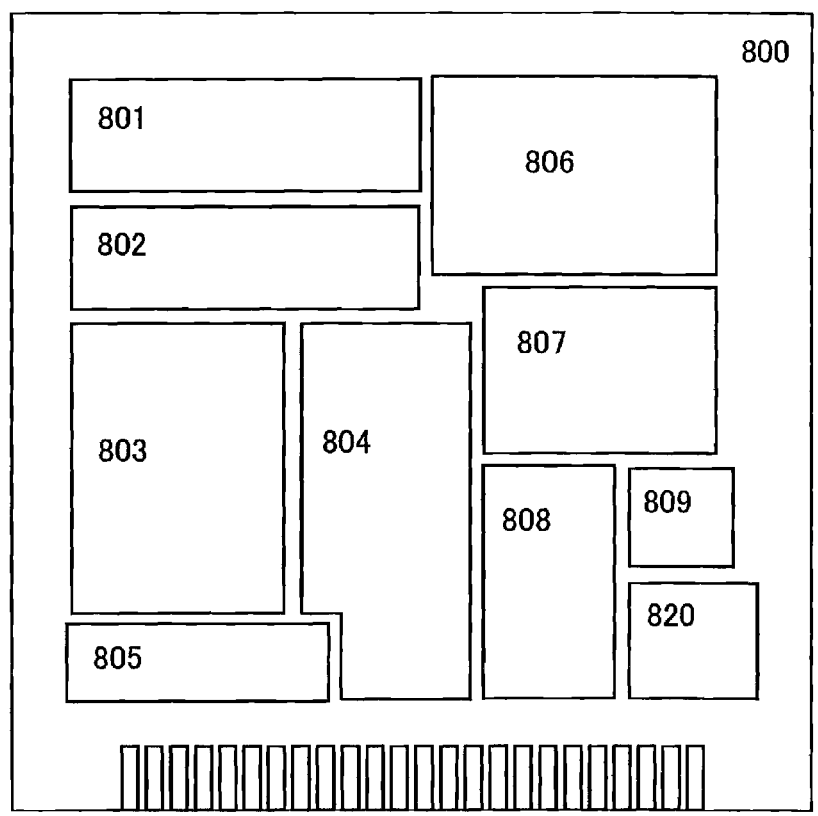

FIG. 19B is a block diagram illustrating a structure of the CPU of this embodiment. The CPU illustrated in FIG. 19B mainly includes over a substrate 800 an arithmetic logic unit (ALU) 801, an ALU controller 802, an instruction decoder 803, an interrupt controller 804, a timing controller 805, a register 806, a register controller 807, a bus interface (Bus I/F) 808, a memory 809, and a memory interface 820. The memory 809 and the memory interface 820 may be provided over another chip. Naturally, the CPU illustrated in FIG. 19B is only an example with a simplified configuration, and an actual CPU may have various configurations depending on the application.

An instruction input to the CPU through the bus interface 808 is decoded in the instruction decoder 803, and then input to the ALU controller 802, the interrupt controller 804, the register controller 807, and the timing controller 805. The ALU controller 802, the interrupt controller 804, the register controller 807, and the timing controller 805 conduct various controls based on the decoded instruction. Specifically, the ALU controller 802 generates a signal for controlling the operation of the ALU 801. While the CPU is executing a program, the interrupt controller 804 judges an interrupt request from an external input/output device or a peripheral circuit based on its priority or a mask state, and processes the request. The register controller 807 generates an address of the register 806, and reads/writes data from/to the register 806 in accordance with the state of the CPU.

The timing controller 805 generates a signal for controlling timing of operation of the ALU 801, the ALU controller 802, the instruction decoder 803, the interrupt controller 804, and the register controller 807. For example, the timing controller 805 is provided with an internal clock generator for generating an internal clock signal based on a reference clock signal, and supplies an internal clock signal to the aforementioned various circuits.

In the CPU that is one of the semiconductor devices of the invention, the integrated circuit is formed using a single-crystal semiconductor film that is bonded to a substrate having an insulating surface or an insulating substrate, whereby not only an increase in processing speed but also reduction in power consumption can be achieved. Furthermore, the number of bond substrates to be used can be minimized, leading to cost reduction and reduction in price per CPU.

This embodiment can be implemented in combination with any of the aforementioned embodiment modes or embodiments as appropriate.

Embodiment 5

In this embodiment, a structure of an active matrix semiconductor display device is described, which is one kind of the semiconductor devices manufactured by the invention.

An active matrix light-emitting device includes pixels each provided with a light-emitting element corresponding to a display element. Since a light-emitting element emits light by itself, it is advantageous in that the visibility is high, a backlight necessary for a liquid crystal display device is not required, which is suitable for thinning, and moreover the viewing angle is not restricted. Although a light-emitting device using an organic light-emitting diode (OLED) as one of light-emitting elements is described in this embodiment, the semiconductor display device manufactured by the invention may be a light-emitting device using any other light-emitting element.

An OLED includes an anode layer, a cathode layer, and a layer (hereinafter referred to as an electroluminescent layer) containing a material from which luminescence (electroluminescence) is obtained by applying an electric field. As electroluminescence, there are luminescence (fluorescence) at the time of returning from a singlet-excited state to a ground state and luminescence (phosphorescence) at the time of returning from a triplet-excited state to a ground state. A light-emitting device of the invention may use one or both of fluorescence and phosphorescence.

FIG. 20A is a cross-sectional view of a light-emitting device of this embodiment. In the light-emitting device illustrated in FIG. 20A, a transistor 1601 and a transistor 1602 that are used for a driver circuit, and a driving transistor 1604 and a switching transistor 1603 that are used for a pixel, are formed over an element substrate 1600. The light-emitting device illustrated in FIG. 20A also includes a light-emitting element 1605 in a pixel over the element substrate 1600.

The light-emitting element 1605 includes a pixel electrode 1606, an electroluminescent layer 1607, and a counter electrode 1608. One of the pixel electrode 1606 and the counter electrode 1608 is an anode, and the other is a cathode.

The anode can be formed of a light-transmitting conductive oxide such as indium tin oxide containing silicon oxide (ITSO), indium tin oxide (ITO), zinc oxide (ZnO), indium zinc oxide (IZO), or gallium-doped zinc oxide (GZO). As an alternative to the light-transmitting conductive oxide, the anode can be formed, for example, as a single-layer film including one or more of titanium nitride, zirconium nitride, Ti, W, Ni, Pt, Cr, Ag, Al, and the like, as a stack of a titanium nitride film and a film containing aluminum as its main component, as a three-layer film of a titanium nitride film, a film containing aluminum as its main component, and a titanium nitride film, or the like. When the anode is formed of a material other than the light-transmitting conductive oxide and light is extracted from the anode side, the anode is formed to have a thickness such that light transmits therethrough (preferably about 5 nm to 30 nm).

The anode can also be formed of a conductive composition including a conductive macromolecule (also referred to as a conductive polymer). The conductive composition preferably has a sheet resistance of 10000 Ω/square or less and a light transmittance of 70% or more at a wavelength of 550 nm when the conductive composition is formed into a conductive film serving as an anode. Moreover, the conductive macromolecule included in the conductive composition preferably has a resistivity of 0.1Ω·cm or less.

The conductive macromolecule may be a so-called π-electron conjugated conductive macromolecule. For example, polyaniline and/or a derivative thereof, polypyrrole and/or a derivative thereof, polythiophene and/or a derivative thereof, and a copolymer of plural kinds of those materials can be given as the π-electron conjugated conductive macromolecule.

As specific examples of the conjugated conductive macromolecule, the following can be given: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

The aforementioned conductive macromolecule may be used alone as the conducive composition for the anode. Alternatively, in order to adjust the film characteristics such as the uniformity of the film thickness of the conductive composition and the film strength thereof, an organic resin may be added to the aforementioned conductive macromolecule.

As for the organic resin, a thermosetting resin, a thermoplastic resin, or a photocurable resin may be used as long as the resin is compatible to a conductive macromolecule or the resin can be mixed and dispersed into a conductive macromolecule. For example, the following can be used: a polyester-based resin such as polyethylene terephthalate, polybutylene terephthalate, or polyethylene naphthalate; a polyimide-based resin such as polyimide or polyamide imide; a polyamide resin such as polyamide 6, polyamide 6, 6, polyamide 12, or polyamide 11; a fluorine resin such as poly (vinylidene fluoride), polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin, and a copolymer of any of these resins.

Furthermore, in order to adjust the electrical conductivity of the conductive composition, the conductive composition may be doped with an acceptor dopant or a donor dopant to change the oxidation-reduction potential of a conjugated electron in the conjugated conductive macromolecule.

As the acceptor dopant, a halogen compound, Lewis acid, proton acid, an organic cyano compound, an organometallic compound, or the like can be used. As examples of the halogen compound, chlorine, bromine, iodine, iodine chloride, iodine bromide, iodine fluoride, and the like can be given. As examples of the Lewis acid, phosphorus pentafluoride, arsenic pentafluoride, antimony pentafluoride, boron trifluoride, boron trichloride, boron tribromide, and the like can be given. As examples of the proton acid, inorganic acid such as hydrochloric acid, sulfuric acid, nitric acid, phosphoric acid, fluoroboric acid, hydrofluoric acid, and perchloric acid can be given as well as organic acid such as organic carboxylic acid and organic sulfonic acid. As the organic carboxylic acid and the organic sulfonic acid, a carboxylic acid compound and a sulfonic acid compound can be used, respectively. As the organic cyano compound, the following compound having two or more cyano groups in a conjugated bonding can be used: tetracyanoethylene, tetracyanoethylene oxide, tetracyanobenzene, tetracyanoquinodimethane, tetracyanoazanaphthalene, and the like.

As the donor dopant, an alkali metal, an alkaline-earth metal, a tertiary amine compound, and the like can be given.

A conductive composition may be dissolved in water or an organic solvent (e.g., an alcohol-based solvent, a ketone-based solvent, an ester-based solvent, a hydrocarbon-based solvent, or an aromatic-based solvent), whereby a thin film that serves as the anode can be formed by a wet process.

There is no particular limitation on the solvent in which the conductive composition is dissolved as long as the aforementioned conductive macromolecule and the macromolecular resin compound such as an organic resin are dissolved. For example, the conductive composition may be dissolved in a single solvent or a mixed solvent of the following: water, methanol, ethanol, propylene carbonate, N-methylpyrrolidone, dimethylformamide, dimethylacetamide, cyclohexanone, acetone, methyletylketone, methylisobutylketone, toluene, and the like.

After being dissolved in the solvent as described above, the conductive composition can be deposited by a wet process such as a coating method, a droplet discharging method (also referred to as an inkjet method), or a printing method. The solvent may be dried by heat treatment or may be dried under reduced pressure. When the organic resin is a thermosetting resin, further heat treatment may be performed. When the organic resin is a photocurable resin, light irradiation treatment may be performed.

The cathode can be generally formed by using a metal, an alloy, an electrically conductive compound, or a mixture thereof, each of which has a low work function. Specifically, it is possible to use a rare-earth metal such as Yb or Er as well as an alkali metal such as Li or Cs, an alkaline-earth metal such as Mg, Ca, or Sr, or an alloy containing these (Mg:Ag, Al:Li, or the like). When a layer containing a material having a high electron-injecting property is formed in contact with the cathode, a typical conductive film of aluminum, a light-transmitting conductive oxide, or the like can be used.

The electroluminescent layer 1607 may be formed as a single layer or a plurality of stacked layers, each layer of which may contain an inorganic material as well as the organic material. The luminescence of the electroluminescent layer 1607 includes luminescence (fluorescence) at the time of returning from a singlet-excited state to a ground state and luminescence (phosphorescence) at the time of returning from a triplet-excited state to a ground state. When the electroluminescent layer 1607 is formed to have a plurality of layers and the pixel electrode 1606 is the cathode, the electroluminescent layer 1607 is formed by stacking an electron-injecting layer, an electron-transporting layer, a light-emitting layer, a hole-transporting layer, and a hole-injecting layer in this order over the pixel electrode 1606. When the pixel electrode 1606 corresponds to the anode, the electroluminescent layer 1607 is formed by stacking a hole-injecting layer, a hole-transporting layer, a light-emitting layer, an electron-transporting layer, and an electron-injecting layer in this order.

The electroluminescent layer 1607 can be formed by a droplet discharging method using any of a macromolecular organic compound, an intermolecular organic compound (that does not have a subliming property but has a molecular chain length of 10 µm or less), a low molecular organic compound, and an inorganic compound. In the case of using an intermolecular organic compound, a low molecular organic compound, or an inorganic compound, the electroluminescent layer 1607 may be formed by a vapor deposition method.

The switching transistor 1603 and the driving transistor 1604 may each have a multigate structure such as a double gate structure or a triple gate structure instead of a single gate structure.

FIG. 20B is a cross-sectional view of a liquid crystal display device of this embodiment. In the liquid crystal display device illustrated in FIG. 20B, a transistor 1611 and a transistor 1612 that are used for a driver circuit, and a transistor 1613 that is used as a switching element in a pixel are formed over an element substrate 1610. The liquid crystal display device illustrated in FIG. 20B further includes a liquid crystal cell 1615 between the element substrate 1610 and a counter substrate 1614.

The liquid crystal cell 1615 includes a pixel electrode 1616 formed over the element substrate 1610, a counter electrode 1617 formed on the counter substrate 1614, and a liquid crystal 1618 provided between the pixel electrode 1616 and the counter electrode 1617. The pixel electrode 1616 can be formed of, for example, indium tin oxide containing silicon oxide (ITSO), indium tin oxide (ITO), zinc oxide (ZnO), indium zinc oxide (IZO), or gallium-doped zinc oxide (GZO).

This embodiment can be implemented in combination with any of the aforementioned embodiment modes and embodiments as appropriate.

Embodiment 6

Figure 21:
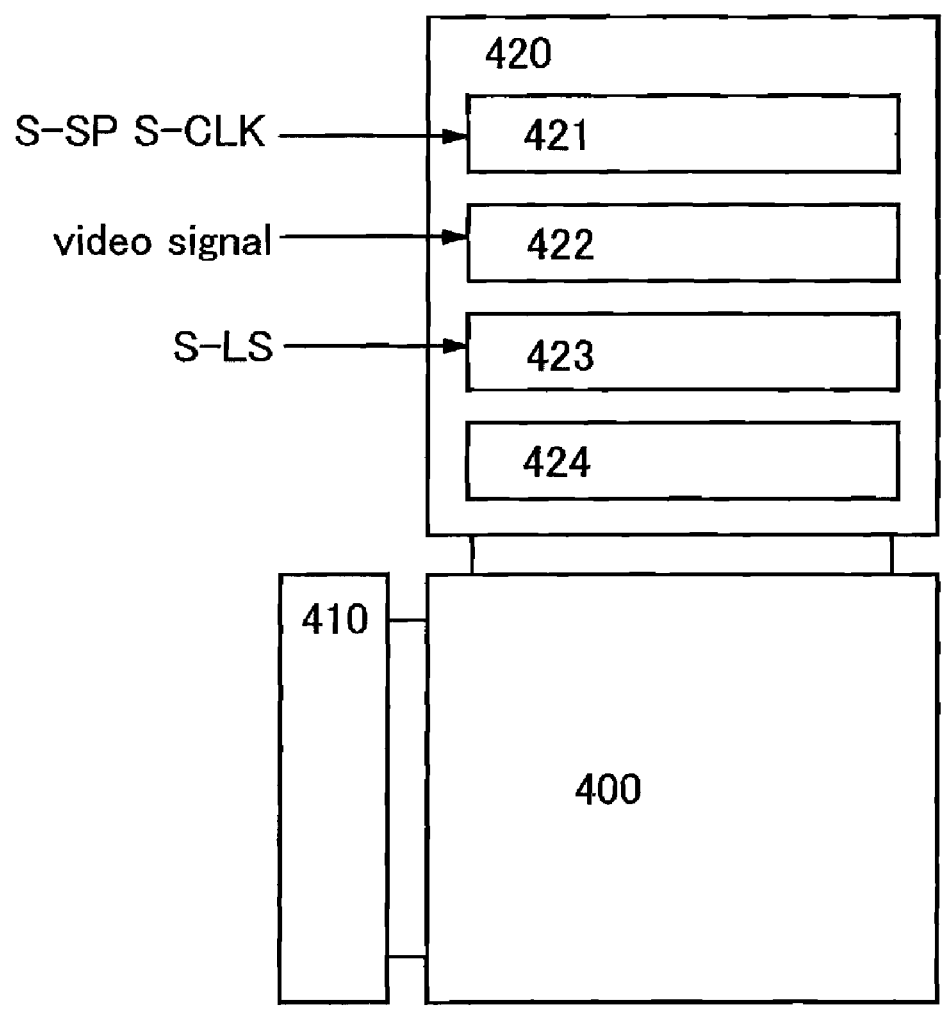
FIG. 21 illustrates a structure of a semiconductor device that is formed by the manufacturing method of the invention.

In this embodiment, an overall structure of a semiconductor display device manufactured by the invention is described. FIG. 21 is a block diagram illustrating an example of a semiconductor display device manufactured by the invention.

The semiconductor display device illustrated in FIG. 21 includes a pixel portion 400 having a plurality of pixels, a scanning line driver circuit 410 that selects pixels for each line, and a signal line driver circuit 420 that controls the input of a video signal to the pixels of a selected line.

The signal line driver circuit 420 of FIG. 21 includes a shift register 421, a first latch 422, a second latch 423, and a DJA (digital to analog) converter circuit 424. A clock signal S-CLK and a start pulse signal S-SP are input to the shift register 421. In accordance with the clock signal S-CLK and the start pulse signal S-SP, the shift register 421 generates a timing signal of which pulse is sequentially shifted, and outputs the timing signal to the first latch 422. The order of pulses of the timing signal may be switched in accordance with a scanning direction switching signal.

Upon the input of the timing signal to the first latch 422, video signals are sequentially written to the first latch 422 to be held in accordance with pulses of the timing signal. The video signals may be sequentially written to a plurality of memory circuits in the first latch 422; alternatively, so-called division driving may be performed, in which the memory circuits in the first latch 422 are divided into some groups and the video signals are input to each group in parallel. Note that the number of groups at this time is called a division number. For example, in a case where memory circuits in a latch are divided into four groups, division driving can be performed with four divisions.

The time until video signal writing to all of the memory circuits in the first latch 422 is completed is called a line period. In practice, the line period may include a horizontal retrace line period.

When one line period is completed, the video signals held in the first latch 422 are written to the second latch 423 all at once to be held in accordance with a pulse of a latch signal S-LS that is input to the second latch 423. The next video signals are sequentially written to the first latch 422 that has finished sending the video signals to the second latch 423, in accordance with timing signals from the shift register 421 again. During this second round of the one line period, the video signals written to and held in the second latch 423 are input to the D/A converter circuit 424.

The D/A converter circuit 424 converts the input digital video signals into analog video signals, which are then input to each pixel in the pixel portion 400 through signal lines.

Note that in the signal line driver circuit 420, another circuit that can output signals, pulses of which are sequentially shifted, may be used instead of the shift register 421.

Although the pixel portion 400 is directly connected to the next stage of the D/A converter circuit 424 in FIG. 21, the invention is not limited to this structure. A circuit that processes the video signal output from the D/A converter circuit 424 can be provided in the previous stage of the pixel portion 400. Examples of the circuit for processing signals include a buffer that can shape a waveform, and the like.

Next, an operation of the scanning line driver circuit 410 is explained. In the semiconductor display device manufactured by the invention, each pixel in the pixel portion 400 is provided with a plurality of scanning lines. The scanning line driver circuit 410 generates a selection signal and inputs the selection signal to each of the scanning lines, thereby selecting pixels for each line. When the pixels are selected by the selection signal, transistors of which gates are connected to one scanning line are turned on; thus, the video signals are input to the pixels.

Since the distance between the semiconductor films can be shortened in the invention, all of the pixel portion 400, the scanning line driver circuit 410, and the signal line driver circuit 420 can be formed over the same base substrate.

This embodiment can be implemented in combination with any of the aforementioned embodiment modes and embodiments as appropriate.

Embodiment 7

Figure 22A:
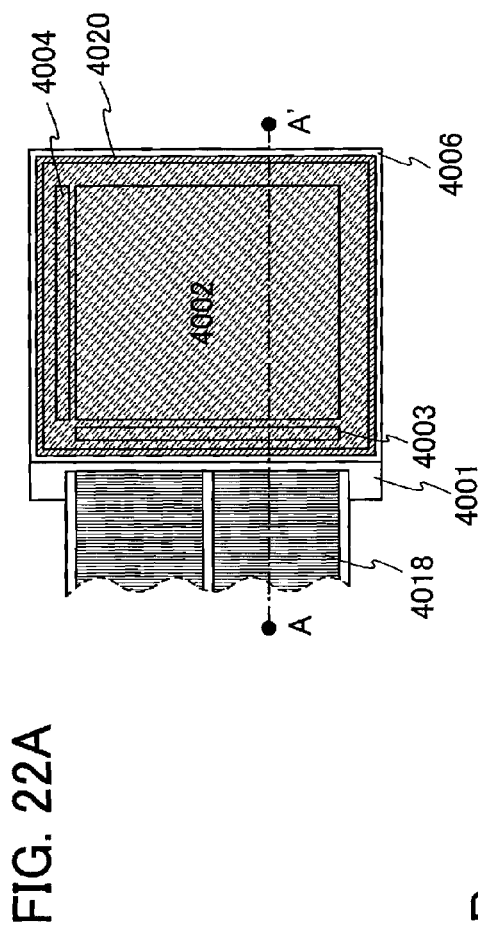
FIGS. 22A and 22B each illustrate a structure of a semiconductor device that is formed by the manufacturing method of the invention.
Figure 22B:
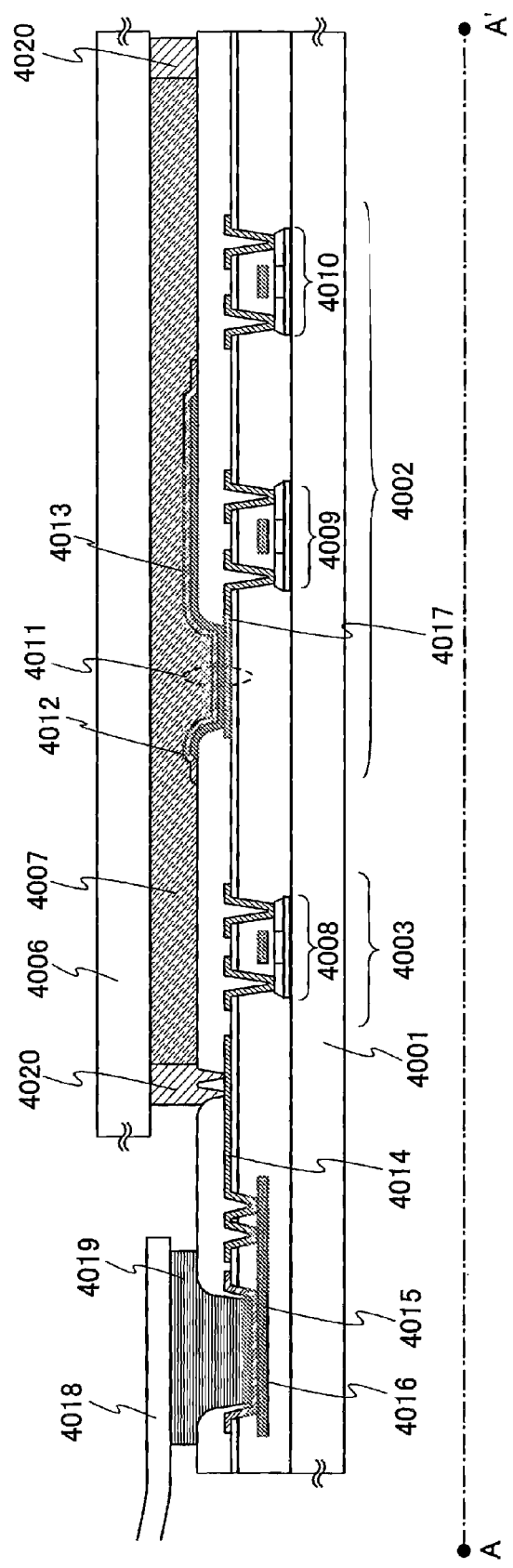

In this embodiment, an external appearance of a semiconductor display device manufactured by the invention is described with reference to FIGS. 22A and 22B. FIG. 22A is a top view of a panel in which transistors and light-emitting elements formed over a base substrate are sealed by a sealant between the base substrate and a sealing substrate. FIG. 22B corresponds to a cross-sectional view along a line A-A' of FIG. 22A.

A sealant 4020 is provided to surround a pixel portion 4002, a signal line driver circuit 4003, and a scanning line driver circuit 4004 that are formed over a base substrate 4001. A sealing substrate 4006 is provided over the pixel portion 4002, the signal line driver circuit 4003, and the scanning line driver circuit 4004. Accordingly, a filler 4007 as well as the pixel portion 4002, the signal line driver circuit 4003, and the scanning line driver circuit 4004 are sealed by the sealant 4020 between the base substrate 4001 and the sealing substrate 4006.

Each of the pixel portion 4002, the signal line driver circuit 4003, and the scanning line driver circuit 4004 formed over the base substrate 4001 includes a plurality of transistors. FIG. 22B illustrates, as an example, a transistor 4008 that is included in the signal line driver circuit 4003, and a driving transistor 4009 and a switching transistor 4010 that are included in the pixel portion 4002.

Part of a wiring 4017 connected to a source region or a drain region of the driving transistor 4009 is used as a pixel electrode of a light-emitting element 4011. The light-emitting element 4011 includes a counter electrode 4012 and an electroluminescent layer 4013 in addition to the pixel electrode. The structure of the light-emitting element 4011 is not limited to that shown in this embodiment. The structure of the light-emitting element 4011 can be appropriately changed in accordance with a direction of light extracted from the light-emitting element 4011, the polarity of the driving transistor 4009, and the like.

A variety of signals and voltages are supplied to the signal line driver circuit 4003, the scanning line driver circuit 4004, or the pixel portion 4002 from a connection terminal 4016 through lead wirings 4014 and 4015, although not illustrated in the cross-sectional view of FIG. 22B.

In this embodiment, the connection terminal 4016 is formed using the same conductive film as the counter electrode 4012 included in the light-emitting element 4011. The lead wiring 4014 is formed using the same conductive film as the wiring 4017. The lead wiring 4015 is formed using the same conductive film as gate electrodes of the driving transistor 4009, the switching transistor 4010, and the transistor 4008.

The connection terminal 4016 is electrically connected to a terminal of an FPC 4018 through an anisotropic conductive film 4019.

The sealing substrate 4006 may be formed of glass, metal (typically, stainless steel), ceramics, plastics, or the like. However, the sealing substrate 4006 that is located on a side from which light of the light-emitting element 4011 is extracted needs to have a light-transmitting property. Thus, the sealing substrate 4006 is desirably made of a light-transmitting material such as a glass plate, a plastic plate, a polyester film, or an acrylic film.

The filler 4007 may be formed of an ultraviolet curable resin or a thermosetting resin as well as inert gas such as nitrogen or argon. This embodiment shows an example in which nitrogen is used as the filler 4007.

This embodiment can be implemented in combination with any of the aforementioned embodiment modes and embodiments as appropriate.

Embodiment 8

According to the invention, semiconductor display devices that are larger in screen size can be manufactured at low cost. Therefore, the semiconductor display device manufactured by the invention is preferably applied to display devices, laptop personal computers, or image reproducing devices provided with recording media (typically, a device that reproduces a recording medium such as a DVD (digital versatile disc) and has a display for displaying the reproduced image). Moreover, the semiconductor device manufactured by the invention can be applied to other electronic appliances such as cellular phones, portable game machines, e-book readers, cameras such as video cameras or digital still cameras, goggle type displays (head-mounted displays), navigation systems, or sound reproducing devices (such as car audio systems and audio systems). Specific examples of these electronic appliances are illustrated in FIGS. 23A to 23C.

Figure 23A:
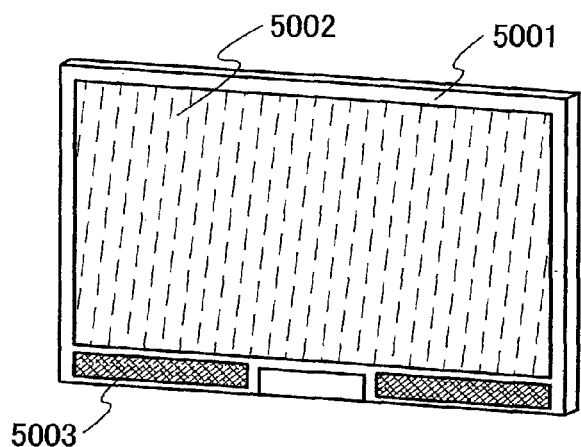
FIGS. 23A to 23C each illustrate an electronic appliance using a semiconductor device that is formed by the manufacturing method of the invention.

FIG. 23A illustrates a display device including a housing 5001, a display portion 5002, a speaker portion 5003, and the like. The semiconductor display device manufactured by the invention can be used for the display portion 5002. Note that the display device includes all of information display devices for personal computers, TV receivers, advertisement displays, and the like. Alternatively, the semiconductor device manufactured by the invention may be used for a signal processing circuit.

Figure 23B:
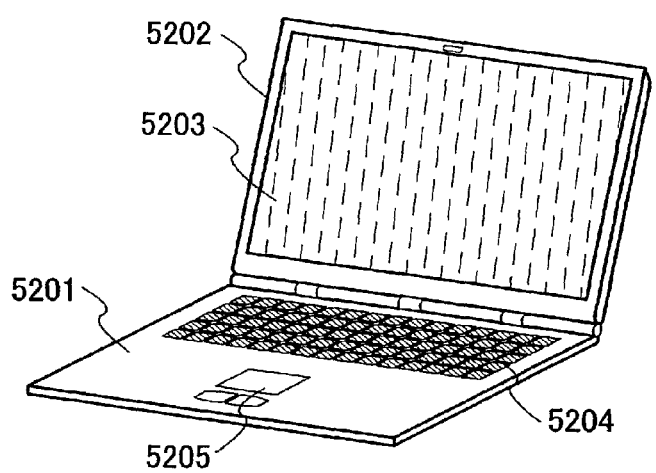

FIG. 23B illustrates a laptop personal computer including a main body 5201, a housing 5202, a display portion 5203, a keyboard 5204, a pointing device 5205, and the like. The semiconductor display device manufactured by the invention can be used for the display portion 5203. Alternatively, the semiconductor device manufactured by the invention may be used for a signal processing circuit.

Figure 23C:
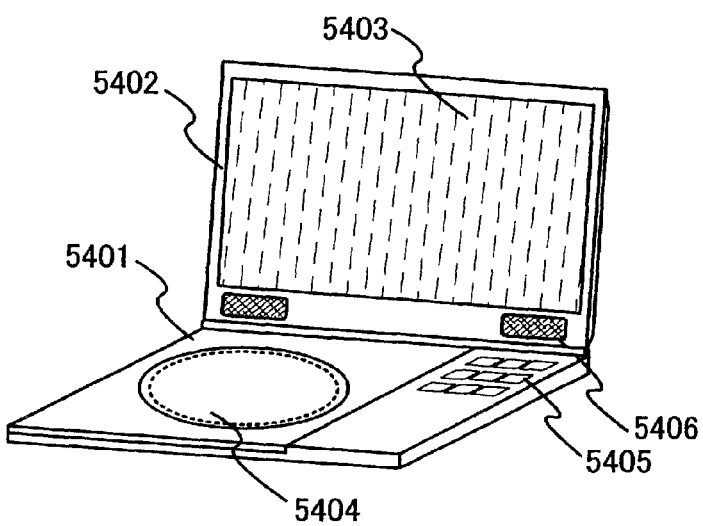

FIG. 23C illustrates a mobile image reproducing device provided with a recording medium (specifically a DVD player), which includes a main body 5401, a housing 5402, a display portion 5403, a recording medium (DVD or the like) reading portion 5404, an operation key 5405, a speaker portion 5406, and the like. The image reproducing device provided with a recording medium includes a home-use game console. The semiconductor display device manufactured by the invention can be used for the display portion 5403. Alternatively, the semiconductor device manufactured by the invention may be used for a signal processing circuit.

As described above, the application range of the invention is so wide that the invention can be applied to electronic appliances of all fields.

This embodiment can be implemented in combination with any the aforementioned embodiment modes and embodiments as appropriate.

This application is based on Japanese Patent Application serial no. 2007-217762 filed with Japan Patent Office on Aug. 24, 2007, the entire contents of which are hereby incorporated by reference.

What is claimed is:

1. A manufacturing method of a semiconductor device, comprising the steps of:
    forming a first defect layer in a first bond substrate by a first doping;
    partially etching the first bond substrate to form a plurality of first projections including the first defect layer;
    performing heat treatment on the first bond substrate to separate the first bond substrate at the first defect layer to form a plurality of first semiconductor films;
    forming a second defect layer in a second bond substrate by a second doping;
    partially etching the second bond substrate to form a plurality of second projections including the second defect layer;
    performing heat treatment on the second bond substrate to separate the second bond substrate at the second defect layer to form a plurality of second semiconductor films having a crystal orientation different from that of the plurality of first semiconductor films;
    bonding the plurality of first semiconductor films to a base substrate so that a surface of each of the plurality of first semiconductor films exposed by separating the bond substrate faces the base substrate;
    bonding the plurality of second semiconductor films to the base substrate so that the plurality of first semiconductor films and the plurality of second semiconductor films are spaced apart from each other; and
    etching the plurality of first semiconductor films and the plurality of second semiconductor films to form a plurality of third semiconductor films and a plurality of fourth semiconductor films.

2. The manufacturing method of the semiconductor device according to claim 1, wherein each of the first bond substrate and the second bond substrate is a single crystal semiconductor substrate.

3. The manufacturing method of the semiconductor device according to claim 1, wherein each of the first bond substrate and the second bond substrate comprises silicon.

4. A manufacturing method of a semiconductor device, comprising the steps of:
    forming a first defect layer in a first bond substrate by a first doping;
    selectively forming a second defect layer in the first bond substrate by a second doping;
    performing heat treatment on the first bond substrate to separate the first bond substrate at the first defect layer and the second defect layer to form a plurality of first semiconductor films;
    forming a third defect layer in a second bond substrate by a third doping;
    selectively forming a fourth defect layer in the second bond substrate by a fourth doping;
    performing heat treatment on the second bond substrate to separate the second bond substrate at the third defect layer and the fourth defect layer to form a plurality of second semiconductor films having a crystal orientation different from that of the plurality of first semiconductor films;
    bonding the plurality of first semiconductor films to a base substrate;
    bonding the plurality of second semiconductor films to the base substrate so that the plurality of first semiconductor films and the plurality of second semiconductor films are spaced apart from each other; and
    etching the plurality of first semiconductor films and the plurality of second semiconductor films to form a plurality of third semiconductor films and a plurality of fourth semiconductor films.

5. The manufacturing method of the semiconductor device according to claim 4, wherein each of the first bond substrate and the second bond substrate is a single crystal semiconductor substrate.

6. The manufacturing method of the semiconductor device according to claim 2, wherein each of the first bond substrate and the second bond substrate comprises silicon.

7. A manufacturing method of a semiconductor device, comprising the steps of:
- forming a first defect layer in a first bond substrate by a first doping;
- partially etching the first bond substrate to form a plurality of first projections including the first defect layer;
- forming a plurality of first semiconductor films by separating the first bond substrate at the first defect layer;
- forming a second defect layer in a second bond substrate by a second doping;
- partially etching the second bond substrate to form a plurality of second projections including the second defect layer;
- forming a plurality of second semiconductor films having a crystal orientation different from that of the plurality of first semiconductor films by separating the second bond substrate at the second defect layer;
- bonding the plurality of first semiconductor films to a base substrate so that a surface of each of the plurality of first semiconductor films exposed by separating the bond substrate faces the base substrate;
- bonding the plurality of second semiconductor films to the base substrate so that the plurality of first semiconductor films and the plurality of second semiconductor films are spaced apart from each other; and
- etching the plurality of first semiconductor films and the plurality of second semiconductor films to form a plurality of third semiconductor films and a plurality of fourth semiconductor films.

8. The manufacturing method of the semiconductor device according to claim 7, wherein each of the first bond substrate and the second bond substrate is a single crystal semiconductor substrate.

9. The manufacturing method of the semiconductor device according to claim 7, wherein each of the first bond substrate and the second bond substrate comprises silicon.

10. A manufacturing method of a semiconductor device, comprising the steps of:
- forming a first defect layer in a first bond substrate by a first doping;
- selectively forming a second defect layer in the first bond substrate by a second doping;
- forming a plurality of first semiconductor films by separating the first bond substrate at the first defect layer and the second defect layer;
- forming a third defect layer in a second bond substrate by a third doping;
- selectively forming a fourth defect layer in the second bond substrate by a fourth doping;
- forming a plurality of second semiconductor films having a crystal orientation different from that of the plurality of first semiconductor films by separating the second bond substrate at the third defect layer and the fourth defect layer;
- bonding the plurality of first semiconductor films to a base substrate;
- bonding the plurality of second semiconductor films to the base substrate so that the plurality of first semiconductor films and the plurality of second semiconductor films are spaced apart from each other; and
- etching the plurality of first semiconductor films and the plurality of second semiconductor films to form a plurality of third semiconductor films and a plurality of fourth semiconductor films.

11. The manufacturing method of the semiconductor device according to claim 10, wherein each of the first bond substrate and the second bond substrate is a single crystal semiconductor substrate.

12. The manufacturing method of the semiconductor device according to claim 10, wherein each of the first bond substrate and the second bond substrate comprises silicon.

* * * * *

UNITED STATES PATENT AND TRADEMARK OFFICE
CERTIFICATE OF CORRECTION

| | | |
|---|---|---|
| PATENT NO. | : 8,268,701 B2 | Page 1 of 1 |
| APPLICATION NO. | : 12/939500 | |
| DATED | : September 18, 2012 | |
| INVENTOR(S) | : Shunpei Yamazaki et al. | |

It is certified that error appears in the above-identified patent and that said Letters Patent is hereby corrected as shown below:

At column 36, line 29, "n-electron" should be --π-electron--;

At column 39, line 2, "DJA" should be --D/A--;

At column 43, line 2, "claim 2" should be --claim 4--.

Signed and Sealed this

Thirteenth Day of November, 2012

David J. Kappos
*Director of the United States Patent and Trademark Office*